US009761324B2

(12) United States Patent
Lal et al.

(10) Patent No.: US 9,761,324 B2
(45) Date of Patent: Sep. 12, 2017

(54) PIEZOELECTRIC AND LOGIC INTEGRATED DELAY LINE MEMORY

(71) Applicant: Cornell University, Ithaca, NY (US)

(72) Inventors: Amit Lal, Ithaca, NY (US); Justin C. Kuo, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 15/116,441

(22) PCT Filed: Feb. 3, 2015

(86) PCT No.: PCT/US2015/014324
§ 371 (c)(1),
(2) Date: Aug. 3, 2016

(87) PCT Pub. No.: WO2015/138058
PCT Pub. Date: Sep. 17, 2015

(65) Prior Publication Data
US 2017/0169899 A1    Jun. 15, 2017

Related U.S. Application Data

(60) Provisional application No. 61/935,310, filed on Feb. 3, 2014.

(51) Int. Cl.
*G11C 21/00*    (2006.01)
*G11C 21/02*    (2006.01)
(Continued)

(52) U.S. Cl.
CPC .......... *G11C 21/023* (2013.01); *B06B 1/0215* (2013.01); *B06B 2201/20* (2013.01);
(Continued)

(58) Field of Classification Search
CPC .................................................... G11C 21/023
(Continued)

(56) References Cited

U.S. PATENT DOCUMENTS 3,668,662 A    6/1972    Zimmerman et al.
3,845,420 A    10/1974   Holland et al.
(Continued)

FOREIGN PATENT DOCUMENTS

WO    2014014968 A1    1/2014

OTHER PUBLICATIONS

International Search Report and Written Opinion of International Application No. PCT/US15/14324; Date of Mailing: Nov. 11, 2015; 15 pages.

*Primary Examiner* — Son Mai
(74) *Attorney, Agent, or Firm* — Perkins Coie LLP

(57) ABSTRACT

Delay line memory device, systems and methods are disclosed. In one aspect, a delay line memory device includes a substrate; an electronic unit disposed on the substrate and operable to receive, amplify, and/or synchronize data signals into a bit stream to be transmitted as acoustic pulses carrying data stored in the delay line memory device; a first and a second piezoelectric transducer disposed on the substrate and in communication with the electronic unit, in which the first piezoelectric transducer is operable to transmit the data signals to the acoustic pulses that carry the data through the bulk of the substrate, and the second piezoelectric transducer is operable to transduce the received acoustic pulses to intermediate electrical signals containing the data, which are transferred to the electronic unit via an electrical interconnect to cause refresh of the data in the delay line memory device.

48 Claims, 28 Drawing Sheets

(51) Int. Cl.
    *B06B 1/02*         (2006.01)
    *G11C 7/16*         (2006.01)
    *G11C 19/00*       (2006.01)

(52) U.S. Cl.
    CPC ....... *B06B 2201/55* (2013.01); *B06B 2201/70* (2013.01); *G11C 7/16* (2013.01); *G11C 19/00* (2013.01)

(58) Field of Classification Search
    USPC .......................................................... 365/157
    See application file for complete search history.

(56) References Cited

U.S. PATENT DOCUMENTS

| | | |
|---|---|---|
| 3,886,529 A | 5/1975 | Bert et al. |
| 3,940,720 A | 2/1976 | Harrington |
| 6,327,910 B1 * | 12/2001 | Beall .................... F26B 25/185 <br> 73/587 |
| 2007/0057772 A1 * | 3/2007 | Liu ...................... G01N 29/022 <br> 340/10.4 |
| 2012/0199666 A1 * | 8/2012 | Gerner ................. B41J 2/14233 <br> 239/102.2 |
| 2012/0203306 A1 * | 8/2012 | Sarvazyan ........... A61B 8/0841 <br> 607/61 |

\* cited by examiner

10 — Conventional Integrated Circuit Design

20 — Acoustic Communications Integrated Circuit (d)

(c)

(b)

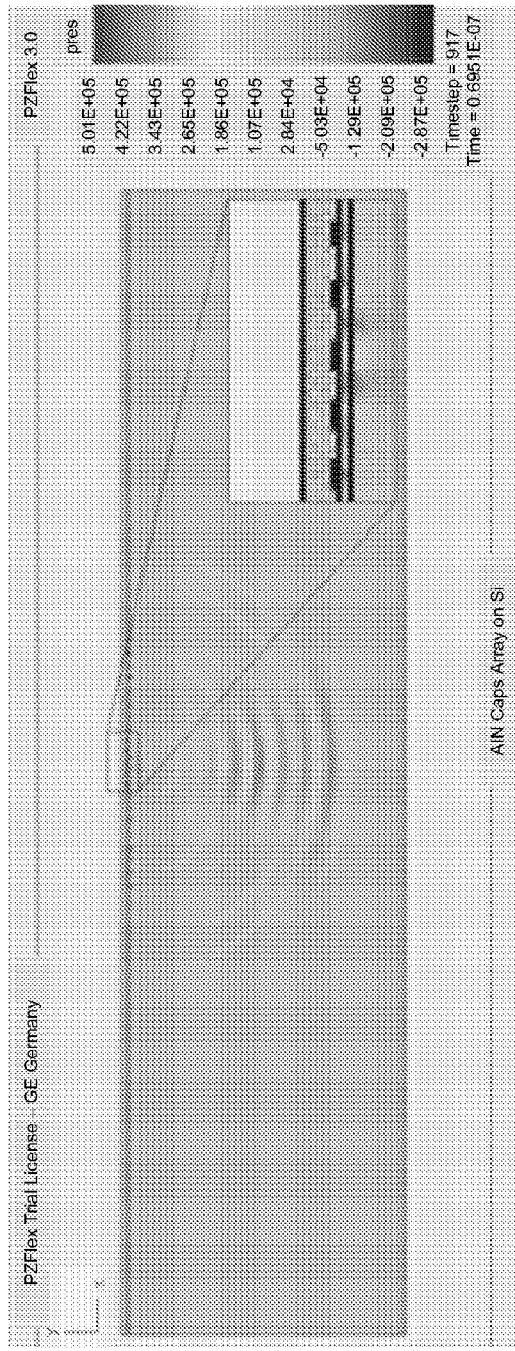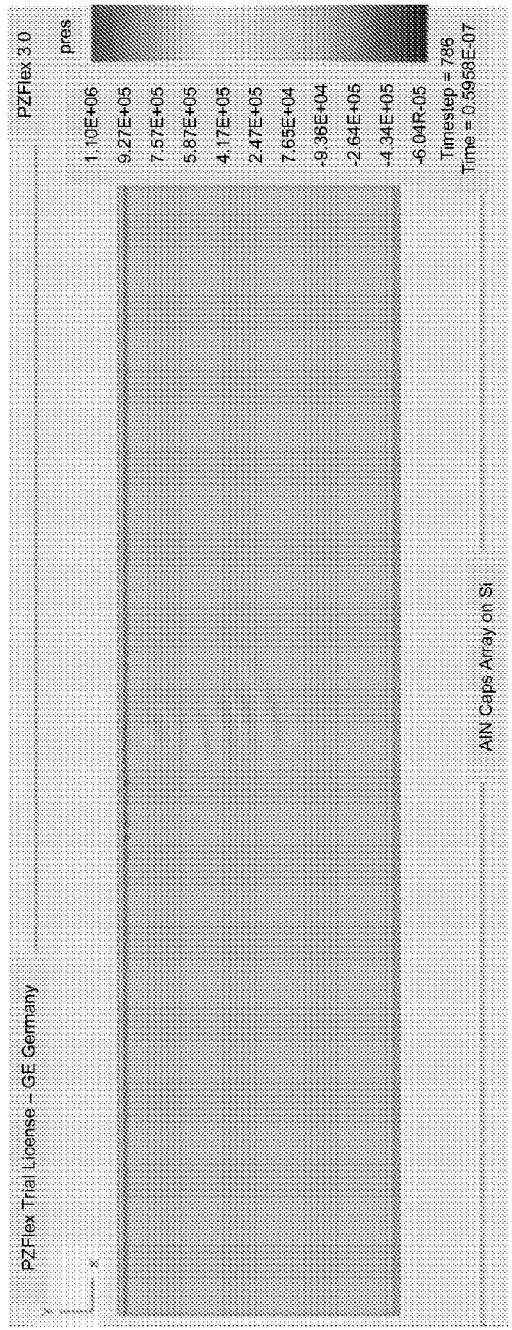
FIG. 3A
FIG. 3B

PIEZOELECTRIC AND LOGIC INTEGRATED DELAY LINE MEMORY

PRIORITY CLAIM

This patent document claims the priority and benefits of U.S. Provisional Application No. 61/935,310 entitled "PARALLEL PIEZOELECTRIC CMOS INTEGRATED DELAY LINE MEMORY," filed Feb. 3, 2014, the entire disclosure of which is incorporated herein by reference for all purposes.

STATEMENT OF GOVERNMENT SUPPORT

This invention was made with government support under Grant No. N66001-12-C-2009, awarded by the Intelligence Advanced Research Projects Activity (IARPA) Trusted Integrated Chips (TIC) program. The government has certain rights in this invention.

TECHNICAL FIELD

This patent document relates to systems, devices, and processes that use acoustic signal communication in semiconductor technologies.

BACKGROUND

Semiconductor fabrication and nanotechnology provide techniques or processes for fabricating structures, devices, and systems with features at a micro- or nano-scale, e.g., structures in a range of one to hundreds of nanometers in some applications. Integrated circuits and microprocessors are examples of such structures, devices and systems.

Complementary metal-oxide-semiconductor (CMOS) technology is used in integrated circuits for a wide variety of devices. For example, CMOS design can include complementary and symmetrical pairs of p-type and n-type metal oxide semiconductor field effect transistors (MOSFETs) for logic functions. CMOS technology is used for digital circuit devices including microprocessors, microcontrollers, memory, and other digital logic circuits. CMOS technology is also used for analog circuits including image sensors, data converters, and highly integrated transceivers, among others. CMOS technology allows for a high density of logic functions on a chip. CMOS devices can exhibit desirable performance properties including, for example, high noise immunity and low static power consumption.

SUMMARY

Disclosed are techniques, systems, and devices with design architectures having high density delay line memory. In some aspects, the disclosed delay line memory includes using sonic pulses coding bits or analog values, which can be transmitted through the silicon wafer thickness, and be relayed back to the origin. The use of CMOS and thin film piezoelectric films enables very high density and high frequency relaying while utilizing the bulk silicon volume that is not used today for information carrying purposes.

In one aspect, a delay line memory device includes a substrate; a first electronic unit and a second electronic unit disposed on a first side and a second side of the substrate, respectively, in which the first electronic unit is operable to receive, amplify, and/or synchronize data signals into a bit stream to be transmitted as acoustic pulses carrying data stored in the delay line memory device; a first piezoelectric transducer and a second piezoelectric transducer disposed on the first and second sides of the substrate, respectively, such that the first piezoelectric transducer is in communication with the first electronic unit, and the second piezoelectric transducer is in communication with the second electronic unit, in which the first piezoelectric transducer is operable to transduce and transmit the bit stream of the data signals received from the first electronic unit to the acoustic pulses that carry the data through the bulk of the substrate, and the second piezoelectric transducer is operable to receive and transduce the transmitted acoustic pulses to intermediate electrical signals containing the data to be received by the second electronic unit; and an electrical interconnect that electrically connects the first and second electronic units across the first and second sides of the substrate to transfer the intermediate electrical signals containing the data between the second electronic unit and the first electronic unit.

In one aspect, a delay line memory chip device includes a substrate; and a first acoustic communication unit and a second acoustic communication unit disposed on a first side and a second side of the substrate, respectively, in which the first and second acoustic communication units each include an electronic component coupled between a transmit piezoelectric transducer and a receive piezoelectric transducer. The electronic unit of the first acoustic communication unit is operable to receive, amplify, and/or synchronize data signals into a bit stream to be transmitted as acoustic pulses carrying data stored in the delay line memory device. The transmit piezoelectric transducer of the first communication unit is operable to transduce and transmit the bit stream of the data signals received from the electronic unit of the first acoustic communication unit to the acoustic pulses that carry the data through a first portion in the bulk of the substrate to be received by the receive piezoelectric transducer of the second communication unit, in which the receive piezoelectric transducer of the second transducer is operable to transduce the received acoustic pulses to intermediate signals containing the data. The electronic unit of the second acoustic communication unit is operable to receive and amplify the intermediate signals to be transmitted as return acoustic pulses carrying the data to the first acoustic communication unit. The transmit piezoelectric transducer of the second communication unit is operable to transduce and transmit the intermediate signals received from the electronic unit of the second acoustic communication unit to the return acoustic pulses that contain the data through a second portion in the bulk of the substrate to be received by the receive piezoelectric transducer of the first communication unit.

In one aspect, a method to store data in a delay line memory includes receiving, at an electronics unit of the delay line memory, data signals from an integrated circuit device, in which the data signals include bits of data; transducing, at a first piezoelectric transducer of the delay line memory, the data signals into acoustic pulses carrying the bits of data; transmitting, through a bulk material of the delay line memory, the acoustic pulses to a second piezoelectric transducer of the delay line memory; transducing, at the second piezoelectric transducer, the acoustic pulses to intermediate electrical signals containing the data to be received by a second electronic unit of the delay line memory; and transferring the intermediate electrical signals through an electrical interconnect coupled from the second electronic unit to the electronic unit.

In one aspect, a delay line memory device includes a substrate; an electronic unit disposed on a first side of the substrate, in which the electronic unit is operable to receive, amplify, and/or synchronize data signals into a bit stream to be transmitted as acoustic pulses carrying data stored in the delay line memory device; a first piezoelectric transducer and a second piezoelectric transducer disposed on the first side and a second side of the substrate, respectively, and in communication with the electronic unit, in which the first piezoelectric transducer is operable to transduce and transmit the bit stream of the data signals received from the electronic unit to the acoustic pulses that carry the data through the bulk of the substrate, and the second piezoelectric transducer is operable to receive and transduce the transmitted acoustic pulses to intermediate electrical signals containing the data to be received by the electronic unit; and an electrical interconnect that electrically connects the electronic unit and the second piezoelectric transducer to transfer the intermediate electrical signals containing the data from the second piezoelectric transducer to the electronic unit.

BRIEF DESCRIPTION OF THE DRAWINGS

FIG. 3A shows an exemplary simulation plot of phased array acoustic radiation pressure for zero degree phase shift between elements.

FIG. 3B shows an exemplary simulation plot of acoustic radiation pressure for 20 degrees phase shift between elements of a phased array.

DETAILED DESCRIPTION

Figure 1A:
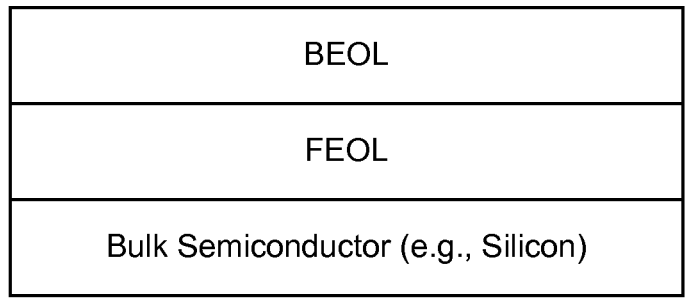
FIG. 1A shows an architectural diagram of a conventional integrated circuit chip design and an architectural diagram of an integrated circuit chip design of the disclosed technology.
Figure 1A:
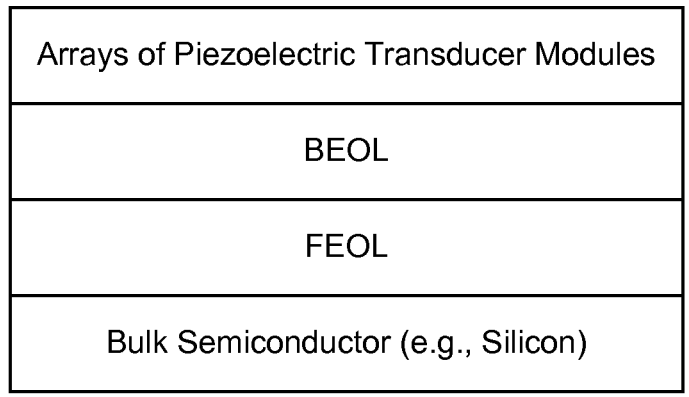

Silicon-based and other semiconductor integrated circuit (IC) chips typically use conductive wires for in-chip communication links, which create several limitations in IC chip designs including spot heating, thermal cycling degradation of components, signal interference, among others. Some chip-scale communications approaches to mitigating such problems associated with conductive wires include optical and/or wireless in-chip communications which have been explored in several physical domains, but complement and/or add to the traditional metal interconnects.

In one example, photonic interconnects have been proposed as a way to transmit digital and analog information on optical waveguides integrated into a complementary metal-oxide-semiconductor (CMOS) stack. For example, optical waveguide interconnects can provide very high bandwidth and low power consumption information transmission within chips. However, due to the internal losses of optical signals in CMOS compatible optical waveguides, and the resulting high power for optical links, much work is still needed for use of optical interconnects. Also, one of the drawbacks of the photonic links is that the links are defined by lithography in the front end of line (FEOL) or back end of line (BEOL) IC fabrication processes, which can enable adversarial interests in the IC design to physically detect function, e.g., by detecting scattered light, or tracing the optical paths.

In another example, radio-on-chip networks have been proposed for ad-hoc wireless networks on chip. For example, such radio-on-chip networks can transmit over the chip using RF radio. Due to the large signal wavelengths corresponding to common RF frequencies, such RF transmitters are point emitters operating in the near field configurations that tend to use coded signals to reduce EM interference and thus require significant power consumption.

Additionally, there has been some effort in protecting IC designs that are mapped to field programmable gate arrays (FPGAs). For example, the key to determining the functionality of an FPGA is determining its bit-stream patterns with various parts of FPGAs. Bit-streams can be encrypted in high-end FPGAs to protect the contents of the configuration memory. The encryption key (e.g., a key based on the advanced encryption standard (AES)) is stored in volatile memory, and powered by a battery in an effort to defeat unsophisticated tampering. Obfuscation is also a commonly used software technique, and can also be applied to the hardware description language used to create the design mapped to the FPGA. These techniques can be combined with the notion of a physically unclonable function (e.g., logic whose behavior is a function of chip-specific process variations) to protect a design. However, these approaches do not protect against EM-based attacks or differential power analysis. In addition, an adversary may have access to the FEOL processing or the entire IC processing during the fabrication and production at a semiconductor foundry that is operated by another party.

In the past, microelectronic devices were manufactured by companies that both designed and produced the devices. At that time, manufacturing involved fine-tuning device and manufacturing process parameters, which often warranted a need for redesign involving both the research and development (R&D of the microcircuit design and the manufacturing processes. Currently, manufacturing processes are highly advanced and standardized such that multiple microelectronic device designs can be fabricated by a single, large-scale manufacturing entity. For example, separation of manufacturing and design has created a new model for microelectronic device fabrication: the foundry model. The foundry model refers to the separation of a semiconductor fabrication plant operation (foundry) from an integrated circuit design operation, e.g., enabling a "fabless" semiconductor company to operate without any semiconductor manufacturing capability but rather contract production from a separate manufacturer entity (merchant foundry). While the foundry model is economically efficient for rapid development of integrated circuit devices, it is subject to device security concerns including theft of device designs and unauthorized alterations or modifications during production by the merchant foundry or other adversarial actors.

Moreover, as the need for computational power increases, high density integration of transistors and other circuit elements, such as 2D integration and 3D integration of multiple processor layers, are becoming increasingly necessary for many IC applications to increase the IC processing power. One of the problems in highly integrated IC chips, e.g., vertically stacked 3D ICs, is the difficulty to provide complex and a large number of interconnects between different circuit elements. In a 3D stacked chip, for example, the number of communication channels between wafers tends to be limited because of the relatively large size of through-wafer vias (TWV) to ensure bonding reliability.

The technology disclosed in this patent document uses ultrasound transducers as communication transceivers for providing wireless ultrasonic communication interconnects between different circuit elements without hardwiring between circuit elements and as built-in circuit sensors for sensing circuit conditions. Such ultrasonic communication interconnects can significantly reduce the metal interconnects between circuit elements. The disclosed technology can be used to provide programmable or reconfigurable interconnects to enable fixed circuit elements to form various functionally different circuit devices and to conceal the final circuit functions and designs from an unauthorized party and from the physical fabrication or manufacturing of the circuits. The disclosed technology can also be implemented to address the above aforementioned technical problems and limitations.

Acoustic in-Chip Communication Technology

Techniques, systems, and devices are described to provide 2D and 3D integrated circuit chip designs having integrated ultrasonic or acoustic in-chip communication links and nodes.

The disclosed technology integrates ultrasound actuator arrays into 2D or 3D IC chips to form sonar arrays that transmit a directional sonic pulse from one functional unit or module in the chip to another, providing tunable sonic intra-chip communication links between any two points by adjusting the delays/phases and/or amplitudes of the sonic communication signals on transmit. In some implementations, for example, the ultrasound actuators can be based on piezoelectric materials or elements. In addition, the ultrasound actuators can be configured using electrostatic transducers, e.g., including capacitive/electrostatic materials or elements (e.g., including capacitive micro-machined ultrasonic transducers (CMUT)), which can be implemented, for example, in addition to or instead of the piezoelectric-based actuators (e.g., the piezoelectric MN transducer elements). Examples of CMUT transducer elements are described in Wygant, I., "A comparison of CMUTs and piezoelectric transducer elements for 2D medical imaging based on conventional simulation models", Ultrasonics Symposium (IUS), 2011 IEEE International, Vol. 100, No. 18-21, October 2011, which is incorporated by reference as part of this patent document. More generally, the disclosed technology can implement the ultrasound in-chip wireless communication links using any of piezoelectric, electrostatic, magnetic, thermal, electrostrictive actuation/sensing elements acoustic communication signaling. In some implementations, such sonar modules can be used to transmit signals from one chip to another chip through a common substrate, while making use of the frequency-selective nature of acoustic transducers and waveguides to communicate to multiple receivers over different frequency bands at the same time, e.g., via frequency division multiplexing. Frequency division multiplexing can be implemented to carry different channels at different acoustic frequencies. For example, the integrated sonars can also be used to interrogate defects in chip interconnects over time to measure chip reliability.

FIG. 1A shows an architectural diagram of a conventional integrated circuit chip design 10 based on the complementary metal-oxide-semiconductor (CMOS) technology and an architectural diagram of an example of an integrated circuit chip design 20 for implementing the disclosed technology. The conventional CMOS IC chip design 10 includes a bulk semiconductor portion, e.g., bulk silicon die or substrate, upon which an front-end-of-line (FEOL) portion is structured to include individual and discrete circuit elements, e.g., transistors, capacitors, resistors, etc., patterned in layers within the FEOL portion formed over the semiconductor substrate. In some configurations, the FEOL portion of the conventional IC chip design 10 can include CMOS circuit elements for one or more digital logic circuits. The conventional IC chip design 10 includes a back-end-of-line (BEOL) portion to provide the hardwiring connects within each circuit element and hardwiring interconnects between the discrete circuit elements in the FEOL portion, such as metal contacts or lines. For example, the BEOL includes conductive contacts such as metal lines, metal contacts or metal vias, insulating layers or materials (e.g., dielectrics), and bonding sites for chip-to-package connections. The interconnects in the BEOL in the IC chip design 10 link the discrete circuit elements in FEOL to form functional circuit blocks.

The architectural diagram of the IC chip design 20 of the disclosed technology shown in FIG. 1A is based on a different interconnect configuration using ultrasound communication links. The IC chip design 20 includes a bulk semiconductor portion, a front-end-of-line (FEOL) portion that includes discrete circuit elements, a back-end-of-line (BEOL) portion and ultrasound transducer modules (e.g., piezoelectric transducer modules). Different from the IC chip design 10 where the interconnects in the BEOL link the discrete circuit elements in the FEOL portion to form functional circuit blocks, the IC chip design 20 uses the ultrasound transducer modules as communication nodes to provide a significant portion of or all of inter-element communication interconnects between different circuit elements in the FEOL portion by using wireless ultrasound signaling as interconnects. The BEOL portion of the IC chip design 20 provides conductive connections between the ultrasound transducer modules and circuit elements in the FEOL portion and may also include, in some implementations, certain interconnects for the circuit elements in the FEOL portion. When the ultrasound transducer modules are not activated or functional, the circuit elements in the FEOL portion are largely discrete or isolated circuit elements or circuit element blocks or clusters of two or more interconnected circuit elements. When the ultrasound transducer modules are activated to provide desired interconnects between the circuit elements in the FEOL portion, the circuit elements in the FEOL portion form a functional IC device under the IC chip design 20 and become functional. Therefore, the ultrasound transducer modules provide ultrasonic or acoustic communication signaling capabilities of the discrete circuit elements (e.g., CMOS digital logic circuits) to communicate wirelessly between such elements, thereby reducing some or all of the hardwired interconnections in a conventional IC chip design. In some examples, the IC chip design 20 includes control circuits including driver, read, and logic circuits as part of the FEOL portion that electrically communicate with the piezoelectric transducer modules via electrical connections of the BEOL portion. The BEOL portion can also include metal reflectors or other components that aid in the acoustic signal propagation. In FIG. 1A, the IC chip design 20 is shown to have a particular structure where the FEOL portion, the BEOL portion, and the layers for the ultrasound transducer modules are formed in the shown sequential order over the substrate. This configuration of the IC chip design 20 is an example only and other configurations or structural sequences may be implemented depending the specific needs of IC designs and circuit applications.

An ultrasound signal tends to have a footprint and spatial extent determined by the acoustic frequency of the signal and the physical conditions of the signal path that may cause diffraction, scattering and spreading of the ultrasound signal. The smallest beam spot size is dictated by the diffraction limit on the order of one half of the ultrasound signal wavelength. Accordingly, a metal interconnect may be configured to have a smaller footprint than that of an ultrasound signal interconnect. In implementing the wireless ultrasound signaling as interconnects for different circuit elements in the IC chip design 20 in FIG. 1A, it may be advantageous in some applications to use ultrasound signaling for all interconnects of the different circuit elements and, in other applications, it may be more beneficial to use ultrasound signaling for part of the interconnects and use metal lines or contacts for the remaining interconnects. Such metal lines or contacts for interconnects between different circuit elements are can be in the BEOL portion.

Figure 1B:
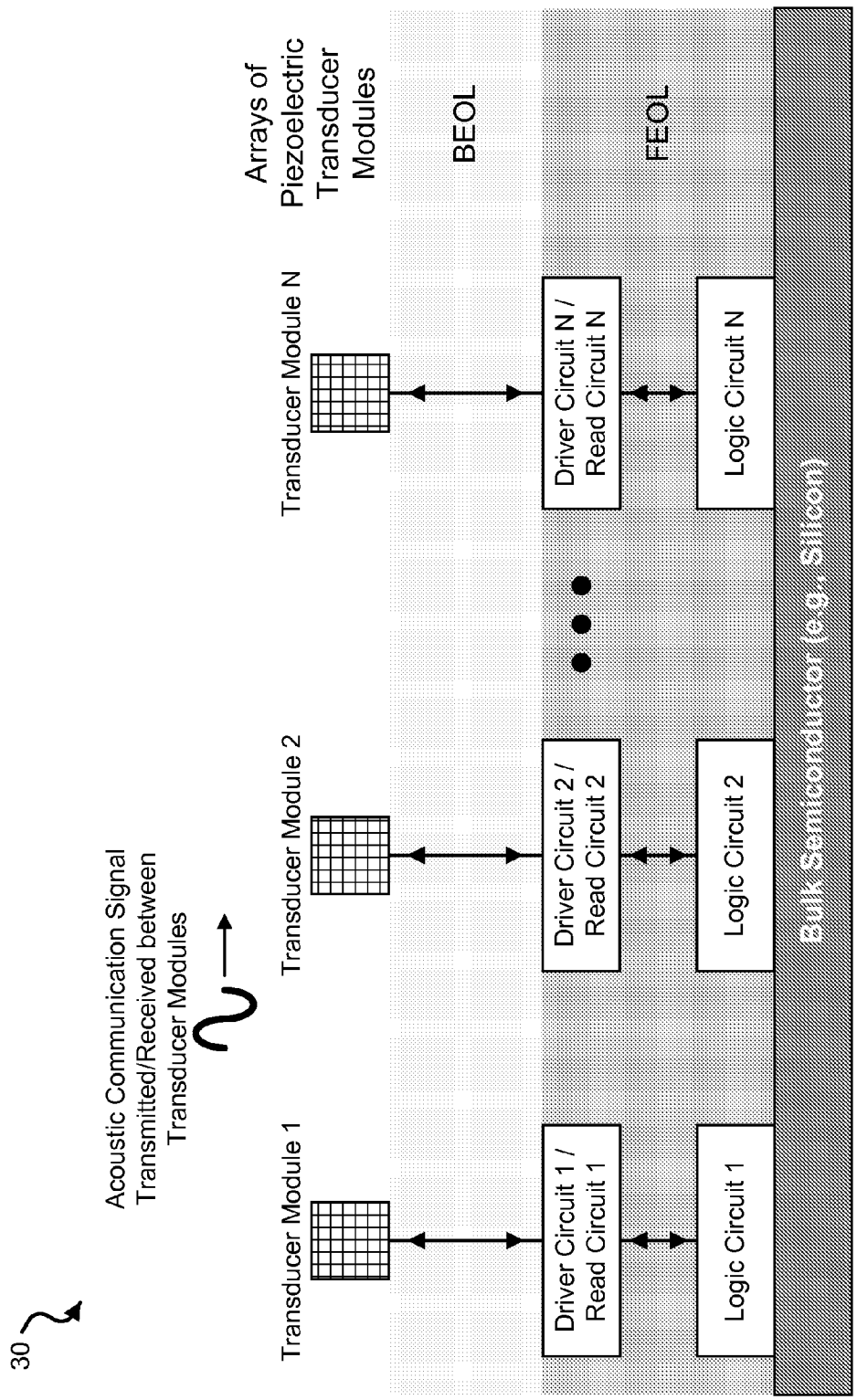
FIG. 1B shows a diagram of the disclosed acoustic in-chip communication signaling IC chip design.

FIG. 1B shows a functional diagram 30 of the IC chip design 20 of the disclosed technology illustrating wireless intra-communication in a semiconductor medium between circuit modules of the IC chip. The diagram 30 shows an exemplary embodiment of the IC chip design 20 in which an array of 1, 2, . . . N piezoelectric transducer modules are operable to transmit and receive directional acoustic signals carrying information to communicate between the transducer modules. For example, the wavelength of the sonic signals depends on the frequency and propagation speed of the signal, and the propagation speed depends on the medium through which the signal propagates. The speed of sonic transmission in a semiconductor medium (e.g., ~$9\times10^3$ m/s in a dielectric medium such as silicon) is five orders of magnitude lower that the speed of electromagnetic transmission (e.g., $2.997\times10^8$ m/s). Thus, sonic signals can be transmitted at wavelengths in the microns for desired frequencies in the GHz range, e.g., protecting the acoustic communication signal from RF and other noise within the IC circuit. The array of piezoelectric transducer modules are communicatively coupled to individual control circuit elements or blocks (e.g., of two or more circuit elements), e.g., which can be formed in the FEOL portion over the semiconductor substrate. The individual control circuits can include a driver circuit to generate an electric signal to the corresponding transducer module that determines the magnitude, frequency, and/or phase of the acoustic communication signal. The individual control circuits can include a read circuit to receive a transduced electric signal from the corresponding transducer module that receives the transmitted acoustic communication signal. For example, the driver circuits and/or read circuits can include analog and digital circuit components (e.g., inverter delay elements, analog-to-digital converters (ADC) and digital-to-analog converters (DAC), amplifiers, etc.). The individual control circuits can include a logic circuit, e.g., of digital and/or analogic logic circuit components, to provide and receive electric signals as digital waveform carrying the information to and from the driver and read circuits, respectively, which can be processed by other circuits of the IC chip. For example, the digital waveform can be a phase-coded and/or frequency-coded waveform or waveforms included in a composite waveform. In some examples, the logic circuits can be configured of one or more CMOS layers.

Figure 1C:
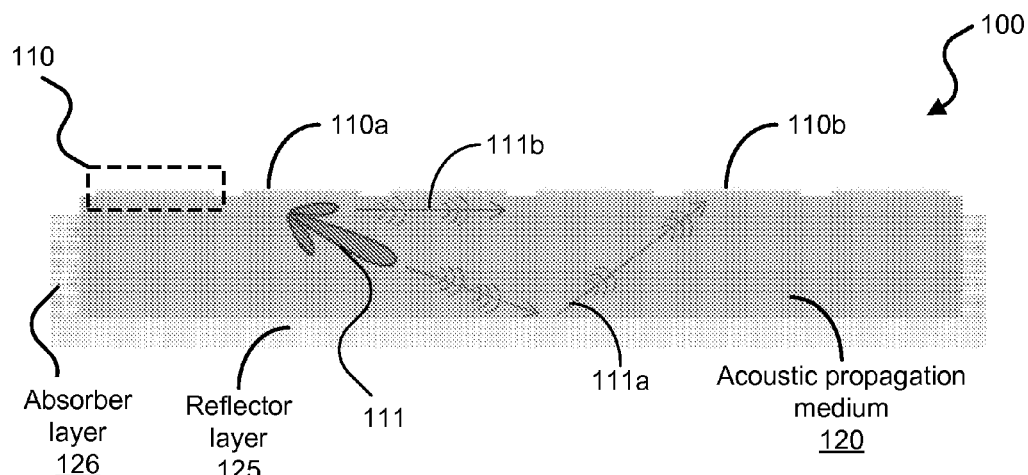
FIG. 1C shows a schematic illustration of an exemplary chip-scale wireless communications IC device.

Each of the ultrasound transducer modules of FIGS. 1A and 1C is configured to generate a steerable acoustic ultrasound signal to target one or more desired ultrasound transducer modules to provide desired ultrasound interconnects for the circuit elements associated with the transmitting and receiving ultrasound transducer modules. As illustrated in FIG. 1C and described in greater detail below, each ultrasound transducer module includes multiple ultrasound transducer elements, e.g., in a 2-D array, and operates to control the relative amplitude and phase values of ultrasound signals generated by multiple ultrasound transducer elements so that the ultrasound signals are added up to form a final composite ultrasound signal that is directed to a particular location or region in the circuit where one or more targeted receiving ultrasound transducer modules are located. Each ultrasound transducer module can be operated as a transmitter and a receiver and thus is a ultrasound transducer transceiver element. The driver/read and logic circuits for the ultrasound transducer modules are shown to be part of the FEOL portion in FIG. 1B, but may also be in the BEOL portion or other layers. The use of multiple ultrasound transducer elements for an ultrasound transducer module as a transceiver device for transmitting steerable output ultrasound signals and for receiving/detecting ultrasound signals can be implemented in various configurations, including some examples described in "Two-Port Electromechanical Model for Bulk-Piezoelectric Excitation of Surface Micromachines Beam Resonators" by Ardanuc and Lal in Journal of Microelectromechanical Systems, pp. 626-640 in Vol. 18, No. 3, June 2009, and "Beam Steering with Pulsed Two-Dimensional Transducer Arrays" by Turnbull and Foster in IEEE Transactions on Ultrasonics, Ferroelectrics, and Frequency Control, pp. 320-333, Vol. 28, No. 4, July 1991, which are part of the U.S. provisional application No. 61/672,214 and are incorporated by reference as part of this patent document.

The disclosed acoustic in-chip communication technology can be implemented to provide many advantages. For example, the disclosed acoustic in-chip communication can use linear and two-dimensional arrays of piezoelectric transducers to generate directional ultrasonic pulses in three dimensions for CMOS information processing and trusted integrated circuit (TIC) operation. For example, exemplary phased array sonic transducers can be operated at GHz frequencies alongside and/or integrated with other analog or digital chip logic on a single IC chip. For example, the disclosed technology can be implemented in a variety of applications including medical (ultrasound) imaging, non-destructive evaluation (NDE) of IC chip components, and sonar communications. Historically, for example, these arrays have operated in the frequency range of 1-30MHz for medical imaging, 100 kHz to 10 MHz for NDE, and 1-100 kHz for sonar communications. By operating at high frequencies of 1-10 GHz, the wavelength in silicon can be in an exemplary range of 9 to 0.9 μm. Since the elements of a sonar array are spaced by fractions of the sonic wavelength (e.g., λ/2), chip devices employing the disclosed technology can be configured with hundreds to thousands of sonar arrays, e.g., for a millimeter to centimeter sized IC chip.

For example, the disclosed acoustic in-chip communication technology can provide a sonic 2D or 3D programmable interconnect framework for massively parallel computation in IC chip devices. The sonic 2D or 3D IC interconnects can enable communications in one chip, or through IC stacks, forming a user defined communications layer for 3D ICs. In some implementations, encrypted pulse sequences can be used to form secure communication channels that are ad-hoc in nature, e.g., providing programmable wireless interconnections between discrete IC elements (e.g., of the FEOL portion). The added interconnect capability can allow the programmers to use ultra-high fan-out and fan-in capabilities, e.g., which is often needed to implement algorithms in associative pattern recognition algorithms, such as in applications including face or feature recognition in image processing. Furthermore, the added acoustic programmable wireless link can relieve the communications bottleneck encountered in multi-core digital systems.

For example, the disclosed acoustic in-chip communication technology can provide sonar based chip-interrogation. For example, the disclosed integrated piezoelectric transducer arrays can be used to interrogate the chip or a multi-chip package to realize an integrated non-destructive evaluation (NDE) capability. Such interrogations can be employed for chip-scale NDE of wire-bonds, chip-to-chip interconnects, vias, etc. Also, for example, for security, an adversary initiated chip manipulation could be detected at a very early stage (e.g., such as by a merchant foundry for manufacturing of an IC chip design). Moreover, early detection of chip tampering could lead to immediate removal of memory or self-destruction for trusted use of integrated circuits.

Furthermore, most existing IC devices generate substantial amounts of heat that can (1) lead to degradation of portions or the entire IC device and (2) lower performance (e.g., speed) of the device during operation, e.g., particularly during extensive periods of use. IC devices can undergo various spot heating, in which particular locations or regions (e.g., circuit blocks) of the IC generate high heat. For example, the disclosed integrated piezoelectric transducer arrays can be used to monitor spot heating within the IC device to which the disclosed transducer arrays are employed. Knowledge of spot heating during operation of IC devices is of great interest, as such monitoring could be used to reroute process implementations to other IC device resources in areas outside of the spot heating, thereby allowing for the spot heat to dissipate faster and avoid reduced device performance or degradation.

Moreover, for example, the disclosed integrated piezoelectric transducer arrays can be used to image and thereby monitor structural defects and fractures of in-chip elements and chip-to-chip interconnection structures that can lead to device failure. For example, thermal cycling of ICs in various microchip-based devices like computers, mobile communication (smart phone devices), etc. can also cause degradation at the grease interface between IC chips and their coupled heat syncs. Additionally, delamination of solder balls at wire bonding interfaces is a common problems that result in premature failure of such chip-based devices. Thus, using the disclosed technology, sonar based chip-interrogation can be implemented to prolong the lifetime of such chip-based devices.

For example, the disclosed acoustic in-chip communication technology can provide sonar based lock-key operations. For example, for safe operation of some proprietary chip-sets, a lock/key system is employed to ensure activation by a known entity, and deem the chip inoperable by an adversary. Current methods include MEMS gears and beams for enabling a lock, which although effective can be not as reliable due to stiction. For example, the disclosed integrated piezoelectric transducer arrays can be used to provide sonar links to read surfaces preprogrammed to reflect ultrasonic pulses through a set of programmable reflectors, triggering a device if the pulse makes it to a target receiver on chip.

In one aspect, an integrated circuit chip device with wireless on-chip communications capabilities includes a semiconductor substrate capable of propagating acoustic energy signals and an array of acoustic signaling modules formed on the substrate and structured to include a sub-array of acoustic transducer elements capable of transmitting and receiving the acoustic energy signals, in which each acoustic transducer element is operable to generate an acoustic communications signal to propagate through the substrate based on an electronic control signal and to receive the acoustic communications signal an acoustic signaling module to communicate with one or more other acoustic signaling modules. For example, the device can further include a control circuit layer formed on the semiconductor substrate and under the array of acoustic signaling modules to receive an external electronic signal and produce the electronic control signal to one or more acoustic transducer elements. For example, the acoustic communications signal can be modulated by the device using one or more of amplitude modulation, frequency modulation, or phase modulation.

In another aspect, a semiconductor integrated circuit device having wireless ultrasonic communication links includes a semiconductor substrate, layers formed over the semiconductor substrate and patterned to form circuit elements including transistors, and an array of ultrasound transducers formed in the layers over the semiconductor substrate, each ultrasound transducer including ultrasound transducer elements which are operable to generate an ultrasound signal carrying information to communicate with one or more ultrasound transducers in the array and are operable to receive an incident ultrasound signal from one or more ultrasound transducers, the ultrasound transducers being communicatively coupled to respective individual circuit elements or blocks of two or more circuit elements of the circuit elements formed in the layers over the semiconductor substrate to act as communication nodes for the respective individual circuit elements or blocks of two or more circuit elements with other individual circuit elements or blocks of two or more circuit elements. Each ultrasound transducer in the array of ultrasound transducers is configured to control transmission or reception of the ultrasound transducers so that the ultrasound transducers in the array of ultrasound transducers are interconnected via ultrasound signals to form an ultrasound communication network of ultrasonic communication links, without hardwiring via metal contacts, between the circuit elements formed in the layers over the semiconductor substrate.

FIG. 1C shows a schematic illustration of an exemplary chip-scale wireless communications IC device 100 including an array of acoustic transceiver (sonar) modules 110 capable of transmitting and receiving acoustic communications signals. The device 100 is structured to include a substrate 120 to provide a base for the array of sonar modules 110 and formed of a solid state semiconductor material capable of propagating acoustic energy (e.g., ultrasound signal) within the device 100, e.g., including between sonar modules 110 of the array. In some examples, the sonar modules 110 can be configured as thin films of aluminum nitride (AlN) and/or lead zirconium titanate (PZT) on top of a metallization layer. In some examples, the acoustic propagation medium 120 can include silicon, e.g., such as the silicon material of a silicon die. Each or any of the sonar modules 110 can be structured to include a sub-array of individual piezoelectric transducer elements 130 (shown in FIG. 1D), e.g., sometimes referred to herein as pixel elements or pixels. The sub-array of individual piezoelectric transducer elements 130 can be communicatively linked to underlying electronic control circuits (shown in FIG. 1D as control circuit layer 132). The electronic control circuits can include driving circuits for providing the driving signals that the transducer elements 130 transduce to produce the acoustic communication signals and logic circuits to process received acoustic communication signals transduced by the transducer elements 130.

In some implementations, for example, the device 100 can further include an acoustic reflector/mismatching layer 125 capable of reflecting or refracting the exemplary intra-device ultrasound signal, e.g., which can be used to steer the ultrasound communication signal from one or more sonar modules 110 to another one or more sonar modules 110. For example, the acoustic reflector layer 125 can be configured under the acoustic propagation medium substrate 120, as shown in FIG. 1C, and/or be configured along one or more sides of the substrate 120. In some implementations, for example, the device 100 can further include an acoustic absorber layer 126 to absorb the exemplary intra-device ultrasound signal, e.g., preventing the ultrasound communication signal from transmission beyond the device 100. In the example shown in FIG. 1C, the acoustic absorber layer 126 is configured along the sides of the acoustic propagation medium substrate 120. In some implementations, for example, the device 100 can be included in an array of devices 100 for both intra- and inter-device in-chip wireless communication signaling. In some implementations, for example, the device 100 can be included on a conventional integrated circuit chip, as described later in this patent document.

Figure 1D:
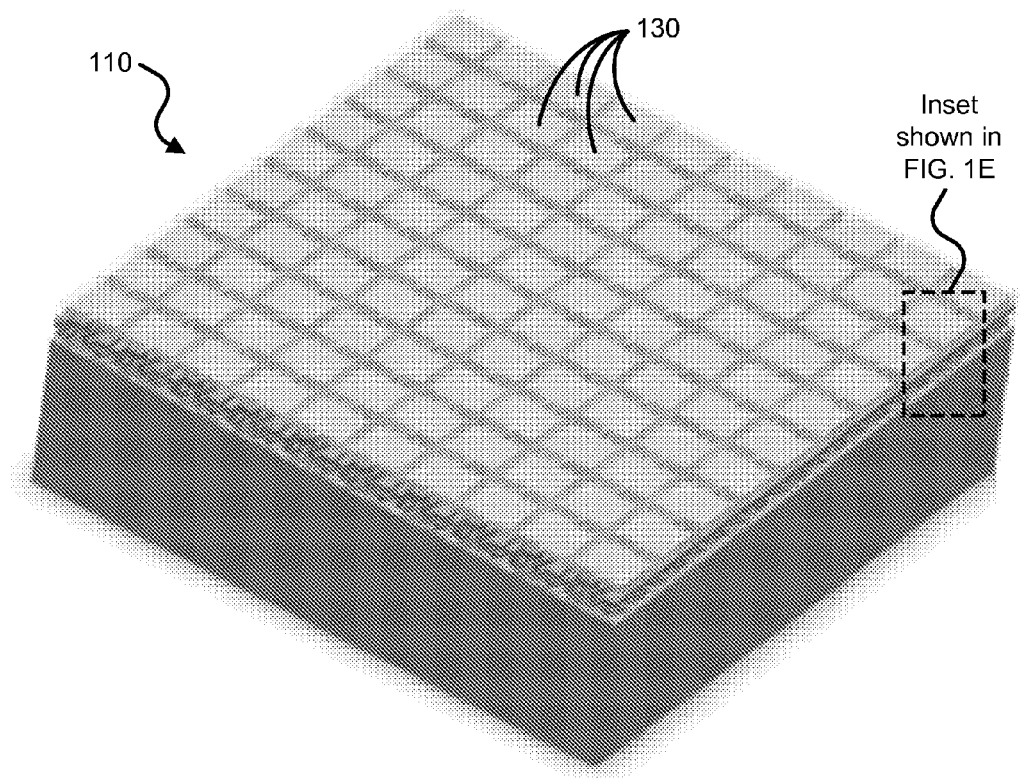
FIG. 1D shows an inset schematic from FIG. 1C showing an exemplary CMOS-integrated piezoelectric transducer array of an exemplary sonar module.

As shown in FIG. 1D, the piezoelectric transducer elements 130 of the sonar modules 110 can be configured with uniform or periodic spacing in the pixel array, e.g., including 2J2 spacing. For example, since each piezoelectric transducer element 130 of the sub-array (of a sonar module 110) is a fraction of a wavelength in lateral dimensions, relatively small phased arrays for sonar transmit and receive blocks can be implemented. In some embodiments of the device 100, for example, each sonar module 110 can include 10-20 pixels which are placed approximately one-half of an acoustic wave wavelength apart. In one example, each pixel can be configured to a size in a range of 3-10 μm, such that each sonar module 110 includes a planar size of ~100×100 μm, e.g., which is about the size of a contact pad on a CMOS chip. Also for example, the acoustic propagation medium substrate 120 can be configured to a height of 750 μm (or 84λ, in this example).

Figure 1E:
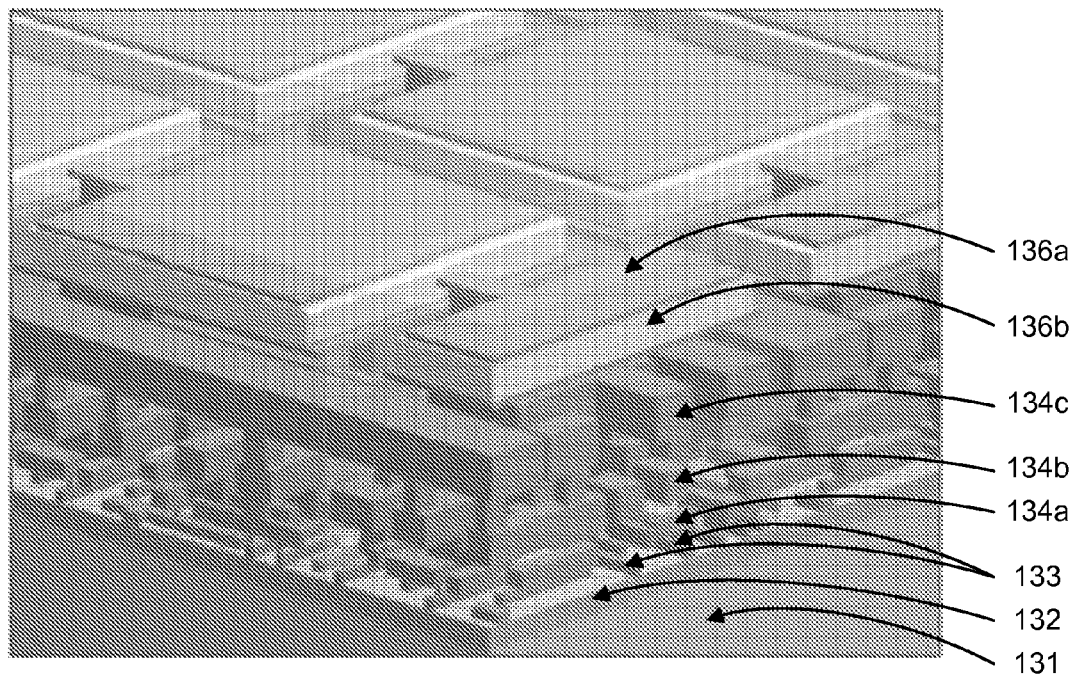
FIG. 1E shows an inset schematic from FIG. 1D showing an exemplary CMOS-integrated piezoelectric transducer element.
Figure 1F:
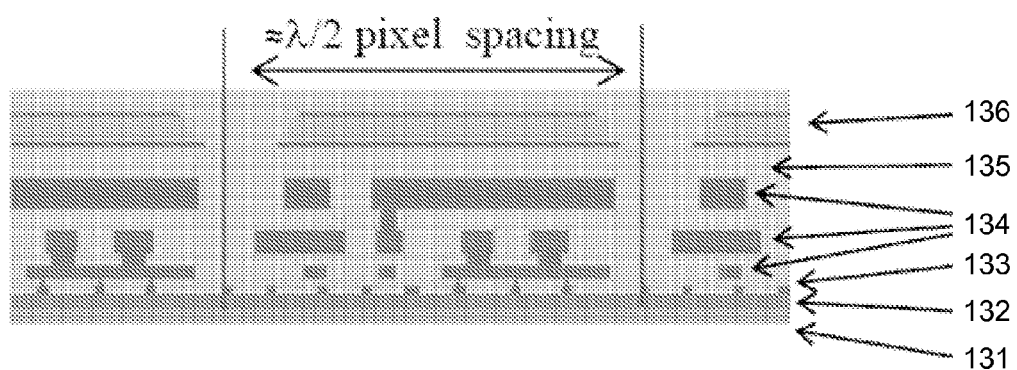
FIG. 1F shows an inset schematic from FIG. 1D showing a cross-sectional view of the exemplary CMOS-integrated piezoelectric transducer element.

FIGS. 1E and 1F show inset schematics from FIG. 1D showing the piezoelectric transducer element 130 of the device 100 in a three-dimensional view and a cross-sectional view, respectively, over a control circuit layer 132 and the substrate 120. For example, the acoustic propagation medium material of the substrate 120 can include bulk Silicon material 131. In some examples, the control circuit layer 132 can be structured to include one or more CMOS active layers 132 structured to include individual control circuit blocks corresponding to the individual piezoelectric transducer elements 130 of the sub-array, e.g. in which the control circuits can include one or more driving circuits, read circuits, and logic circuits including digital logic, analog logic and/or amplifiers, which are formed on the exemplary bulk Silicon layer 131. A first metal layer 133 can be formed over the one or more CMOS active layers 132. For example, the bulk Silicon substrate 131, the CMOS active layers 132, and the first metal layer 133 form a FEOL region of the device 100. The transducer element 130 can be structured to include more metal layers, e.g., including a second, a third, and a fourth metal layers 134a, 134b, and 134c, respectively, as shown in FIGS. 1E and 1F. The transducer element 130 can be structured to include an electrode structure layer 136b, upon which, a piezoelectric material (e.g., AlN) layer 136a is formed. The transducer element 130 can be structured to include an intermetal dielectric material 135 that is formed between the metal layers 134a, 134b, and 134c, and over the FEOL region. For example, the metal layers 134a, 134b, and 134c, the electrode structure layer 136b, the intermetal dielectric material 135, and the piezoelectric material layer 136a form a BEOL region of the device 100.

For example, the metal layer structures 133, 134a, 134b, and/or 134c function both as interconnect layer(s) for electronics, and can also function as part of the disclosed technology as custom designed acoustic wave guiding, channeling, or scattering structures. In some examples, is also possible to clear the underlying regions of certain pixels of metals and route them around the pixels to allow propagation of ultrasonic signals without any obstruction.

The sonar modules 110 are operable to receive and convert an electrical control signal to generate an acoustic energy wave or pulse carrying a communication signal to communicate with one or more other sonar modules of the array, which can receive the acoustic communication signal and transduce it to an electrical signal. For example, the array of sonar modules 110 can operate as acoustic transmitter and receiver (transceiver) modules, which can communicate with each other by proper phasing of sonar pulses sent at desired angles, frequency division modulation, or other techniques. As shown in FIG. 1C, a sonar transceiver module 110A transduces an electrical control signal that it receives to an ultrasound signal 111 that propagates through the acoustic propagation medium 120. For example, the ultrasound signal 111 can reflect off a device boundary (e.g., such as acoustical reflector layer 125) and be incident on another sonar transceiver module 110b, as shown by the signal propagation path 111a. Additionally or alternatively, for example, surface acoustic waves (SAW) can be used to communicate laterally, as shown by the SAW propagation path 111b.

In some implementations, the generated ultrasound signal 111 can be a continuous or pulsed ultrasound (sonic) wave. For example, the sonic waves can be generated at frequencies from the hundreds of MHz to GHz in a silicon-based propagation medium, with the corresponding wavelengths in a range from the tens to single microns, e.g., including 90 to 9 μm wavelength sonic waves at 100 MHz to 1 GHz frequencies, respectively, in a silicon medium. The relatively small acoustic wavelength, e.g., as compared to the thickness of the silicon medium or substrate, enables the use of the propagation medium 120 to transmit the ultrasound signals from one place to another.

For example, the ultrasound beam 111 can be launched into the propagation medium 120 at a wide range of solid angles and targeted to a specific receiver sonar module 110b, e.g. any of the sonar modules in the array, by adjusting the delays/phases and amplitudes of the ultrasound pulses to each of the piezoelectric transducer elements 130.

In some implementations of the disclosed acoustic in-chip communication technology, for example, further accuracy in targeting can be achieved by recombining the electronic signals from the receiving transducer array with appropriate delays for the desired channel. This sonic programmable communications channel can be used as a reconfigurable interconnect network that a non-desired party (adversarial interests) cannot determine with any physical scheme. The sonic interconnects can be software defined, and hence protectable using many methods of software encoding.

The exemplary acoustic in-chip communication devices can be configured to prevent the acoustic signals from propagating out of the device, or leaking. For example, because sound waves decay very fast and they cannot propagate out of the device, it can be very hard for a non-desired user (or adversary) to listen to the acoustic channels. For example, since optimal communication uses both the configuration of the transmitter and receiver arrays, the actual acoustic signals can be obfuscated with deliberate transmitter spurious signals that match nulls in the receivers but are otherwise indistinguishable from the real signals.

For example, a different modality of ultrasonic chip-scale/board-level communication is possible under acoustically mismatched or highly reflective boundary conditions instead of absorbing boundary conditions. In this exemplary mode, individual ultrasonic transducers on the transmitting array can be used to control standing wave patterns at the transducers of the receiving array. As such, the disclosed acoustic in-chip communication devices can be regarded as a large acoustic resonator, to which different transducers located at different locations couple to with varying coupling coefficients that are a function of frequency of excitation. A matrix approach based on linear superposition is useful to model the linear regime of this modality.

Linear phased arrays can be used to focus a beam and aim it in the desired direction with characteristic radiation profiles. In ultrasound imaging, the beam can be scanned over the target field, and the returned signal is used to form the image based on acoustic reflection/transmission characteristics or time-of-flight information. In the disclosed technology, scanning a beam and focusing it in a single direction allows for the choice of where to communicate data. The principles of beam steering and focusing, e.g., using a linear phased array, is described, which is important for the understanding of the disclosed techniques of SONAR (SOund NAvigation & Ranging) operation. Examples of beam steering and focusing of the disclosed transducer arrays based devices for ultrasound imaging applications, for example, are described in: "An Integrated Circuit with Transmit Beamforming and Parallel Receive Channels for Real-Time Three-Dimensional Ultrasound Imaging" by Wygant et al., 2006 IEEE Ultrasonics Symposium (IUS), pp. 2186-89; "Circuit Design and Simulation of a Transmit Beamforming ASIC for High-Frequency Ultrasonic Imaging Systems" by Athanasopoulos et al., 2011 IEEE Transactions on Ultrasonics, Ferroelectrics, and Frequency Control, Vol. 58, No. 7, pp. 1320-31; and "Medical Imaging: Principles, Detectors, and Electronics—Chapter 7: Electronics for Diagnostic Ultrasound" by Wodnicki et al., Krzysztof Iniewski (ed), John Wiley & Sons 2009, in which the aforementioned documents are incorporated by reference as part of this patent document.

Figure 2A:
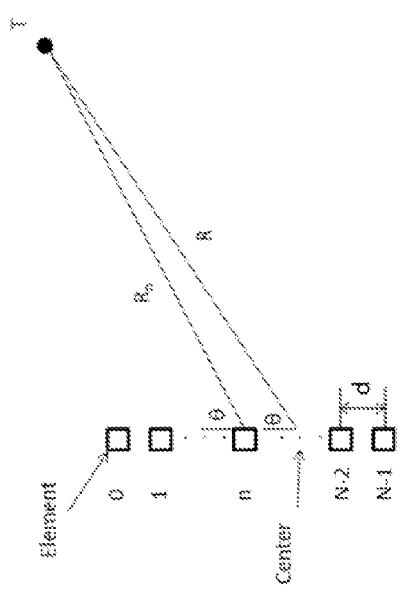
FIG. 2A shows a diagram of an exemplary one dimensional array of transducer elements spaced apart and used to focus on a single point.

FIG. 2A shows a diagram of an exemplary one dimensional array of N elements spaced d apart, used to focus on a single point T. The distance from the center of the array to the target is denoted as R, and the distance from element n to the target is denoted as $R_n$. Each element is represented as an isotropic emitter. As such the wave radiating from each would be represented as in Equation (1):

$$w = Ae^{j(kr-\omega t+\beta)} \quad (1)$$

In Equation (1), A is the amplitude of the signal, k is the wavenumber, r is the spherical radius from the source, $\omega$ is the frequency, t is time, and $\beta$ is the time phase delay of the source. If the target point T is far enough away such that R is much greater than the inter-element spacing d, than the angle $\theta$ (with respect to the positive z direction) for all the elements can be approximated as the same. This means that effectively all of the paths to the target from the elements are parallel, and the difference in path length, $\Delta r_n = R_n - R$, can be found from a simple trigonometric identity.

$$\Delta r_n = R_n - R = \frac{2n-N+1}{2} \cdot d \cdot \cos(\theta) \quad (2)$$

This leads to the pattern radiating from the $n^{th}$ element in the array to have the following form in Equation (3):

$$w_n = Ae^{j(k(R+\Delta r_n)-\omega t+\beta_n)} \quad (3)$$

If the actuation pattern of the array is chosen so that all elements are operated with the same amplitude and frequency but different phases, then the corresponding acoustic phasor at the target point T, $\omega t$, is the sum of all the wave contributions $w_n$ of the individual elements as given by Equation (4):

$$w_t = Ae^{jkR}e^{-j\omega t}\sum_{n=0}^{N-1} e^{j(k\Delta r_n+\beta_n)} \quad (4)$$

From this equation, it can be seen that a maximum will occur when the following equality is met:

$$k \cdot \frac{2n-N+1}{2} \cdot d \cdot \cos(\theta) + \beta_n = 0 \quad (5)$$

By selecting a value for $\theta$, the phase delay needed at each element can be calculated. From Equation (5), it can be seen that the phase is linear between elements. However, for example, due to the cyclic nature of both Equations (4) and (5), in addition to the designed main lobe of the beam, undesirable side-lobes may appear as well. Careful design of element spacing and number of elements is implemented to treat such results. In addition to this, there can be a trade-off in terms of space and power, which is taken into account.

Figure 2B:
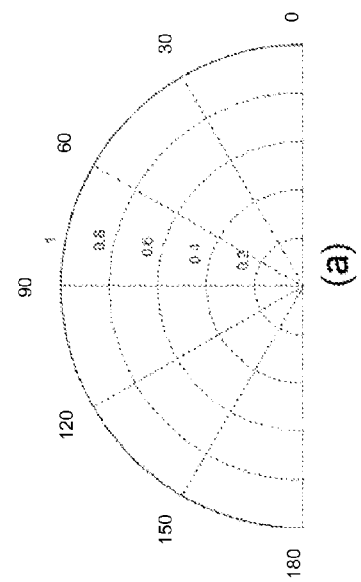
FIG. 2B shows data plots of exemplary acoustic responses from an acoustic radiator source.
Figure 2B:
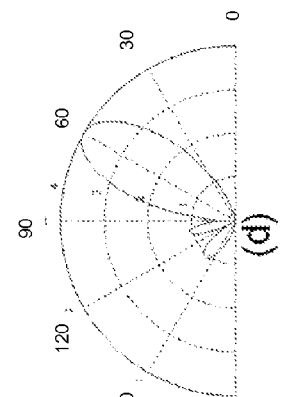
Figure 2B:
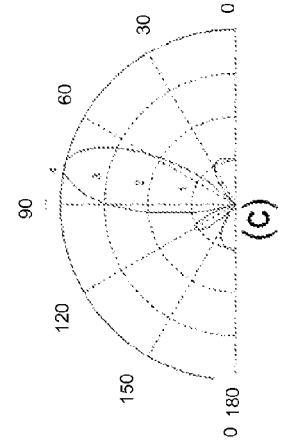
Figure 2B:
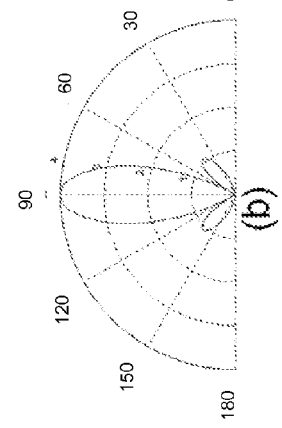

For example, using a single isotropic acoustic radiator as in FIG. 2B(a) shows a uniform response at all angles from the source. For example, using four isotropic acoustic radiators separated by $d=\lambda/2$ and actuated with the same phase, a pattern as shown in FIG. 2B(b) can be produced. In this case, the amplitude is 4 times as large at the 90 degree and reduced for other angles. The plots shown in FIGS. 2B(c) and 2B(d) represent patterns obtained from phase delays of 20 degree and 45 degree, respectively.

Exemplary simulations of the disclosed acoustic in-chip communication devices were performed. For example, the exemplary simulations utilized Finite Element Modeling (FEM) software, which can provide a tool to aid in the phased-array design, especially in the presence of complex boundary conditions. Also, for example, PZFlex was used to calculate time domain responses of materials to phased acoustic excitations of piezoelectric elements on a silicon substrate. In the exemplary simulations, each element is pulsed with wavelet pulses of either in-phase or a linearly changing phase difference between elements. The exemplary resulting acoustic pressure field is plotted in FIGS. 3A and 3B for in-phase and linearly changing phase difference (e.g., steps of 20° between neighboring elements) excitations, respectively.

FIG. 3A shows an exemplary simulation plot of phased array acoustic radiation pressure for zero degree phase shift between elements. The inset diagram in FIG. 3A shows a zoomed view of an exemplary MN transducer array. In this example, the input excitation was 1 V at 100 MHz, yielding an ultrasonic wave with a maximum pressure of 20 kPa. FIG. 3B shows an exemplary simulation plot of acoustic radiation pressure for 20 degrees phase shift between elements of the phased array. In this example, the maximum amplitude of the pressure wave is 20 kPa.

PZFlex was also used to calculate the time domain response of a single element pulsed as well as the received signals on the neighboring pixels. For example, a voltage signal on the first pixel creates an acoustic wave, which travels through the silicon substrate and reflects off of the back surface and returns to the top surface. As it travels beam spreads out and the neighboring pixel will generate a voltage in response to the acoustic pulse.

Figure 3C:
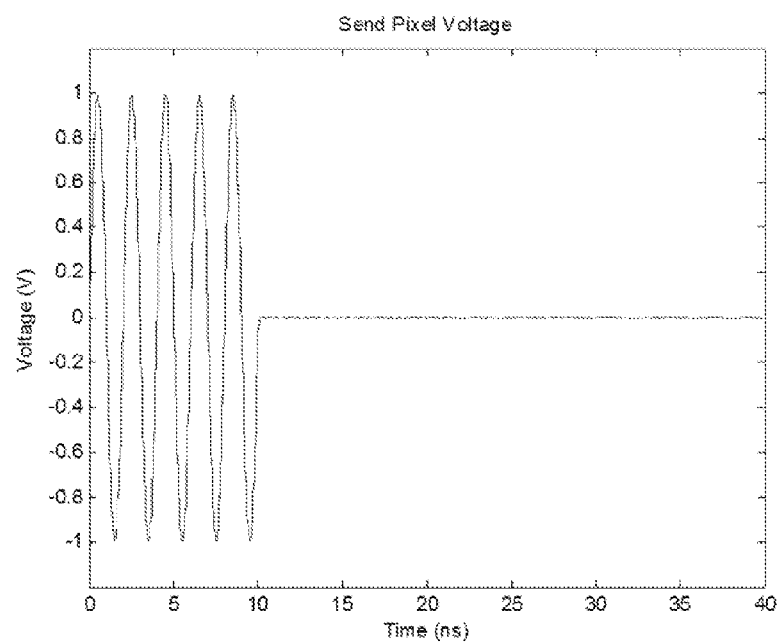
FIG. 3C shows a plot of the applied signal voltage for an exemplary simulation of the time domain response of an exemplary transducer element generating an acoustic pulse.
Figure 3D:
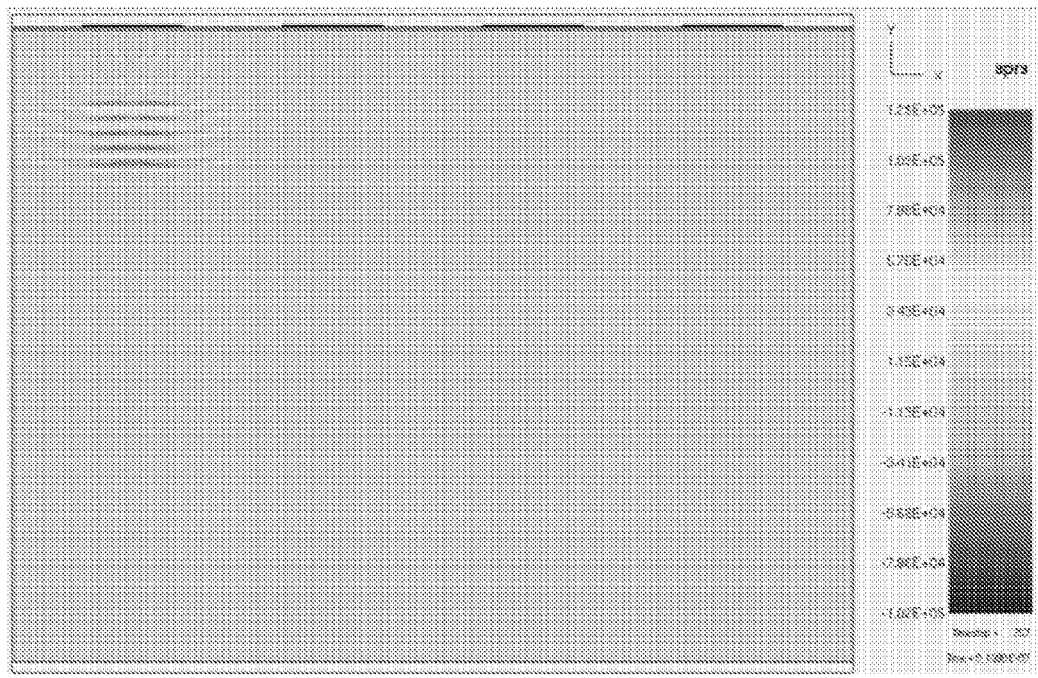
FIG. 3D shows an exemplary simulation plot of the acoustic radiation pressure for the initial pulse.
Figure 3E:
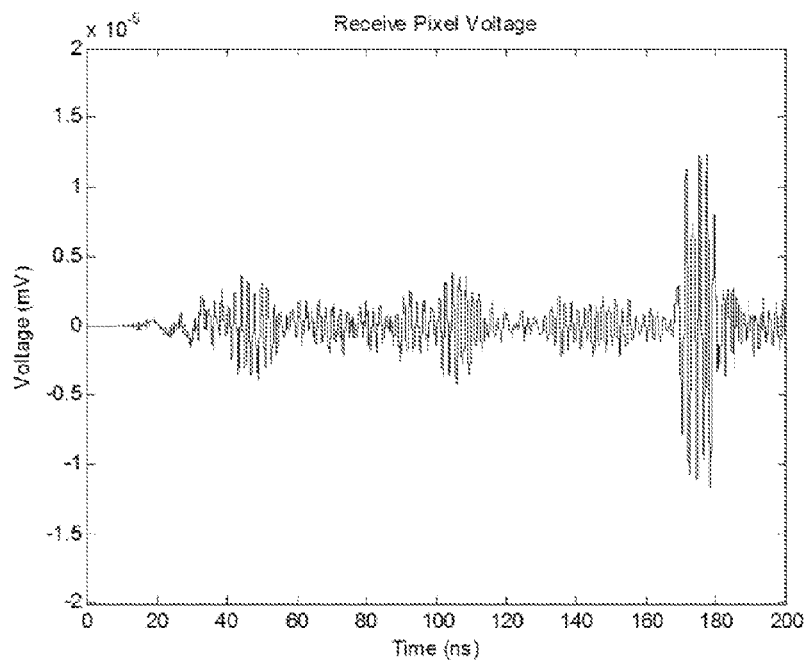
FIG. 3E shows a data plot of the signal received by an exemplary transducer element in the array.
Figure 3F:
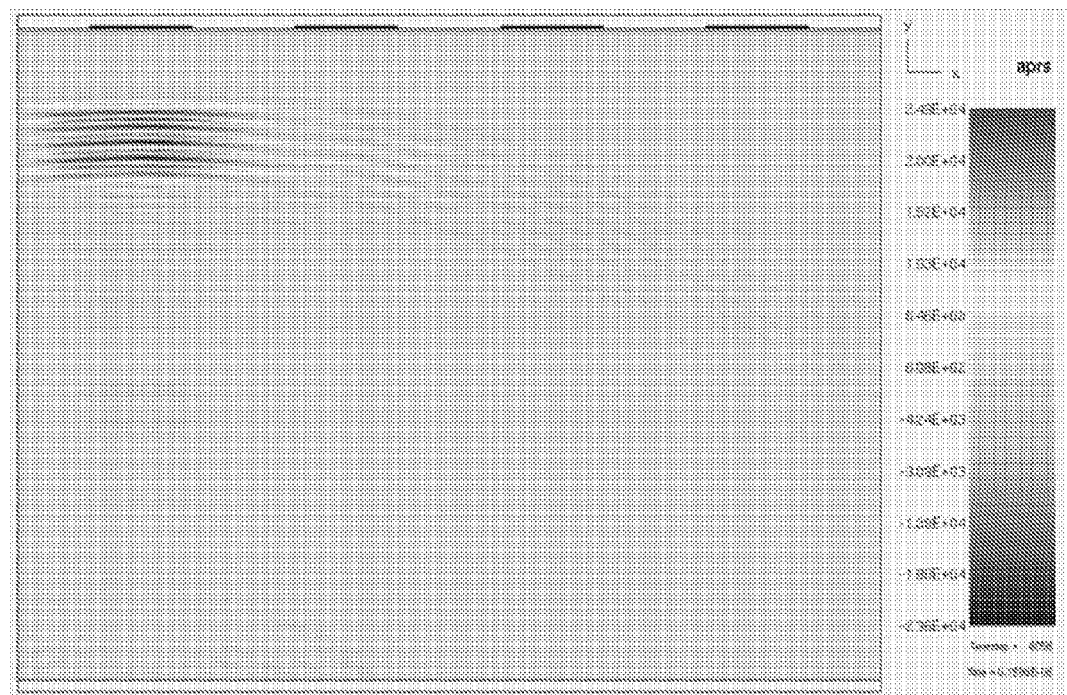
FIG. 3F shows an exemplary simulation plot of acoustic radiation pressure for the traveling and reflected pulse.

FIG. 3C shows a plot of the applied signal voltage, e.g., 1 Vp-p 5 cycles of 500 MHz Sine wave, for the exemplary simulation of the time domain response of an exemplary single transducer element generating an acoustic pulse wave. FIG. 3D shows an exemplary simulation plot of the acoustic radiation pressure for the initial pulse leaves from the left-most pixel of the exemplary array. FIG. 3E shows a plot of the receive signal at the adjacent pixel, e.g., including a delay is 160 ns, which corresponds to the speed of acoustic waves in silicon. FIG. 3F shows an exemplary simulation plot of acoustic radiation pressure for the pulse after travelling to a reflecting surface (e.g., at the bottom) and reflecting back. As shown in FIG. 3F, the beam width has widened and some of the energy is picked up by the immediately adjacent pixel.

Exemplary implementations of the disclosed acoustic in-chip communication technology were performed. In one implementation, for example, exemplary acoustic in-chip communication devices were fabricated using an RF MEMS process. Starting with a silicon substrate, the RF MEMS process involved deposition of silicon dioxide of 3.5 µm. Trenches were etched into the silicon dioxide and filled with tungsten, which was then planarized using chemical mechanical polishing. The tungsten can act as an etch stop for the aluminum nitride in subsequent steps. Next, a bottom electrode was deposited and patterned for the back side electrical contact. This was followed by the deposition of the piezoelectric aluminum nitride layer. After a photolithography step, the piezoelectric aluminum nitride layer was etched until reaching the tungsten layer. Finally, a top layer metal was deposited and patterned for the exemplary devices. In one exemplary embodiment of the devices for a SONAR system, a four by four piezoelectric transducer element array was laid out in this process. The exemplary transducer elements were configured to be 100 µm×100 µm squares separated by 200 µm.

Figure 4A:
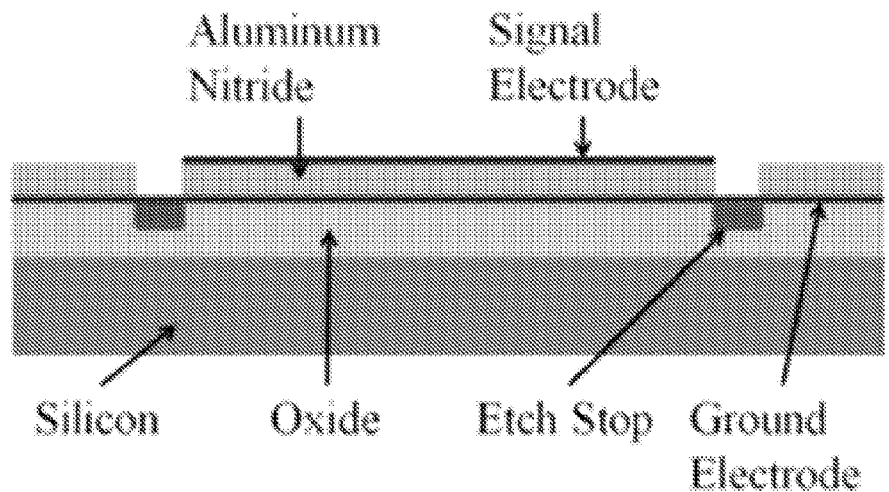
FIG. 4A shows a cross-sectional view of a schematic illustration of one exemplary piezoelectric transducer element produced using an exemplary fabrication process.

FIG. 4A shows a cross-sectional view of a schematic illustration of one exemplary piezoelectric transducer element fabricated using the exemplary RF MEMS process.

Figure 4B:
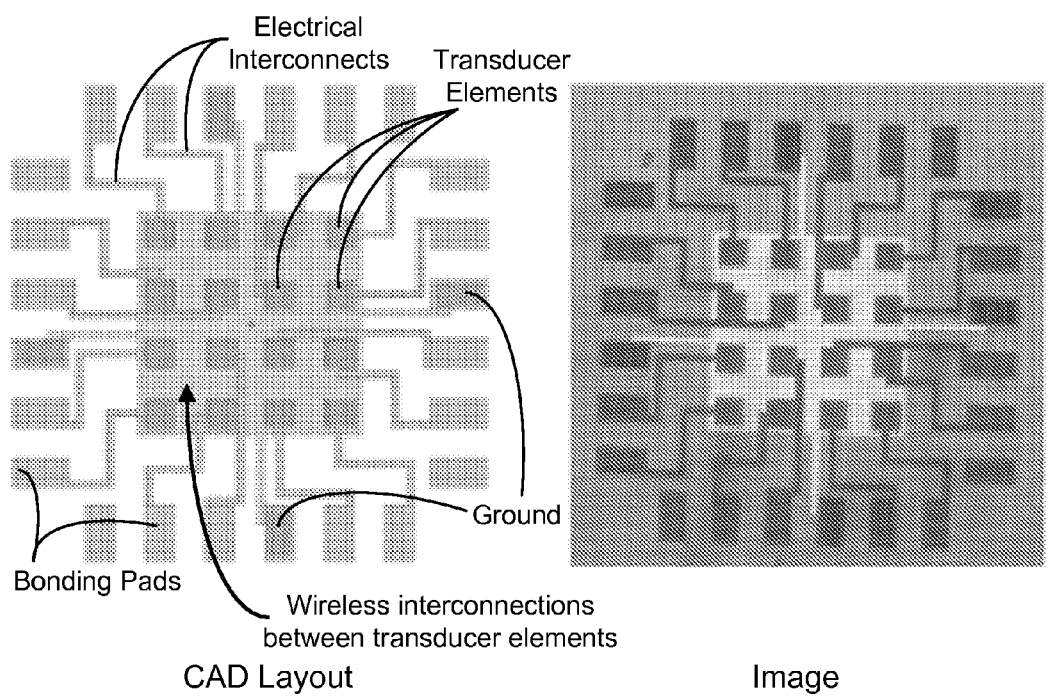
FIG. 4B shows a top view of a CAD layout diagram and an image of an exemplary acoustic in-chip communication device produced using an exemplary fabrication process.

FIG. 4B shows a top view of a CAD layout diagram as well as an image of the exemplary acoustic in-chip communication device fabricated using the exemplary RF MEMS process. As shown in FIGS. 4A and 4B, the exemplary acoustic in-chip wireless communication device includes a 4×4 array of the piezoelectric transducer elements each electrically coupled to an electrical bonding pad via corresponding electrical interconnections. The exemplary device includes contact pads that are electrically coupled to the ground electrode of the device.

Figure 5A:
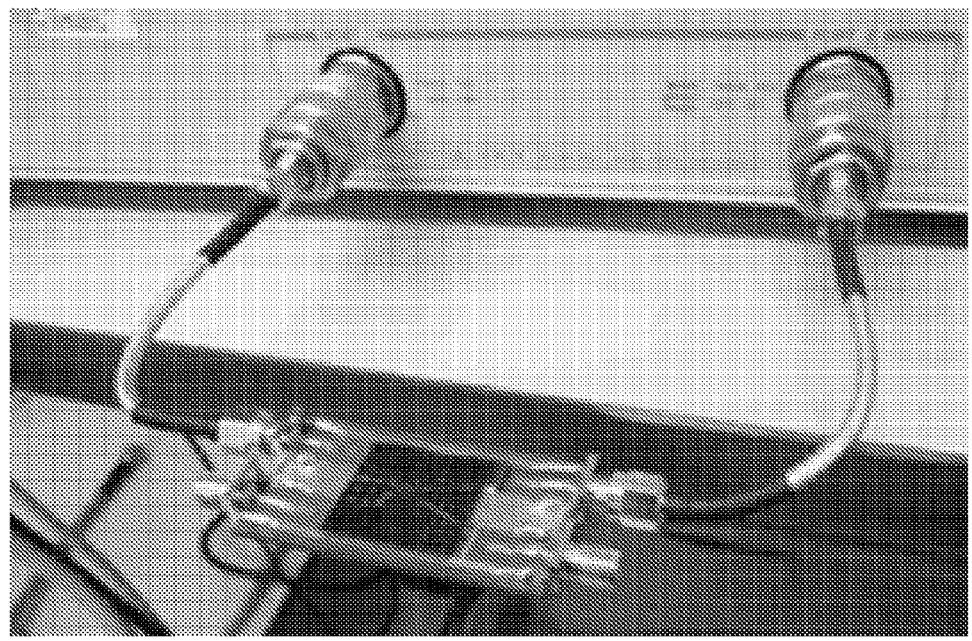
FIGS. 5A and 5B show an image and schematic illustration depicting an exemplary acoustic in-chip communication device in an exemplary implementation setup configuration.
Figure 5B:
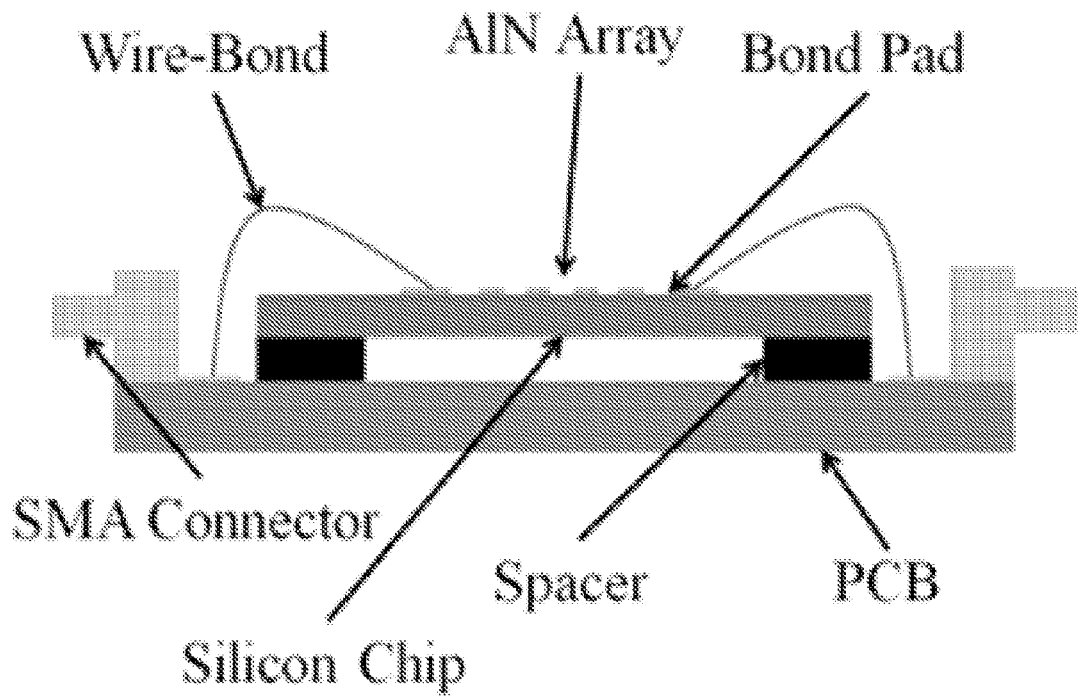

The exemplary fabricated silicon die with the aluminum nitride arrays was mounted to a printed circuit board (PCB) to perform tests using an HP8753ES RF network analyzer, as shown by the image in FIG. 5A. The PCB houses SMA ports to interface with RF equipment. The die was mounted on the PCB on top of spacers. For example, this allows the bottom of the silicon to be exposed to air creating a large contrast in acoustic impedances resulting in a strong reflection at the bottom surface. For example, if the exemplary chip device were secured to the PCB underneath, part of the sound waves would may propagate into the PCB due to its material, e.g., FR4, having a much closer acoustic impedance to silicon compared to air. This exemplary configuration prevents a large loss in signal power transmitted to the target. Wire-bonding pads on the chip, which are used for electrical connections to the PCB, were placed away from the sites of the active piezoelectric elements, e.g., so as to reduce sonic coupling into the wires. FIG. 5B shows a cross-sectional view of a schematic illustration of this exemplary setup.

Figure 6A:
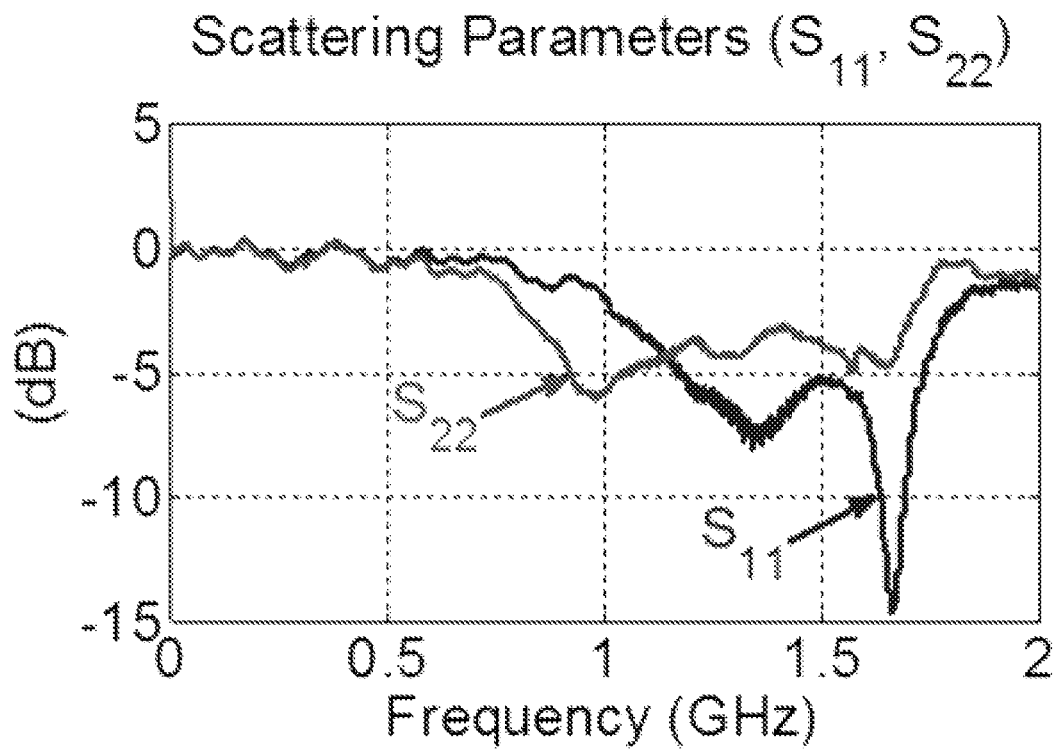
FIG. 6A shows a data plot showing exemplary results of reflection scattering parameters for the two transducer elements in an exemplary sonar array in-chip communication device.
Figure 6B:
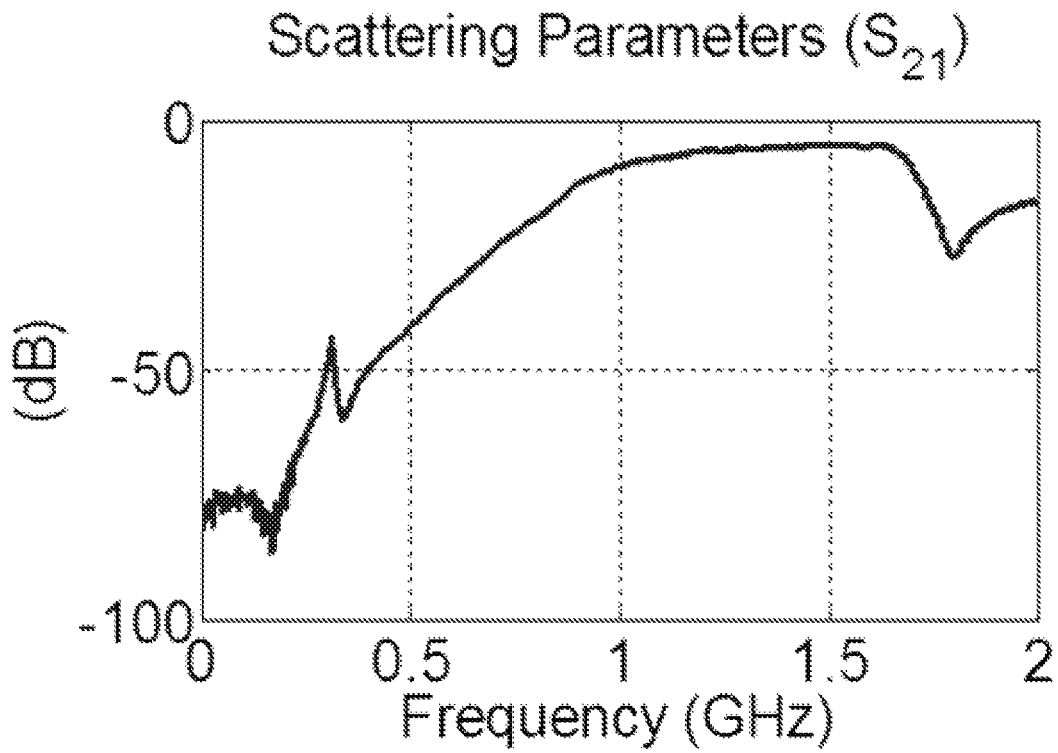
FIG. 6B shows a data plot showing exemplary results of a transmission scattering parameter for the two exemplary transducer elements in the array.

In one exemplary implementation, two pixels in the array of the exemplary device shown in FIGS. 4A-5B, which are 400 μm apart, were wire bonded to the SMA connectors for measurement of the scattering parameters using the network analyzer. For example, reflection scattering parameters $S_{11}$ and $S_{22}$ correspond to the reflection of energy back into the port under the implementation, as shown in FIG. 6A. Exemplary results of the implementation showed that there are peaks at 1.34 GHz and 1.66 GHz, which are the fundamental resonant modes of the exemplary device. These are the modes at which ultrasonic energy is most easily injected into the silicon substrate. FIG. 6B shows a data plot showing exemplary results of a transmission scattering parameter, $S_{21}$, for the two exemplary transducer elements in the array. The $S_{21}$ parameter shows that from 1.06 GHz to 1.67 GHz there is a loss of only 5 dB. This exemplary implementation demonstrates exemplary bandwidth of communication between these two elements.

As shown in these exemplary implementations, exemplary ultrasonic phased arrays in-chip communication devices can be integrated on chip to enable pulses to be transmitted from any location to another by beam steering for reconfigurable communication links. Exemplary results showed acoustic coupling between the transducer elements in the array, e.g., by measuring the reflection scattering parameters of the two exemplary microfabricated, 100 μm×100 μm AlN transducer elements, which are spaced 400 μm away within the same 4×4 array.

In some aspects, the disclosed array of CMOS-integrated piezoelectric transducer (sonar) modules can be integrated into a 3D chip-stack to enable pulses to be transmitted from any location to another by beam steering. An array of sonar elements can transmit sound pulses through stacks with mechanical connections.

Figure 7A:
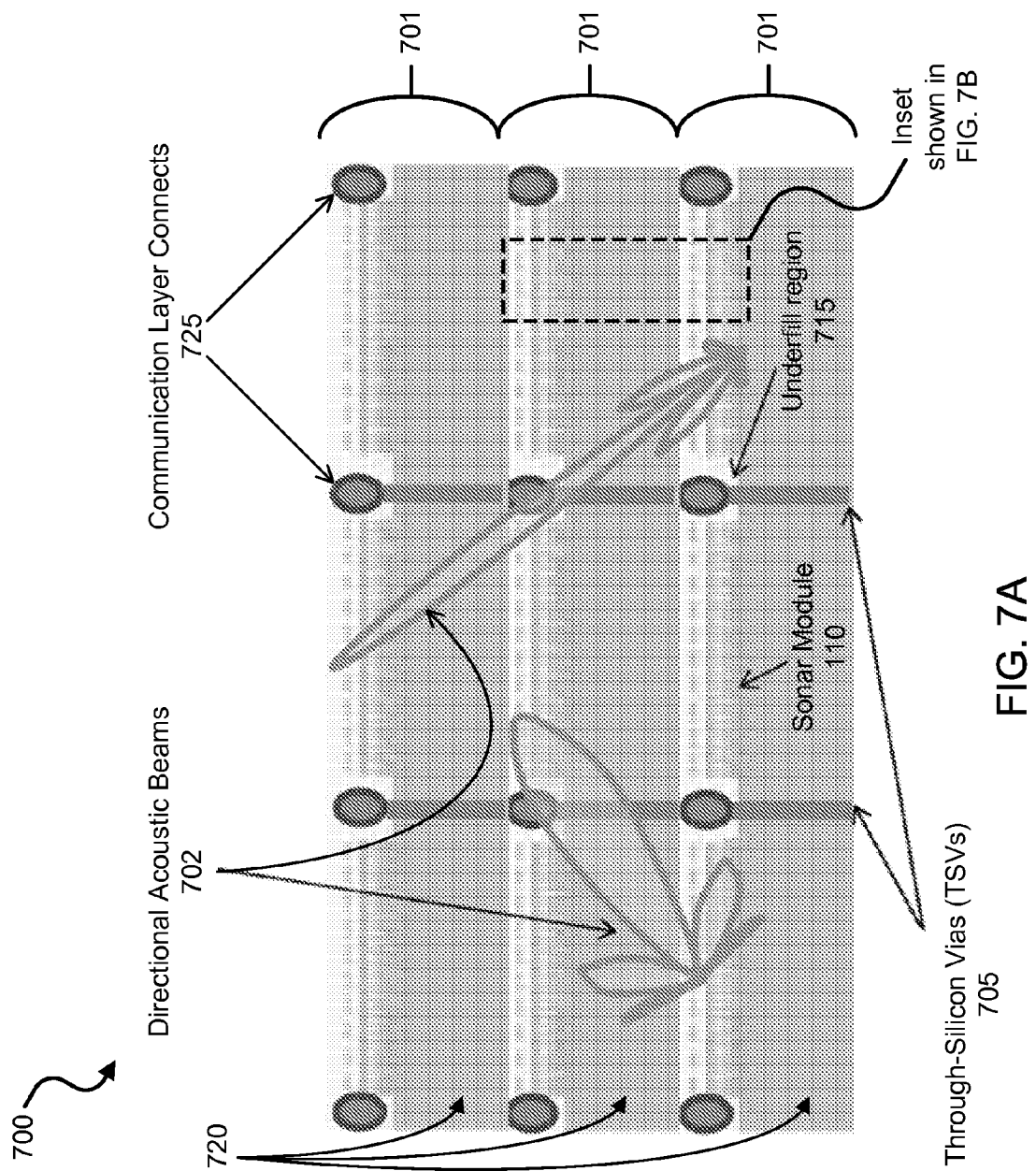
FIG. 7A shows a schematic illustration of an exemplary 3D chip-scale wireless communications IC device.

FIG. 7A shows a schematic illustration of an exemplary 3D chip-scale wireless communications IC device 700 including a plurality of layers 701 of arrays of the acoustic transceiver (sonar) modules 110 capable of transmitting and receiving directional acoustic communications signals 702 in a single layer and between multiple layers. Each of the layers 701 are structured to include dielectric sub-layer 720 to provide an acoustic propagation medium for the acoustic communication signal 702 (e.g., ultrasound wave) to propagate within the device 700, e.g., including between sonar modules 110 of the arrays. The device 700 can include an underfill region 715 between dies and around bumps to provide continuous propagation medium transitions between the layers 701. As previously described and shown in FIGS. 1C-1F, each or any of the sonar modules 110 of the device 700 can be structured to include a sub-array of individual piezoelectric transducer elements 130 (shown in FIG. 1D). The sub-array of individual piezoelectric transducer elements 130 can be communicatively linked to underlying electronic control circuits including driving/read circuits and logic circuits. The device 700 can include a plurality of through-layer vias (TLVs) 705, e.g., in this example represented as through-Silicon vias, which can be used for electronic control signal routing, e.g. including power and clock signal routing. The device 700 can include communication layer interconnections that connect the electronic control circuits in each layer to the TLVs 705.

Figure 7B:
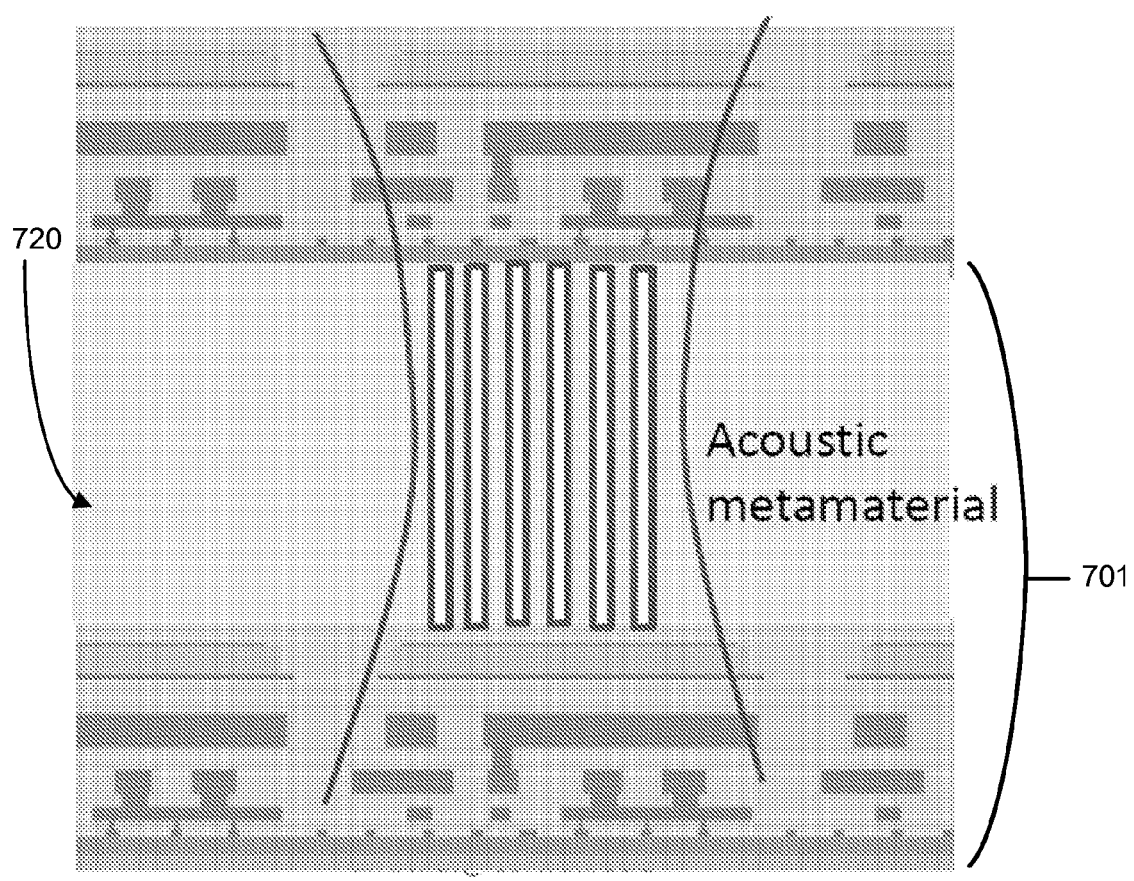
FIG. 7B shows an inset schematic from FIG. 7A showing an exemplary configuration of the acoustic propagation medium sub-layer.

FIG. 7B shows an inset schematic from FIG. 7A showing an exemplary configuration of the acoustic propagation medium sub-layer 720 including artificial structures as acoustic metamaterials to guide the sonic signals, e.g., effectuating the directional acoustic communication signal 702. In implementations, the acoustic metamaterial can function as an acoustic waveguide to promote more efficient transmission of acoustic waves from one point to another. It can also include frequency filtering functionality to transmit only ultrasonic waves of certain frequency (wavelength) or mode (shear or longitudinal waves) while attenuating or obstructing the passage of undesired frequencies or modes.

In some aspects, the disclosed technology includes fabrication methods to produce 2D and 3D in-chip wireless communication signaling devices.

In one exemplary embodiment, a method to fabricate exemplary chip-scale wireless communications IC devices, e.g., including the devices 100 and 700, can include AlN deposition techniques to form the piezoelectric transducer arrays. In some examples, sputter deposition of AlN is implemented at low temperatures (range), e.g., to be compatible with CMOS, but may utilize optimum metals like Tantalum for best films. The deposition of AlN at low temperatures also enables the placement of AlN embedded in the metallization stack. In some implementations, PZT thin films can be deposited though the sol-gel process, and require an anneal step which is typically at 700-800° C. This high temperature implies that the process flow for the PZT is to be implemented after CMOS fabrication. For example, PZT films can be transferred onto CMOS-based chips using oxide-oxide bonding, oxide-metal bonding, or metal-metal bonding.

Figure 8:
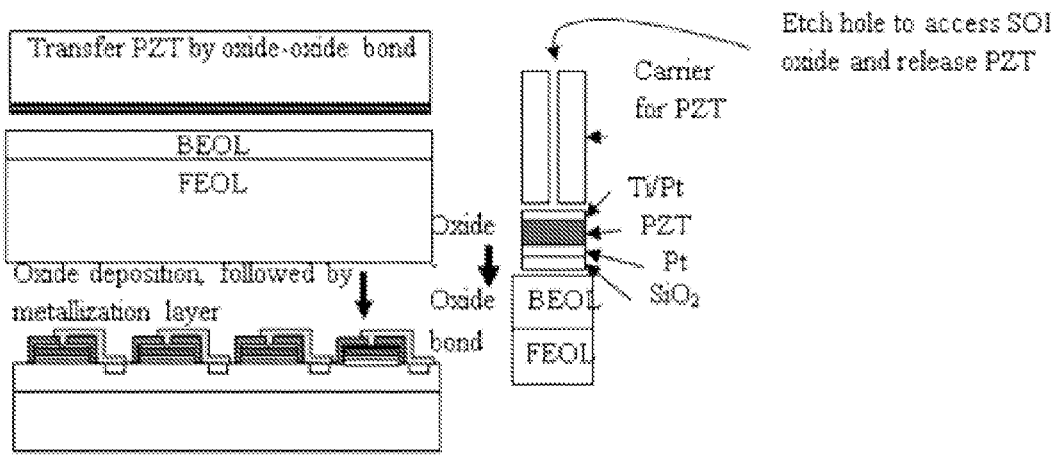
FIG. 8 shows a diagram of an exemplary PZT transfer process to an exemplary CMOS based IC chip.

FIG. 8 shows a diagram of an exemplary PZT transfer process to a CMOS based IC chip, in which a PZT stack is bonded to BEOL oxide-oxide oxide bonding that can be done at low temperatures with follow on processing to enable interconnects to top conductors of the exemplary PZT stack.

Figure 9:
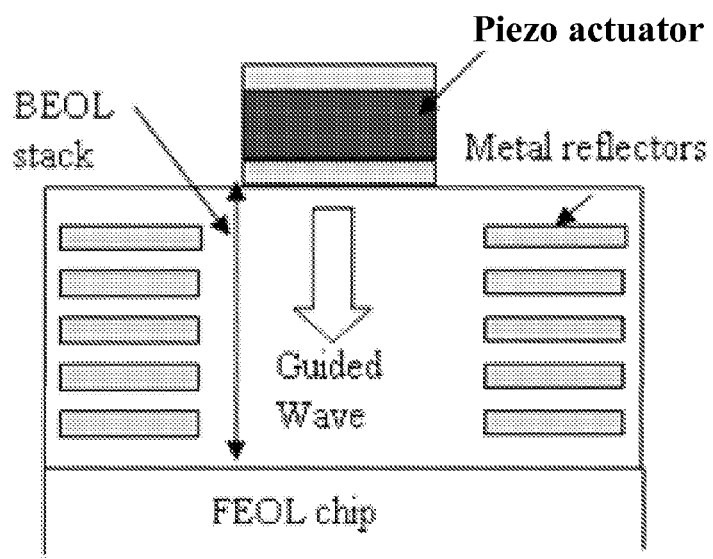
FIG. 9 shows a diagram of an exemplary BEOL stack including metal reflectors to optimize wave coupling to the exemplary semiconductor substrate.

In some implementations for example, the exemplary MN stack with TEOS oxide layers can form a 1-D waveguide to launch pressure (P) waves, also referred to as longitudinal waves, with the motion transduced into the thickness of the wafer. For such exemplary implementations, the exemplary devices can be designed and fabricated to effectuate the longitudinal wave impedance of the silicon wafer and possible reflections and transmissions through metal layers, e.g., which can be intentionally placed in the IC design to tune the impedance of the transducer. FIG. 9 shows a diagram of an exemplary BEOL stack including metal reflectors to optimize wave coupling to the semiconductor substrate. For example, longitudinal waves can be guided to prevent lateral diffraction based on the metal reflector structures positioned in the BEOL stack, e.g., such that the impedance of an exemplary copper-laden segment can have higher impedance than a TEOS-only segment. For example, the transducer electrical impedance can be calculated using an exemplary 1D model, e.g., including resonances and anti-resonances, and the absolute values of the impedances can lead to calculations of Q (quality factor) and $K^2$ (electro-mechanical coupling) of the transducers. For example, the value of $QK^2$ can determine the power efficiency of transducer efficiency.

For example, the design and fabrication of the exemplary wireless in-chip communication devices can be implemented to mitigate the effects of shear and SAW waves. For example, in addition to the longitudinal waves, the transducers can couple energy into shear and surface acoustic waves. For a pulse transduction, 67% of the energy is emitted as a surface wave if a surface transducer is used. In some examples, the exemplary techniques can determine the transducers design spacing by spacing the array elements in the stop-band of SAW waves. Longitudinal and shear waves can thus be used for the communication links, e.g., to minimize the coupling of energy into shear and SAW modes, as the wave motion corresponding to these modes will travel at different speeds and different directions, leading to unwanted cross-talk. Similarly, for example, shear waves can be minimized by configuring electrodes in symmetrical geometries to cancel out shear motion.

Figure 10:
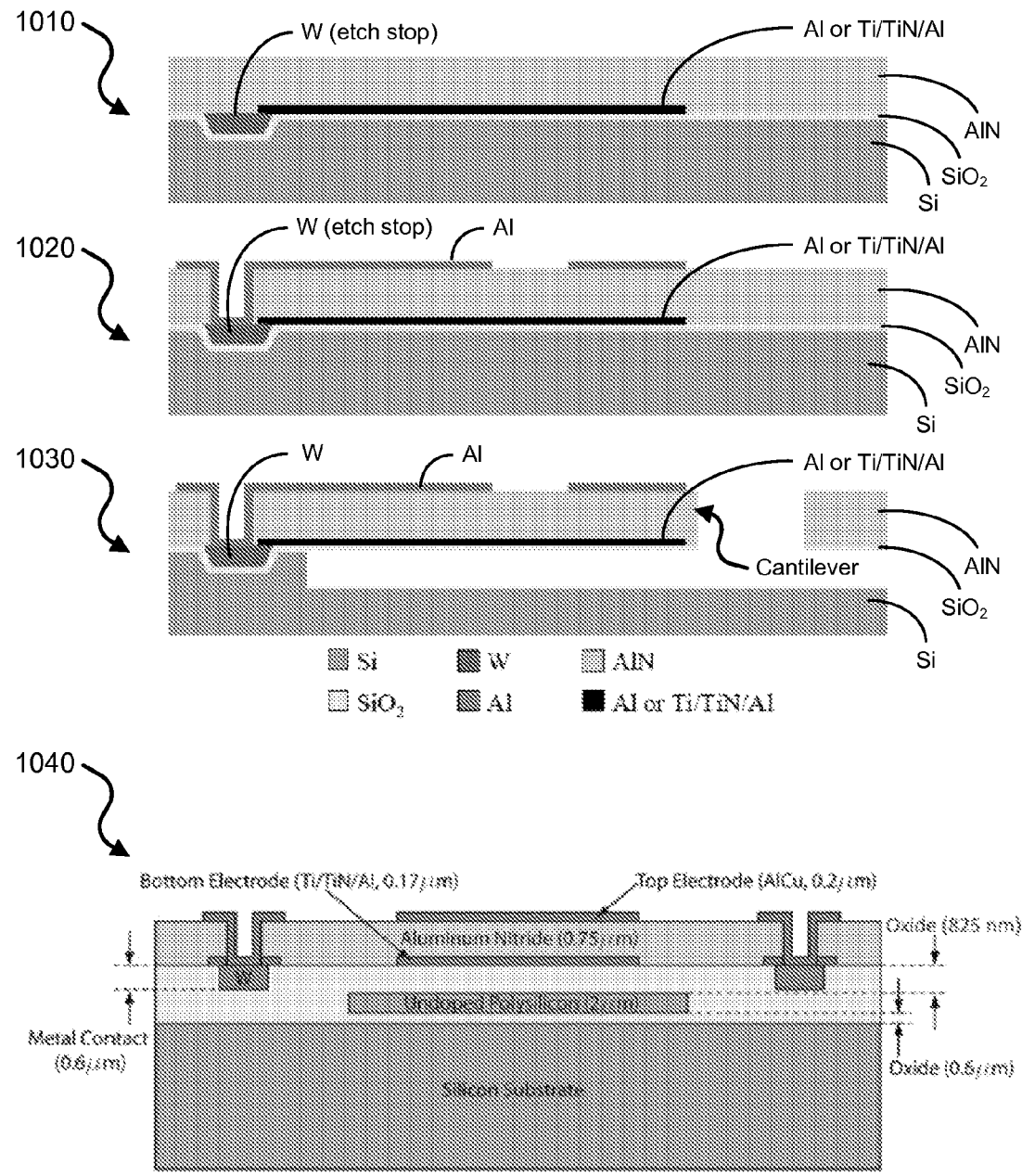
FIG. 10 shows a process diagram of an exemplary fabrication technique to produce wireless in-chip communication devices of the disclosed technology.

FIG. 10 shows a process diagram of an exemplary fabrication technique to produce wireless in-chip communication devices of the disclosed technology including piezoelectric transducer elements formed on a cantilever beam or any other structure to act as a resonator. For example, this resonator characteristic can provide frequency selectivity during both transmission and detection as the ultrasonic transducer can generate (launch) or receive acoustic waves from its anchor, allowing resonant sensing and actuation. The exemplary fabrication technique can include a process 1010 to form the initial layers of materials of the piezoelectric resonator transducer. In the example shown in the process 1010, AlN is formed over a silicon oxide layer over a silicon substrate, in which a Al or Ti/TiN/Al layer is formed between the silicon oxide and AlN layers, and in which tungsten is formed in a cavity of the silicon substrate and/or silicon oxide layers to form an etch stop. The fabrication technique can include a process 1020 to etch into the layers of the materials and deposit an Al layer. In the example shown in the process 1020, a well is etched into the AlN layer above the W etch stop and an Al layer is subsequently patterned over the portions of the AlN layer including the etched well above the W etch stop. The fabrication technique can include a process 1030 to form the cantilever structure. The process 1030 includes etching away a sacrificial layer to have cavities or unconstrained boundaries around the acoustic transducer element. For example, one advantage of resonant sensing is that it can perform better to detect low amplitude acoustic signals on the receiver side. In the example shown in the process 1030, a portion of the AlN, silicon oxide, and silicon substrate are etched to isolate a cantilever structure underneath a portion of the silicon oxide layer and Al or Ti/TiN/Al layer below the AlN layer covered by the Al layer. The materials and process steps shown in FIG. 10 are examples, and other material and/or structural designs can be implemented to fabricate the exemplary piezoelectric resonator transducer structures for the disclosed wireless in-chip communication devices. FIG. 10 includes a diagram 1040 showing a cross-sectional view of an exemplary piezoelectric resonator transducer including an undoped polysilicon layer within the silicon oxide layer.

In some aspects, the disclosed technology includes devices and techniques for direct CMOS integration with the disclosed ultrasonic transducers, e.g., including the piezoelectric transducer elements configured in a layer adjacent to a layer of CMOS transmit and receive electronics on the same wafer. For example, such integration reduces load capacitance and inductance by minimizing interconnect and routing area and by eliminating wire bonds. The reduction of the load capacitance presented by the interconnects between the electronics and the piezoelectric transducer elements can lower transmit amplitudes such that higher receive amplitudes can be obtained. Also, a reduction in area allows more transducers and electronics to be integrated in the IC device. Furthermore, parasitic capacitances and inductances from the interconnects and routing between control circuits and transducer elements can be kept to minimum in the disclosed IC designs, such that their effect on the frequency response of the transmit and receive circuitry is negligible. Also for example, in some implementations, the transmit and receive electronics corresponding to a sonar pixel can be configured directly beneath the transducer element such that the problem of signal crosstalk between wiring carrying signals from different pixels is minimized The disclosed technology can include a variety of circuits for controlling the phase or delay of pixel excitation waveforms. Described are two exemplary circuit topologies that can be implemented in the exemplary control electronics for controlling the phase or delay of the acoustic waveforms: delay generation through inverter based delay lines and the generation of phase shifts through quadrature mixing.

In one example, digital delay lines can be used to obtain the necessary delays. These exemplary delay lines can include one or more inverter delay elements, such as those shown in FIG. 11A, in series. For example, such delay elements are essentially inverters whose propagation delay is adjusted by varying the supply current, the load capacitance or the supply voltage. Thus the amount of time that each delay line can delay the input signal can be adjusted by varying one or more control voltages and by the number of delay elements that are in cascade. Instead of using just the output from the end of a delay line, tapped delay lines where the output after each delay element is accessible may be used for finer delay resolution.

Figure 11A:
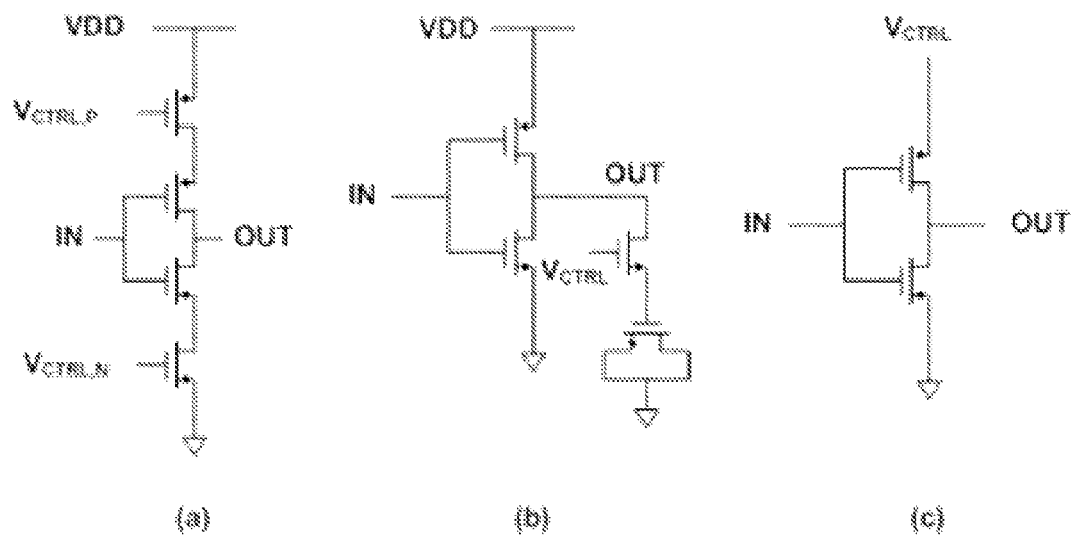
FIG. 11A shows diagrams of exemplary delay lines including one or more inverter delay elements.
Figure 11B:
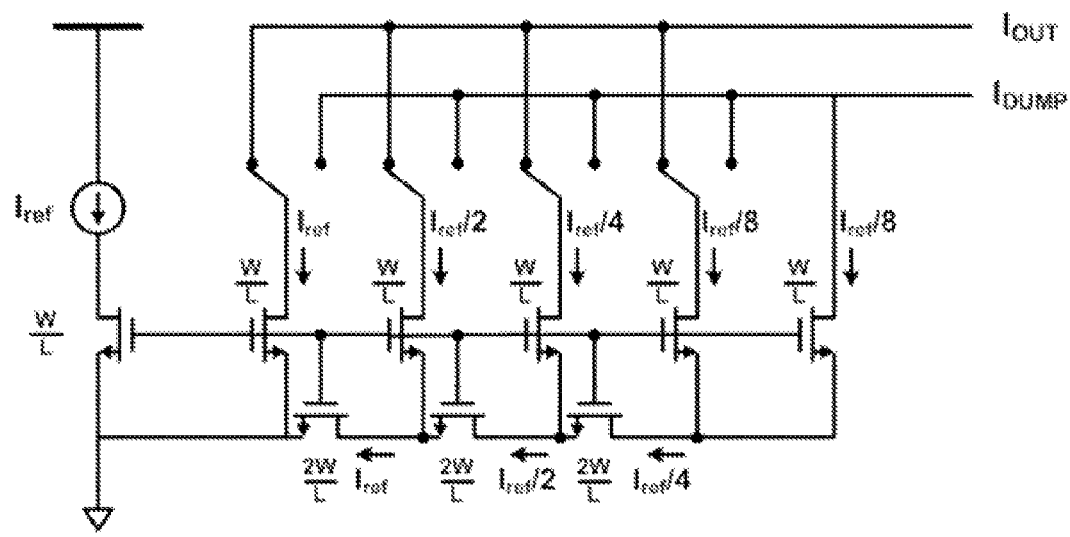
FIG. 11B shows a diagram of an exemplary 4-bit current splitting D/A converter.

For example, the delay control voltages or current sources, as in the case of the current starving topology in FIG. 11A(a), can be generated by storing digital values on-chip in digital memory such as SRAM and using a digital-to-analog (D/A) converter to obtain the analog voltages or currents. For example, per pixel, D/A converters are relatively large components that can affect the size of the electronic area consumed by the pixel. An example of one of the smallest D/A converter topologies includes current splitting or current steering D/A converters, which includes a current mirror comprising N+1 transistors of unit size W/L and N−1 transistors of 2W/L. N switches of at least 2 transistors each are used to set the D/A converter output current by switching between the output node or a dump node. FIG. 11B shows a diagram of an exemplary 4-bit current splitting D/A converter. For example, to reduce the size and/or power consumption requirements that having one or more D/A converters per pixel would impose, an appropriate analog memory topology can be used as described further below.

Figure 11C:
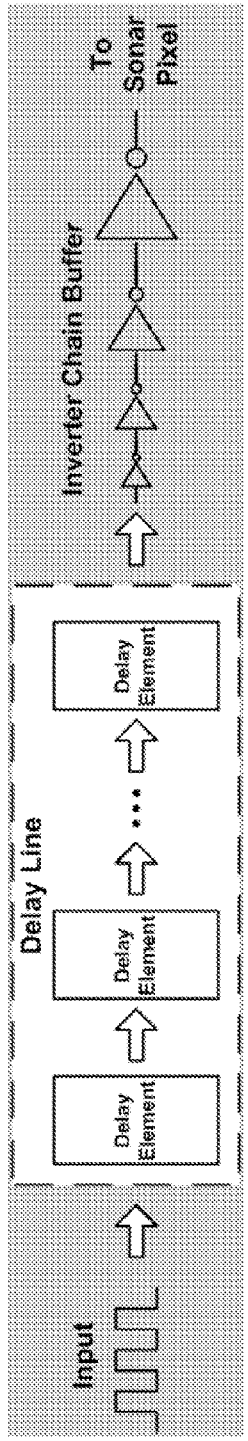
FIG. 11C shows a diagram of an exemplary delay line circuit followed by inverter chain buffer.

FIG. 11C shows a diagram of an exemplary delay line circuit followed by inverter chain buffer. For example, while minimum size inverters can be used for fine delay resolution and to minimize circuit area in each pixel, the output inverter used to drive the sonar should be large enough to drive the capacitive load that the piezoelectric elements present. For example, as large inverters also can present a large capacitive load at their inputs, instead of using a single inverter as the output buffer, an inverter chain with progressively increasing inverter sizing can be used to minimize the loading effect at the buffer input, as shown in FIG. 11C.

In another example, phase shifting a sinusoidal waveform can be implemented to generate the necessary delays. For example, the phase shifting is implemented through a quadrature mixing scheme, e.g., including two analog weights A and B that are multiplied with waveforms $\sin(\omega t)$ and $\cos(\omega t)$, respectively, and then added for an output waveform of $A \sin(\omega t)+B \cos(\omega t)$. For example, this is equivalent to an output of $C \sin(\omega t+\phi)$, where $C$ is $\sqrt{A^2+B^2}$ and $\phi$ is $\tan^{-1}(B/A)$. Constant amplitude phase shifting can be obtained by selecting the analog weights A and B to be $C \cos \phi$ and $C \sin \phi$, respectively, where C is the desired output amplitude and $\phi$ is the desired output phase.

Figure 11E:
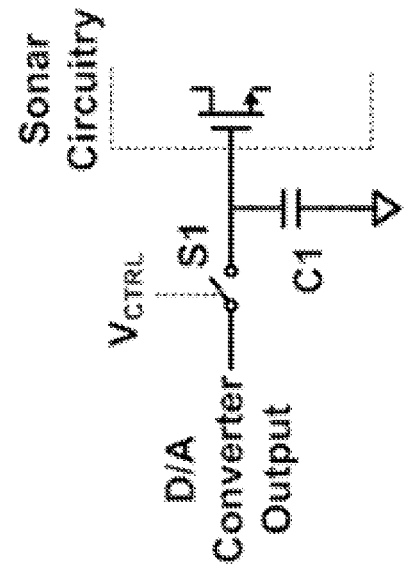
FIG. 11E shows a diagram of an exemplary unit cell of an analog memory.
Figure 11D:
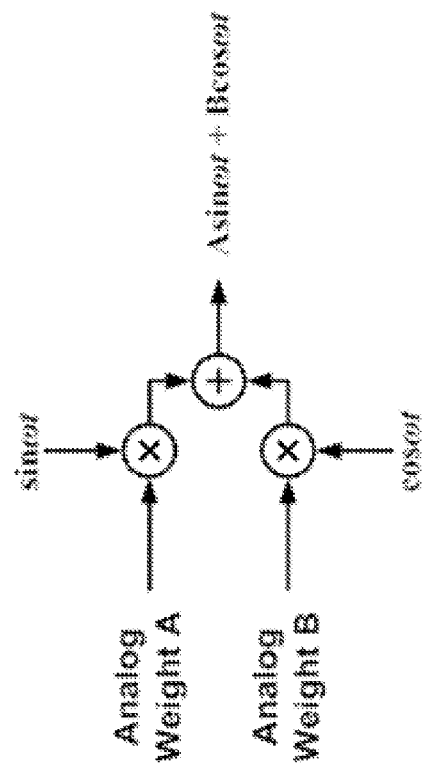
FIG. 11D shows a diagram of an exemplary quadrature mixing circuit for amplitude and phase shift control with two analog weights.

FIG. 11D shows a diagram of the exemplary sinusoidal phase shifting that can be implemented by a typical quadrature modulation circuit, and analog voltages that are applied to the mixer inputs. As in the exemplary inverter delay line topology, they can be generated by on-chip storage of digital weights that are subsequently converted to analog voltages through D/A converters. For example, the mixers can be implemented with generic Gilbert cell mixers with output nodes connected such that the summing occurs through current addition. For example, the sinusoidal voltages $\sin(\omega t)$ and $\cos(\omega t)$ can be generated by applying a signal with frequency $2\omega$ into a frequency divider circuit, which will output two signals at frequency w that are 90 degrees in phase apart. The output of this quadrature phase shifting circuit can be pulsed through the use of appropriately placed switch transistors.

For example, to implement a large number of sonar pixels, it is desired to keep the power and area consumed by the supporting electronics as low as possible. As an exemplary alternative to implementing multiple DACs per pixel, an analog memory for analog weight storage can be used instead. For example, each D/A converter can be replaced by a cell comprising of a single capacitor C1 and a switch S1 used to selectively write to the capacitor. FIG. 11E shows a diagram of an exemplary unit cell of an analog memory. For example, in some implementations of the disclosed devices, metal-insulator-metal (MIM) capacitors may occupy layers in the metal stack above the transistor layers and below the sonar transducer layer. For such implementations, for example, the use of such capacitors can effectively reduce the area required for pixel electronics, despite the relatively large size. In the exemplary unit cell of an analog memory, the capacitor stores the analog voltages required for the sonar circuitry, e.g., either the control voltages for delay lines or the analog weights for phase control. A single or a few global D/A converters can be used to generate these analog voltages for all of the pixels. For example, to set the analog weight on a pixel, the DAC is first set to the desired value and then the access switch for the appropriate capacitor is turned on. Once the capacitor charges to the desired voltage, the switch is turned off and the next capacitor can then be charged. Due to leakage effects, the capacitor voltage must be periodically refreshed. While a single transistor or a transmission gate can be used for the switch, various low leakage switch topologies can also be used.

Several modifications can be made to this exemplary analog memory architecture to increase leakage tolerance. For example, by switching to a differential input mixer topology and using two of the capacitor based analog memory cells instead of a single one, the voltage difference of the two cells is used as the input and thus the effect of leakage can be greatly reduced. Alternatively, active analog memories which employ some form of leak compensation can be used. For even longer term storage, instead of using a capacitor, non-volatile storage elements such as floating gate transistors can be used instead.

Figure 11F:
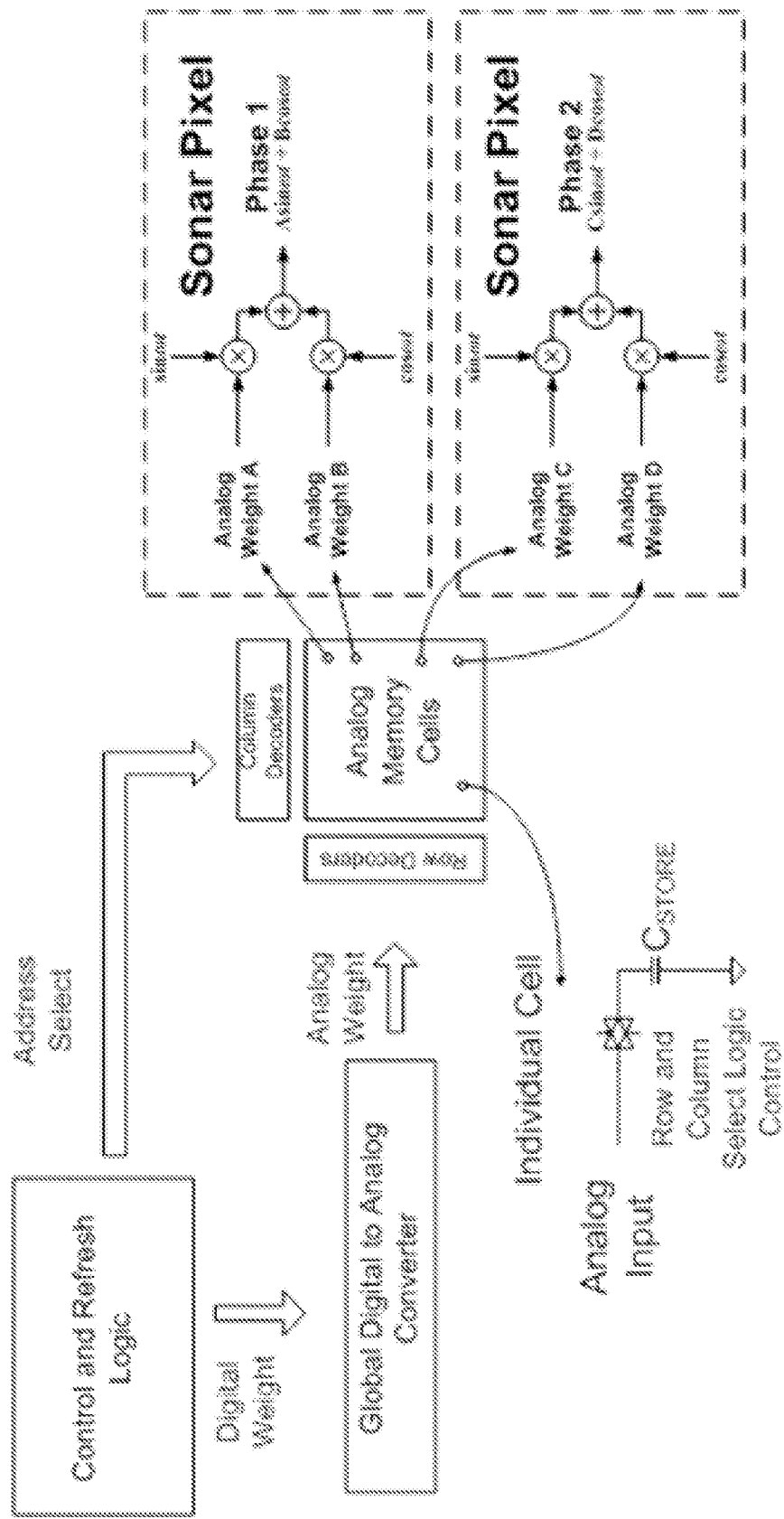
FIG. 11F shows a diagram of an exemplary analog memory for multiple phase generation.

FIG. 11F shows a diagram of an exemplary analog memory for multiple phase generation, which can be integrated into the electronics for each sonar pixel.

Other methods of delay generation derived from ultrasonic imaging systems may also be implemented. In some examples, the transmit path of an ultrasonic imaging system typically includes the transmit beamforming electronics followed by a high voltage pulser. Multilevel pulsers can be used to send signals of different output voltages, which can be used in beamforming. As sufficient receive amplitudes can be obtained while driving the sonar transducer at amplitudes below the nominal supply voltages for transistors on advanced process nodes, a high voltage driver is not necessary.

As the transmit beamformer for ultrasonic imaging applications is typically digital in nature, shift registers or timer/counter circuits may be used to implement the transmit delays. For example, for the case of a counter, instead of applying an input waveform and delaying it, a comparator can be used at the counter outputs to generate a trigger signal once the counter reaches a certain value. This exemplary trigger signal then activates a pulser circuit which outputs a single or multiple pulses at the desired voltage, pulse width, and frequency. For example, delay resolution can be improved by employing clock division with delay locked loop based circuits.

EXAMPLES

Acoustic In-Chip Communication Technology

The following examples are illustrative of several embodiments of the ultrasonic or acoustic in-chip communication technology. Other exemplary embodiments of the ultrasonic or acoustic in-chip communication technology may be presented prior to the following listed examples, or after the following listed examples.

In an example of the ultrasonic or acoustic in-chip communication technology (example 1), a semiconductor integrated circuit device having wireless ultrasonic communication links includes a semiconductor substrate; layers formed over the semiconductor substrate and patterned to form circuit elements including transistors; and an array of ultrasound transducers formed in the layers over the semiconductor substrate, each ultrasound transducer including ultrasound transducer elements which are operable to generate an ultrasound signal carrying information to communicate with one or more ultrasound transducers in the array and are operable to receive an incident ultrasound signal from one or more ultrasound transducers, the ultrasound transducers being communicatively coupled to respective individual circuit elements or blocks of two or more circuit elements of the circuit elements formed in the layers over the semiconductor substrate to act as communication nodes for the respective individual circuit elements or blocks of two or more circuit elements with other individual circuit elements or blocks of two or more circuit elements. Each ultrasound transducer in the array of ultrasound transducers is configured to control transmission or reception of the ultrasound transducers so that the ultrasound transducers in the array of ultrasound transducers are interconnected via ultrasound signals to form an ultrasound communication network of ultrasonic communication links, without hardwiring via metal contacts, between the circuit elements formed in the layers over the semiconductor substrate.

Example 2 includes the device as in example 1, in which the ultrasound transducers are formed in one layer of the layers over the semiconductor substrate.

Example 3 includes the device as in example 2, further including a reflector layer formed over the semiconductor substrate to provide a boundary to reflect an ultrasound signal from one ultrasound transducer to another ultrasound transducer.

Example 4 includes the device as in example 1, in which the ultrasound transducers are formed in two or more different layers over the semiconductor substrate as a three-dimensional array.

Example 5 includes the device as in example 4, further including an acoustic waveguide in at least one of the semiconductor substrate or the layers over the semiconductor substrate having the array of ultrasound transducers to effectuate transmission of the ultrasound signal from one ultrasound transducer to another ultrasound transducer.

Example 6 includes the device as in example 5, in which the acoustic waveguide provides frequency filtering to transmit only ultrasonic waves of certain frequency or mode while attenuating or obstructing the passage of undesired frequencies.

Example 7 includes the device as in example 1, in which the layers formed over the semiconductor substrate include (1) front-end-of-line (FEOL) layers that are formed and patterned to include the circuit elements including transistors, and (2) back-end-of-line (BEOL) layers over the FEOL layers to include wired interconnects between the ultrasound transducers and respective individual circuit elements or blocks of two or more circuit elements of the circuit elements formed in the layers.

Example 8 includes the device as in example 1, further including transducer driver circuits coupled to the array of ultrasound transducers, respectively, where each transducer driver circuit is configured to drive ultrasound transducer elements within a corresponding ultrasound transducer with different ultrasound transducer element control signals having respective control signal phase delays to collectively form a respective ultrasound signal and steer the respective ultrasound signal to a targeted ultrasound transducer, in which each transducer driver circuit is coupled between a corresponding ultrasound transducer and a corresponding individual circuit element or a corresponding block of two or more circuit elements.

Example 9 includes the device as in example 8, in which the layers formed over the semiconductor substrate include (1) front-end-of-line (FEOL) layers that are formed and patterned to include the circuit elements including transistors and the transducer driver circuits, and (2) back-end-of-line (BEOL) layers over the FEOL layers to include wired interconnects between the ultrasound transducers and respective individual circuit elements or blocks of two or more circuit elements of the circuit elements formed in the layers.

Example 10 includes the device as in example 8, in which each transducer driver circuit includes a phase generation circuit to control phase delays of different ultrasound transducer elements within each ultrasound transducer.

Example 11 includes the device as in example 1, further including physical acoustic structures in the layers formed over the semiconductor substrate to facilitate guiding of ultrasound signals from ultrasound transducers.

Example 12 includes the device as in example 11, in which the physical acoustic structures include metal reflectors for reflecting sound.

Example 13 includes the device as in example 1, in which the circuit elements formed in the layers include an field-programmable gate array (FPGA) having FPGA logic elements that are interconnected via ultrasonic communication links between the respective ultrasound transducers, in which the FPGA is programmable by adjusting the ultrasonic communication links between the respective ultrasound transducers.

Example 14 includes the device as in example 1, further including transducer driver circuits coupled to the array of ultrasound transducers, respectively, where each transducer driver circuit is configured to drive ultrasound transducer elements within a corresponding ultrasound transducer with different ultrasound transducer element control signals having respective control signal phase delays to collectively form a respective ultrasound signal and steer the respective ultrasound signal to a targeted ultrasound transducer, in which each transducer driver circuit is coupled between a corresponding ultrasound transducer and a corresponding individual circuit element or a corresponding block of two or more circuit elements, and in which the transducer driver circuits are configured to control or adjust ultrasonic communication links between the respective ultrasound transducers to effectuate various interconnects between the circuit elements for different circuit functions, thus providing a programmable circuit device.

Example 15 includes the device as in example 1, further including a monitor circuit coupled to the array of ultrasound transducers to read out output signals from the ultrasound transducers and to process an output signal from an ultrasound transceiver to extract a local condition that is reflected in a received ultrasound signal at the ultrasound transceiver, rendering the array of ultrasound transducers to function as an array of circuit sensors for monitoring the device operating conditions.

Example 16 includes the device as in example 15, in which the monitor circuit is configured to monitor a temperature at different locations within the device.

Example 17 includes the device as in example 15, in which the monitor circuit is configured to monitor conditions of physical contacts at different locations within the device.

Example 18 includes the device as in example 1, further including a circuit security verification circuit coupled to the array of ultrasound transducers to read out output signals from the ultrasound transducers and to process an output signal from an ultrasound transceiver to extract a physical signature that is reflected in a received ultrasound signal at the ultrasound transceiver to provide an indication of whether a circuit layout of the device matches a predetermined circuit layout.

Example 19 includes the device as in example 1, in which the semiconductor substrate is formed of a substrate material that includes silicon; an ultrasound transducer element within each ultrasound transducer includes a piezoelectric material layer that includes aluminum nitride (AlN), and the layers formed over the semiconductor substrate and patterned to form circuit elements are complementary metal-oxide-semiconductor (CMOS) layers.

Example 20 includes the device as in example 1, in which an ultrasound transducer element within each ultrasound transducer includes a piezoelectric material layer that includes lead zirconate titanate.

In an example of the ultrasonic or acoustic in-chip communication technology (example 21), a semiconductor integrated circuit device includes a semiconductor substrate capable of propagating acoustic energy signals; and an array of acoustic signaling modules formed on the substrate and structured to include a sub-array of acoustic transducer elements capable of transmitting and receiving the acoustic energy signals, in which each acoustic transducer element is operable to generate an acoustic communications signal to propagate through the substrate based on an electronic control signal and to receive the acoustic communications signal an acoustic signaling module to communicate with one or more other acoustic signaling modules.

Example 22 includes the device as in example 21, further including a control circuit layer formed on the semiconductor substrate and under the array of acoustic signaling modules to receive an external electronic signal and produce the electronic control signal to one or more acoustic transducer elements.

Example 23 includes the device as in example 21, further including a reflector layer formed over the substrate to provide a boundary to reflect the acoustic energy signals.

Example 24 includes the device as in example 21, in which the acoustic communications signal is modulated by one or more of amplitude modulation, frequency modulation, or phase modulation.

Example 25 includes the device as in example 21, in which the acoustic communications signal includes one or more frequencies in a range of 0.1 to 10 GHz.

Example 26 includes the device as in example 21, in which the acoustic transducer elements include piezoelectric materials including at least one of aluminum nitride (AlN) or lead zirconate titanate (PZT) configured as thin films.

Example 27 includes the device as in example 21, in which the array of acoustic transducer element is arranged two dimensionally and spaced at a distance in a range of 45 to 4.5 µm.

Example 28 includes the device as in example 21, in which the semiconductor substrate includes silicon.

Example 29 includes the device as in example 21, further including an absorber layer coupled to one or more vertical sides of the semiconductor substrate to absorb the ultrasonic waveforms.

In an example of the ultrasonic or acoustic in-chip communication technology (example 30), a method for wireless communication between circuit elements in an integrated circuit (IC) device includes: transducing an electrical signal to an ultrasound signal at one or more ultrasound transducers, the ultrasound signal carrying information from the electrical signal that is provided by a first circuit element or group of two or more circuit elements; transmitting the ultrasound signal from the one or more ultrasound transducers to one or more other ultrasound transducers that receive the ultrasound signal; in which the transmitted ultrasound signal propagates in a semiconductor medium of the IC device; and transducing the received ultrasound signal at one or more other ultrasound transducers into a received electrical signal provided to a second circuit element or group of two or more circuit elements of the IC device, in which the information is transferred between the circuit elements using the ultrasound signal as a wireless interconnection.

Example 31 includes the method as in example 30, further including guiding the ultrasound signal using a reflector layer formed adjacent to the semiconductor medium to provide a boundary to reflect the ultrasound signal from one ultrasound transducer to another ultrasound transducer.

Example 32 includes the method as in example 30, further including guiding the ultrasound signal using a reflector layer formed adjacent to the semiconductor medium to provide a boundary to reflect the ultrasound signal from one ultrasound transducer to another ultrasound transducer.

Example 33 includes the method as in example 30, in which the ultrasound transducers and corresponding circuit elements and semiconductor medium are formed in two or more different layers as a three-dimensional stack of IC device layers.

Example 34 includes the method as in example 33, further including guiding the ultrasound signal using an acoustic waveguide in at least one of the semiconductor mediums of the two or more different layers to effectuate transmission of the ultrasound signal from one ultrasound transducer to another ultrasound transducer.

Example 35 includes the method as in example 33, in which the acoustic waveguide provides frequency filtering to transmit only ultrasonic waves of certain frequency or mode while attenuating or obstructing the passage of undesired frequencies.

Example 36 includes the method as in example 30, further including steering the transmitted ultrasound signal based on control parameters of the electrical signal having respective control signal phase delays to collectively form a respective ultrasound signal and steer the respective ultrasound signal to a targeted ultrasound transducer.

Example 37 includes the method as in example 30, further including transmitting ultrasound probe signal toward one or more target structures in the IC device; receiving a return ultrasound signal carrying information of the one or more target structures based on a change in the ultrasound probe signal affected by acoustic impedances of the one or more target structures; and processing the received return ultrasound signal to extract the information on a local condition of the one or more target structures for monitoring the IC device operating conditions.

Example 38 includes the method as in example 37, in which the local condition includes one or more of temperature, structural integrity, or structural identity of the one or more target structures.

These exemplary devices and methods can be implemented in specific ways that provide one or more of the following features. For example, the disclosed ultrasonic or acoustic in-chip communication technology integrates piezoelectric and electrostatic actuator arrays into 3D IC chips to form sonar arrays that transmit from one location in chip to another. In 3D integrated chips, this allows for tunable sonic communication links between any two points. For example, the sonars can also be used to transmit signals from one chip to another through the common substrate, while making use of the frequency-selective nature of acoustic transducers and waveguides to communicate to multiple receivers over different frequency bands at the same time, e.g., via frequency division multiplexing. Frequency division multiplexing can be implemented to carry different channels at different acoustic frequencies. For example, the integrated sonars can also be used to interrogate defects in chip interconnects over time to measure chip parameters and interfaces to determine reliability.

The disclosed ultrasonic or acoustic in-chip communication technology can provide ultrasonic communication links in integrated circuit devices that enables programmable interconnections between circuit elements of the devices, provides local sensing of structures and operating conditions of the devices for monitoring health of the device and for controlling distribution of processing within the integrated circuit device to prolong the device lifetime, and enhances the physical security of the integrated circuit device, e.g., by using ultrasonic transducers as imaging sensors to read physical patterns and determine acoustic signatures.

Delay Line Memory

In some aspects, the present technology includes piezoelectric and logic integrated delay line memory devices, systems, and techniques.

Delay line memory described here is a type of refreshable memory with a sequential access. Delay line memory stores data using a series of pulses that carry the data which are transmitted via acoustic waves (e.g., in an acoustic waveguide) with a relatively low speed of pulse motion, e.g., relative to electrical signals carried in conductor paths. This low velocity transmission causes the pulses to be transmitted (from a transmitter) and arrive at a receiver with a delay. The signal received at the receiver is then transmitted back to the transmitter using a different waveguide with a higher transmission velocity, e.g., such as velocities comparable to the speed of light in certain device implementations. Hence, a pulse train is sent back to be transmitted again just in time to form again at the front. If a pulse travels at a low speed $c_{slow}$ in the slow waveguide (e.g., the acoustic waveguide) and $c_{fast}$ in the fast waveguide (e.g., an electrical conductor path or waveguide), then the number of bits that can fit inside the slow waveguide is $c_{fast}/c_{slow}$. For example, if the slow medium carries sound or acoustic waves, with a typical sound wave velocity of 9000 m/s (e.g., for silicon), and the speed in the fast channel is speed of light $3 \times 10^8$ m/s, then in principle a number of 33,333 pulses can fit within the slow channel.

Delay line memories were employed in early computers, e.g., such as mercury delay line memories. For example, mercury delay line memories were used for the main 1000 word memory and intermediate storage and control registers in the UNIVAC I, one of the first computers, in 1951. Such delay line memories were large, and comprised of piezoelectric quartz transducers and a mercury delay line medium. With a 11.25 MHz carrier frequency, they could store up to 1000 bits per channel. In the 1960s, magnetostrictive delay line memories were commonly used in calculators. They used magnetostrictive nickel transducers to generate torsional waves in an aluminum wire delay line medium, and were cable of bit rates of 1 MHz to 30 MHz. In 1970, 100 MHz digital delay line memories were developed at Bell Labs (e.g., Heiter, G., 100-MHz 1000-Bit Ultrasonic Digital Delay-Line Time-Compression Store). These memories used sodium potassium nitrate transducers, and are able to store 1000 bits for a 0.9 mm transducer in a 25.8 mm long glass delay line medium.

Other delay line memory have also been implemented, e.g., such as piezoelectric delay lines in quartz, and electrical delay lines. One of the key problems with these memory elements is the compatibility with the standard CMOS process, and also the density of memory cannot reach a high enough value above what is possible with standard SRAM, DRAM, and FLASH memory. More recently, magnetic racetrack memory has been proposed to increase density, but requires new magnetic materials or suffers from other limitations that make it a viable option.

The disclosed technology includes high density delay line memory device architectures that use sonic pulses coding bits or analog values, which can be transmitted through a bulk substrate (e.g., a silicon wafer), e.g., of any selected material and/or thickness, and be relayed back to the origin. In one example, a delay line memory design of the present technology includes integrated piezoelectric actuators on a silicon die, in which the silicon die itself can carry acoustic pulses. The use of CMOS and thin film piezoelectric films in the exemplary architecture enables very high density and high frequency relaying while utilizing the bulk silicon volume for information carrying purposes, which is not currently used for such purposes.

In some embodiments, a delay line memory chip component includes a substrate, an array of electrical interconnects disposed in the substrate in through-via channels (TVCs) to carry electrical signals containing information from a first side of the substrate to a second side of the substrate, a first and a second array of piezoelectric transducers (e.g., which can include piezoelectric thin films) on the first and second sides of the substrate, respectively, and a first and a second array of electronic units (e.g., which can include CMOS electronics) on the first and second sides of the substrate, respectively, in which each of the electronic units of the first and second array are positioned at an interface with a corresponding electrical interconnect. The electronic units are operable to amplify and/or synchronize the electrical signals into a bit stream to be transmitted as acoustic pulses. For example, an electronic unit of the delay line memory can include one or more transmit amplifiers, driving circuits, and/or digital logic circuits. The piezoelectric transducers of the first array are in communication with the corresponding electronic unit of the first array on the first side of the substrate, and the piezoelectric transducers of the second array are in communication with the corresponding electronic unit of the second array on the second side of the substrate. The second array of piezoelectric transducers are operable to transduce the bit stream of electrical signals received from the second array of corresponding electronic units to the acoustic pulses and to transmit the acoustic pulses through the bulk of the substrate, and the first array of piezoelectric transducers are operable to transduce the acoustic pulses received from the bulk of the substrate to transduced electric signals. In some implementations, for example, a single electronic array combining the functions of the first and second electronic arrays may be used, and located on either the first or second side of the substrate, and connected to the transducers with an appropriate electrical interconnect, e.g. with a through-wafer via (TWV) to the transducer on the opposite side of the substrate.

Figure 12A:
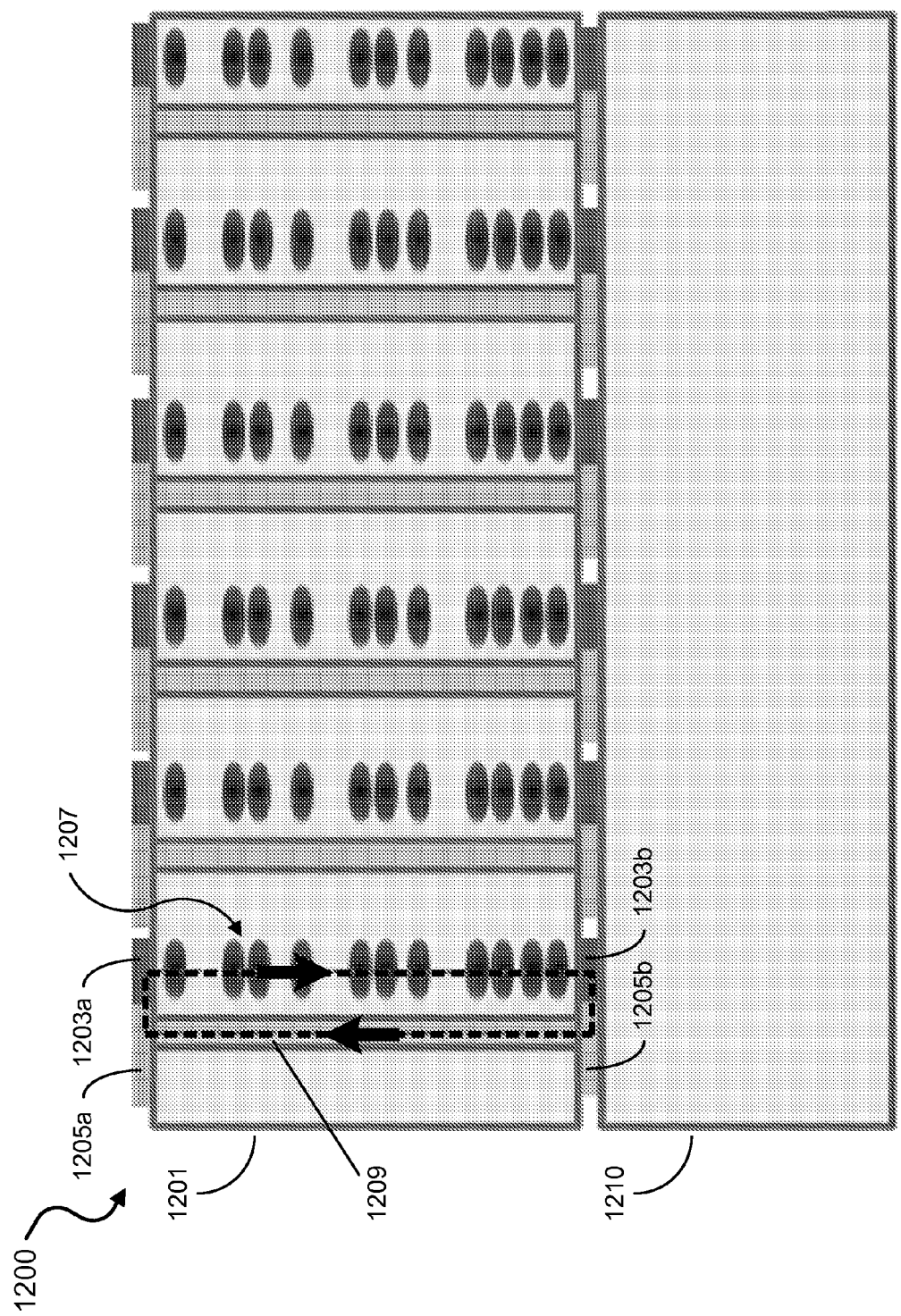
FIG. 12A shows an illustrative diagram of an exemplary delay line memory chip device of the disclosed technology.

FIG. 12A shows a diagram depicting an exemplary or illustrative architecture of a delay line memory chip device 1200 of the disclosed technology with electrical back transmission. The delay line memory chip device 1200 includes a substrate 1201 to propagate an acoustic signal. The acoustic signal propagates through the bulk of the substrate 1201 at a velocity based on the material properties associated with the substrate 1201. For example, the device 1200 can include silicon as a material used for the substrate 1201, which can propagate the acoustic signal at 9000 m/s. In some implementations, the substrate 1201 can be a silicon wafer.

The delay line memory device 1200 includes an array of electronic units 1205 and an array of piezoelectric transducer units 1203 on opposing sides of the substrate 1201. On one side of the substrate 1201, transmit piezoelectric transducer elements 1203a are arranged on the substrate 1201 in communication with transmit electronic units 1205a. The transmit piezoelectric transducer elements 1203a are configured to transduce pulse signals carrying information, e.g., electrical pulses or RF pulses, that are received from corresponding transmit electronic units 1205a into acoustic pulse signals which are launched into the bulk of the substrate 1201. The acoustic pulse signals that propagate through the bulk substrate 1201 represent data bits 1207 that carry the information to be stored in the delay line memory chip device 1200. The transmit electronics units 1205a are configured to generate, amplify, and/or synchronize the pulse signals that carry information to create a bit stream of the data 1207 to be stored in the delay line memory chip device 1200.

On the opposing side of the substrate 1201, receive piezoelectric transducer elements 1203b are arranged on the substrate 1201 in communication with receive electronic units 1205b. The acoustic pulses that are launched from the transmit piezoelectric transducer elements 1203a travel through the bulk of the substrate 1201 and are received at the opposing side of the substrate 1201 by the receive piezoelectric transducer elements 1203b. The receive piezoelectric transducer elements 1203b convert the received acoustic pulse signals into another signal form, e.g., such as an electrical signal. Receive electronics units 1205b are configured in communication with the receive piezoelectric transducer elements 1203b to obtain the transduced signals (e.g., electrical signals), which may be amplified by the receive electronic elements 1205b, and to transmit the transduced signals back to the transmit electronic elements 1205a at a substantially faster rate, e.g., nearly the speed of light. In some implementations, the transduced electrical signals are sent from the receive electronic elements 1205b to the transmit electronic elements 1205a using interconnects or through-via channels (TSVs) 1209. The returned transduced signals, e.g., through the TSVs 1209, are used to refresh the memory of the device 1200.

In some implementations of the delay line memory device 1200, for example, the electronic units 1205 can include CMOS based electronics devices to receive and/or produce the data that is to be stored. For example, the piezoelectric transducer elements 1203 can include piezoelectric thin film transducers, e.g., including aluminum nitride (AlN), which is a CMOS-compatible piezoelectric material. Similarly, the piezoelectric transducer elements 1203 can include other piezoelectric thin film materials, e.g., including ZnO, PVDF, or other suitable material.

In some implementations, for example, the delay line memory chip device 1200 is in communication with other electrical or integrated circuit (IC) devices 1210, e.g., such as processors (e.g., including ASIC or FPGA processors), sensors, signal conditioning circuits, signal security coding chips, and secure memory, etc. In an illustrative example, the device 1210 can include a CMOS chip that interfaces with the delay line memory device 1200 via connections formed at the transmit electronic units 1205a or the receive electronic units 1205b. The interfaced CMOS device 1210 and the delay line memory device 1200 can be fabricated as a single chip that provides "on-chip" memory for the designed CMOS device.

In the example shown in FIG. 12A, the CMOS device 1210 is interfaced to the delay line memory device 1200 at the receive electronic units 1205b, which transmits the data from the CMOS device 1210 (e.g., electrical signals representing digital data) to the transmit electronic units 1205a via the TSVs 1209 to be stored through the acoustic signals as the data bits 1207 in the memory device 1200. Similarly, the CMOS device 1210 can be interfaced to the delay line memory device 1200 at the transmit electronic units 1205a to store data provided by the CMOS device 1210 through the acoustic signals as the data bits 1207 in the memory device 1200.

Figure 12B:
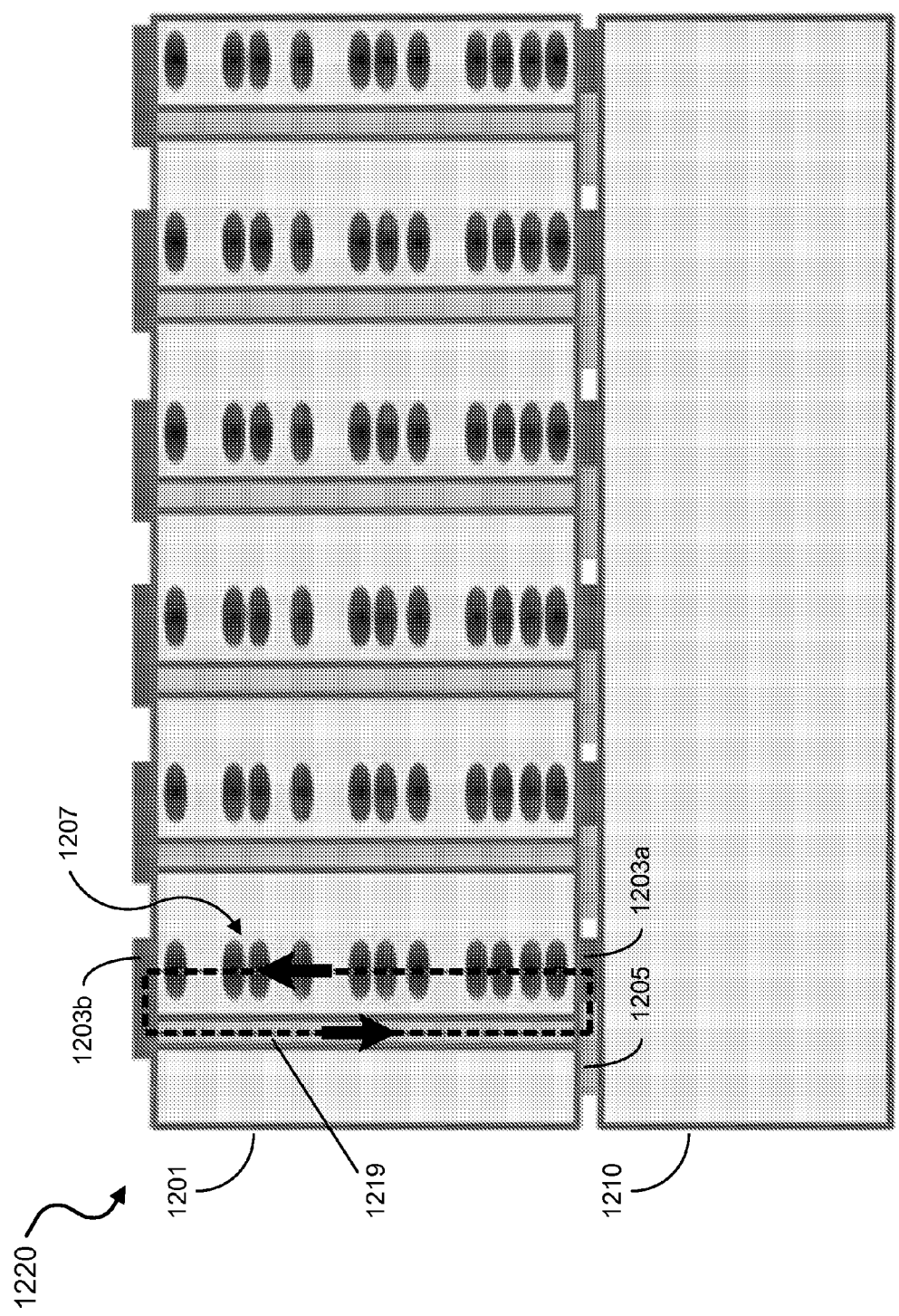
FIG. 12B shows an illustrative diagram of an exemplary delay line memory chip device of the disclosed technology.

FIG. 12B shows a diagram depicting another exemplary embodiment of a delay line memory chip device 1220 of the disclosed technology with electrical back transmission. The delay line memory chip device 1220 includes a single electronic array of electronic units 1205, e.g., which can perform the necessary or combined functions of the transmit and receive electronic units 1205a and 1205b. The electronic unit 1205 can be disposed on either side of the substrate 1201, and is in communication with the piezoelectric transducers 1203a and 1203b. As shown in the example of FIG. 12B, the electronic units 1205 are disposed on the side of the substrate including the transmit piezoelectric transducers 1203, and interfaced with the CMOS device 1210, such that the electronic units 1205 can receive, amplify, and/or synchronize the data signals containing the data to be stored by the delay line memory device 1220 as the acoustic signals (e.g., data bits 1207) propagated through the bulk of the substrate 1201. The electronic units 1205 are in communication with the receive piezoelectric transducers 1203b by an appropriate electrical interconnect, e.g. such as a through-wafer via (TWV) 1219, on the opposite side of the substrate.

The architecture of the disclosed delay line memory chip devices allows for very high density memory. For example, if one were to use 10 GHz bit generation, in silicon this would lead to a wavelength of 0.9 microns (9000 m/s/10 GHz=$\lambda$2=c/f). Assuming that to distinguish a pulse at least two wavelengths is needed, for example, and assuming a wafer thickness of 1-mm, one can have ~2000 pulses per channel. Assuming, for example, information can also be coded in the amplitude and phase with another 8-bit resolution of 256 values, a total of ~500,000 bits of data per channel can be fit. The lateral dimensions of the channel would be approximately 4×4 wavelengths or ~3.6×3.6 μm. This area would also need to integrate the transistors necessary to process the data coming from the bit stream. Assuming a 1 cm×1 cm chip, for example, this would translate to ~8 million channels. Assuming each channel is carrying 8-million channels has the maximum capability of 0.5 Mbits, for example, ~3.85 TBits of storage capacity per $cm^2$ can be achieved. This is a high energy density, and higher than what is possible with most other solid-state memory elements.

In another embodiment, a delay line memory chip device of the disclosed technology includes a substrate (e.g., which can include a semiconducting material), and a first array and second array of acoustic communication units on a first side and a second side of the substrate, respectively, in which the acoustic communication units include an electronics unit (e.g., CMOS electronics unit) in communication with a first piezoelectric transducer and a second piezoelectric transducer (e.g., which can include piezoelectric thin film). The electronics units are configured to generate, amplify and/or synchronize electrical signals that represent data carrying information as a data bit stream. The first piezoelectric transducers are configured to transduce the electrical signals received from the electronics unit to acoustic pulses and transmits the acoustic pulses through the bulk of the substrate. The second piezoelectric transducers are configured to receive the transmitted acoustic pulses from the first piezoelectric transducers and transduce the received acoustic pulses to an electronic signal for the electronic unit.

Figure 13:
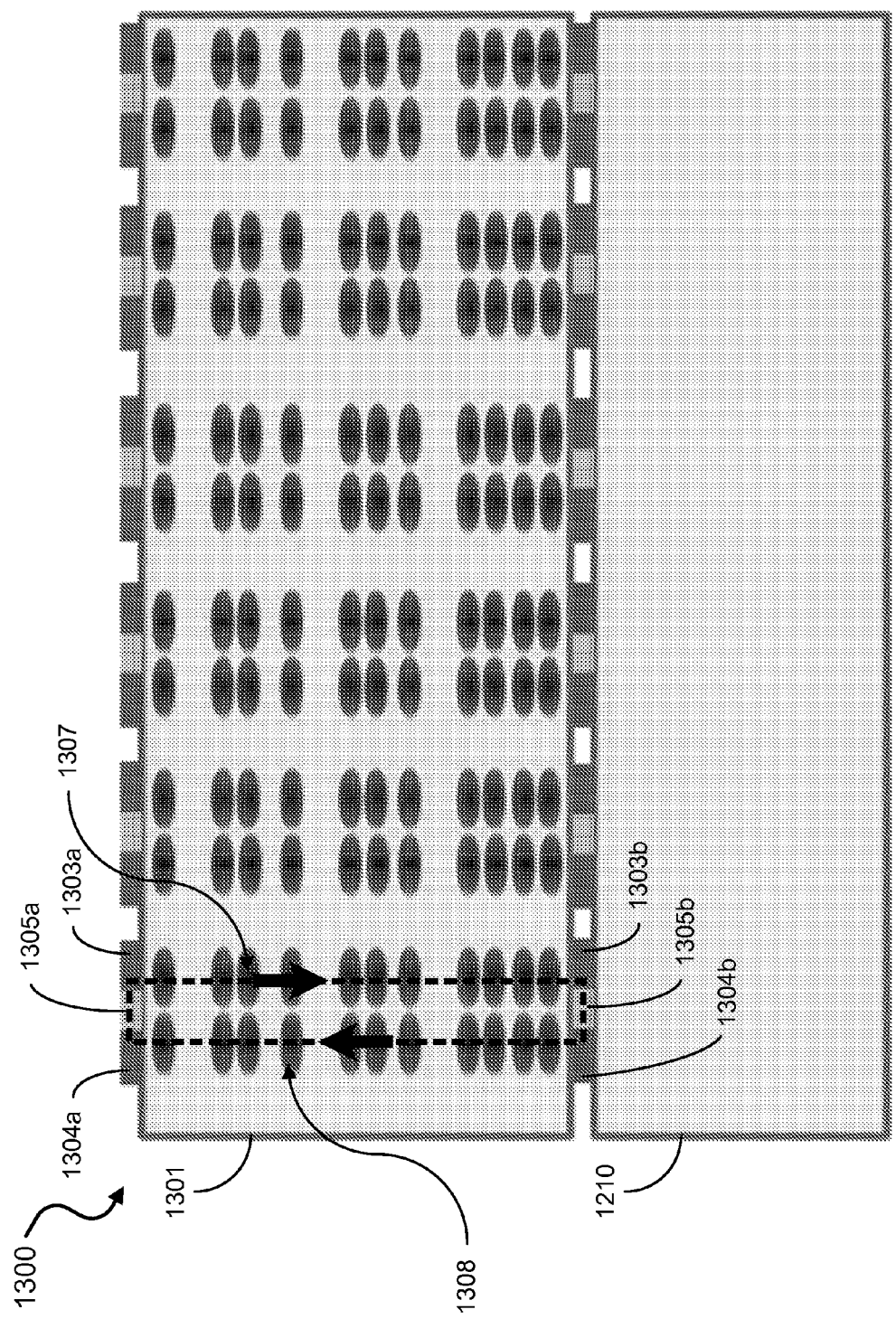
FIG. 13 shows an illustrative diagram of another exemplary delay line memory chip of the disclosed technology with racetrack sonic bits/bytes.

FIG. 13 shows a diagram of another exemplary delay line memory chip device 1300 with racetrack sonic bits/bytes. The exemplary design in FIG. 13 shows an alternative can be the transmittance of another sonic pulse from the bottom transducers to realize a sonic pulse racetrack. The delay line memory chip device 1300 includes a substrate 1301 to propagate acoustic signals between opposing sides of the substrate 1301. In some implementations, for example, the device 1300 can include silicon as a material used for the substrate 1301, e.g., such as a silicon wafer.

The delay line memory device 1300 includes an array of acoustic communication units disposed along on the opposing sides of the substrate 1301. In the example shown in FIG. 13, opposing sides are designated "a" and "b" with respect to the components of the acoustic communication unit. An acoustic communication unit includes an electronics unit 1305 in communication with a piezoelectric transducer 1303 and a piezoelectric transducer 1304. On one side of the substrate 1301, the piezoelectric transducer 1303a is configured to transduce signals carrying information, e.g., electrical pulses or RF pulses, that are received from the electronic unit 1305a into acoustic pulse signals which are launched into the bulk of the substrate 1301. The acoustic pulse signals that propagate through the bulk substrate 1301 represent data bits 1307 that carry the information to be stored in the delay line memory chip device 1300. For example, the electronics units 1305a are configured to generate, amplify, and/or synchronize the pulse signals that carry information to create a bit stream of the data 1307 to be stored in the delay line memory chip device 1300.

In some implementations of the delay line memory chip device 1300, for example, the electronic units 1305 can include CMOS based devices to receive and/or produce the data that is to be stored. Also, for example, the piezoelectric transducer elements 1303 and 1304 can include piezoelectric thin films can include aluminum nitride (AlN), or other piezoelectric thin film materials, e.g., including ZnO, PVDF, or other suitable material.

On the opposing side of the substrate 1301, the piezoelectric transducer 1303b is configured to receive the acoustic pulses launched from the transmit piezoelectric transducer 1303a that travel through the bulk of the substrate 1301 and to convert the received acoustic pulse signals into another signal form, e.g., such as an electrical signal. The electronics unit 1305b are configured in communication with the piezoelectric transducer 1303b to obtain the transduced signals (e.g., electrical signals), to amplify the transduced signals, and to pass the transduced and amplified signals to a piezoelectric transducer 1304b. The piezoelectric transducer 1304b is configured to convert the amplified signals from the electronics units 1305b to acoustic signals 1308 that are transmitted through the bulk of the substrate 1301 to be received by the piezoelectric transducer 1304a on the first side of the substrate 1301. The substrate can be engineered by DRIE etching to form well defined channels for energy to be channeled across the wafer. The piezoelectric transducer 1304a is configured to transduce the received acoustic signals to signals that are processed by the electronics unit 1305a to refresh or update the data carrying the information to be stored in the delay line memory 1300.

In some implementations, for example, the delay line memory chip device 1300 is in communication with other electrical or integrated circuit (IC) devices, as shown by the exemplary CMOS device 1210, e.g., which can include processors (e.g., including ASIC or FPGA processors), sensors, signal conditioning circuits, signal security coding chips, and secure memory etc. In some cases the memory stored in traditional memory in SRAM can be tapped by cooling the chip to cryogenic temperatures, and then reading the remnant charge in the transistors. In the case of acoustic memory, the acoustic field will decay and the memory is likely to be safer. Referring to the example shown in FIG. 13, the CMOS device 1210 interfaces with the delay line memory device 1300 via connections formed at the electronic units 1305. The interfaced CMOS device 1210 and the delay line memory device 1300 can be fabricated as a single chip that provides "on-chip" memory for the designed CMOS device. In the example shown in FIG. 13, the CMOS device 1210 is interfaced to the delay line memory device 1300 at the electronic unit 1305b, which transmits the data from the CMOS device 1210 to the electronics unit 1305a on the opposing side via the piezoelectric transducers 1304b to 1304a, respectively to be stored through the acoustic signals as the data bits 1307 in the memory device 1300.

Figure 14:
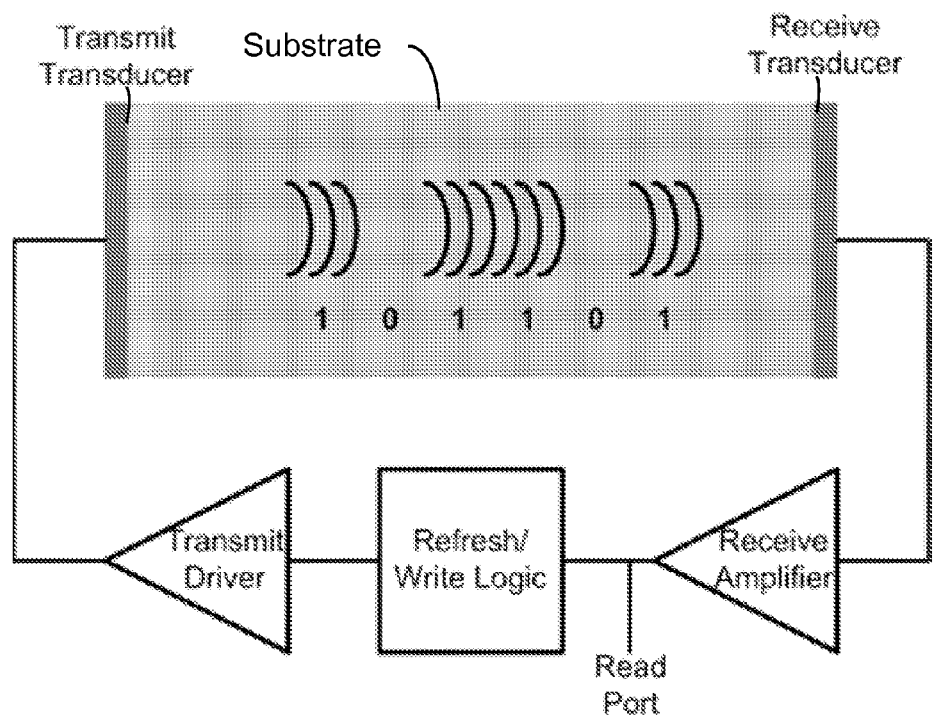
FIG. 14 shows an illustrative block diagram depicting a basic operation of an acoustic delay line memory of the disclosed technology.

FIG. 14 shows an illustrative block diagram depicting a basic operation of an acoustic delay line memory of the disclosed technology. As shown in the block diagram, the exemplary delay line memory device includes a substrate including piezoelectric transducers at opposite ends of the substrate to transmit and receive an acoustic signal (e.g., an ultrasonic through-silicon (UTSV) via structure) for use as the acoustic delay line, and a refresh circuit in communication with the piezoelectric transducers to utilize the UTSV as a delay line memory. For example, the UTSV can include a silicon substrate with aluminum nitride thin films as the piezoelectric transducers situated on both ends of the substrate. In implementations, when excited with a digital or radio frequency (RF) pulse, the transmit transducer generates an acoustic pulse which then propagates through the silicon bulk until it reaches the receive transducer, upon which it converts back to an electrical signal which can be used to refresh the memory. As illustrated in the diagram of FIG. 14, memory is stored in the delay line as acoustic waves, in which the presence of an acoustic wave is equal to a logic 1 being stored in that location and the absence of an acoustic wave represents a logic 0. The number of bits can be adjusted by adjusting the thickness of the silicon and the width and frequency of the acoustic pulses that comprise each bit.

Figure 15:
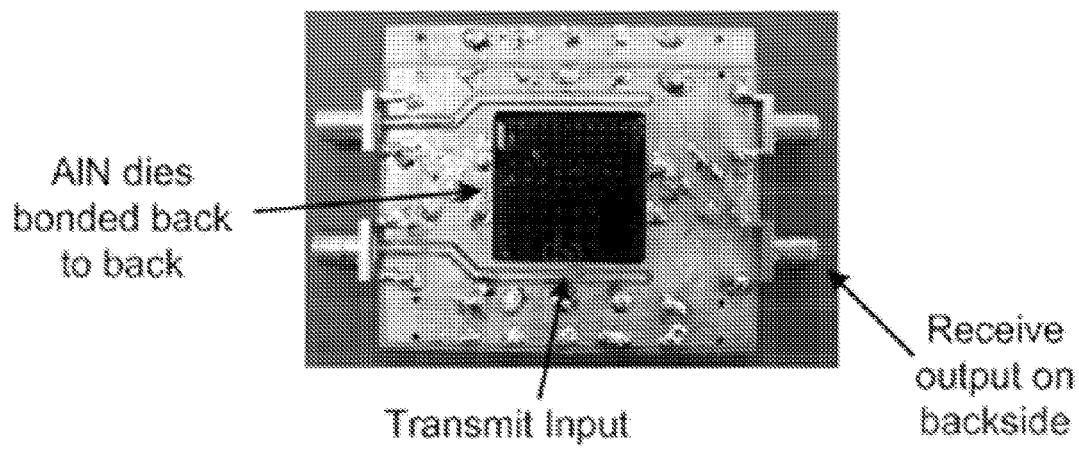
FIG. 15 shows an image of an exemplary delay line memory proof-of-concept device mounted and wire-bonded to a printed circuit board (PCB).

Exemplary implementations of the disclosed delay line memory technology are demonstrated and described below. FIG. 15 shows an image of an exemplary delay line memory proof-of-concept device mounted and wire-bonded to a printed circuit board (PCB). The example delay line memory device includes two silicon die, each with thin film aluminum nitride transducers. For example, the use of aluminum nitride as the transducer material allows for ease of CMOS circuit integration, due to the compatibility of the material with a standard CMOS fabrication process, as well as allowing for smaller transducers to be fabricated as compared to bulk piezoelectric ceramics, which thus provides for large area efficient, high density memory devices. These exemplary features of the disclosed technology allow for much more smaller delay line memories to be developed than was previously possible.

Figure 16:
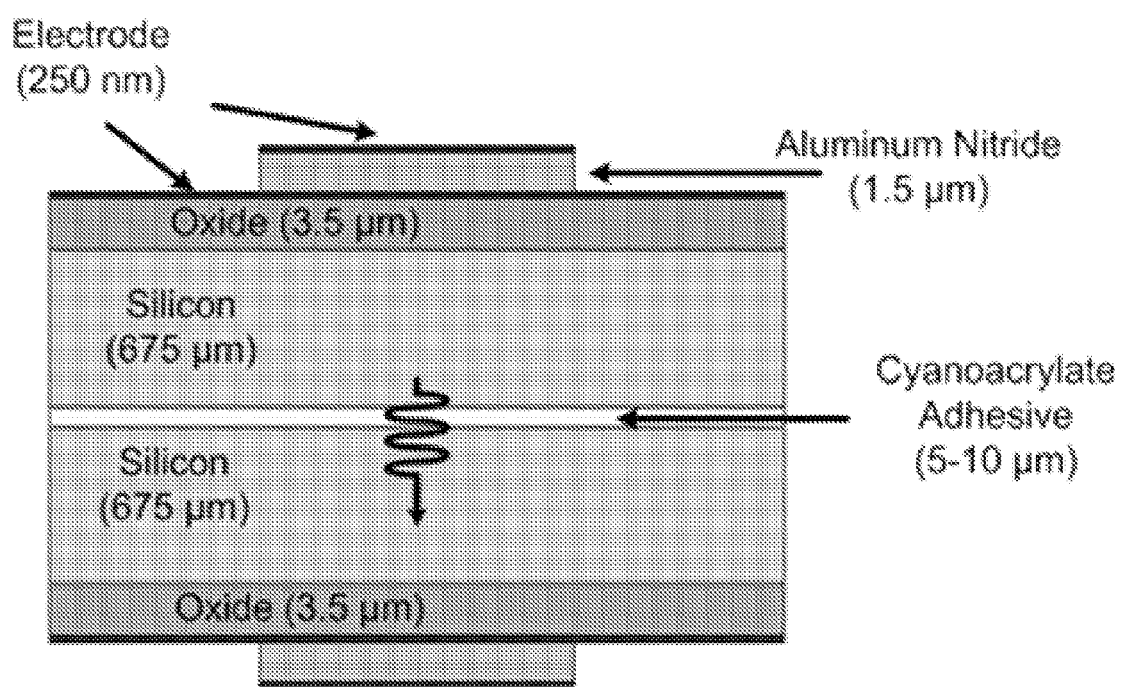
FIG. 16 shows an illustrative diagram of the exemplary delay line memory proof-of-concept device.

In the exemplary proof-of-concept device, the delay line memory was formed by attaching each aluminum nitride transducer—silicon die by bonding back-to-back with a cyanoacrylate adhesive, such that the transducers aligned on top of each other to form the ultrasonic through-silicon via structure (UTSV) as shown in FIG. 16. FIG. 16 shows an illustrative diagram of the exemplary delay line memory proof-of-concept device, along with the thickness of each material in the cross section.

Figure 17:
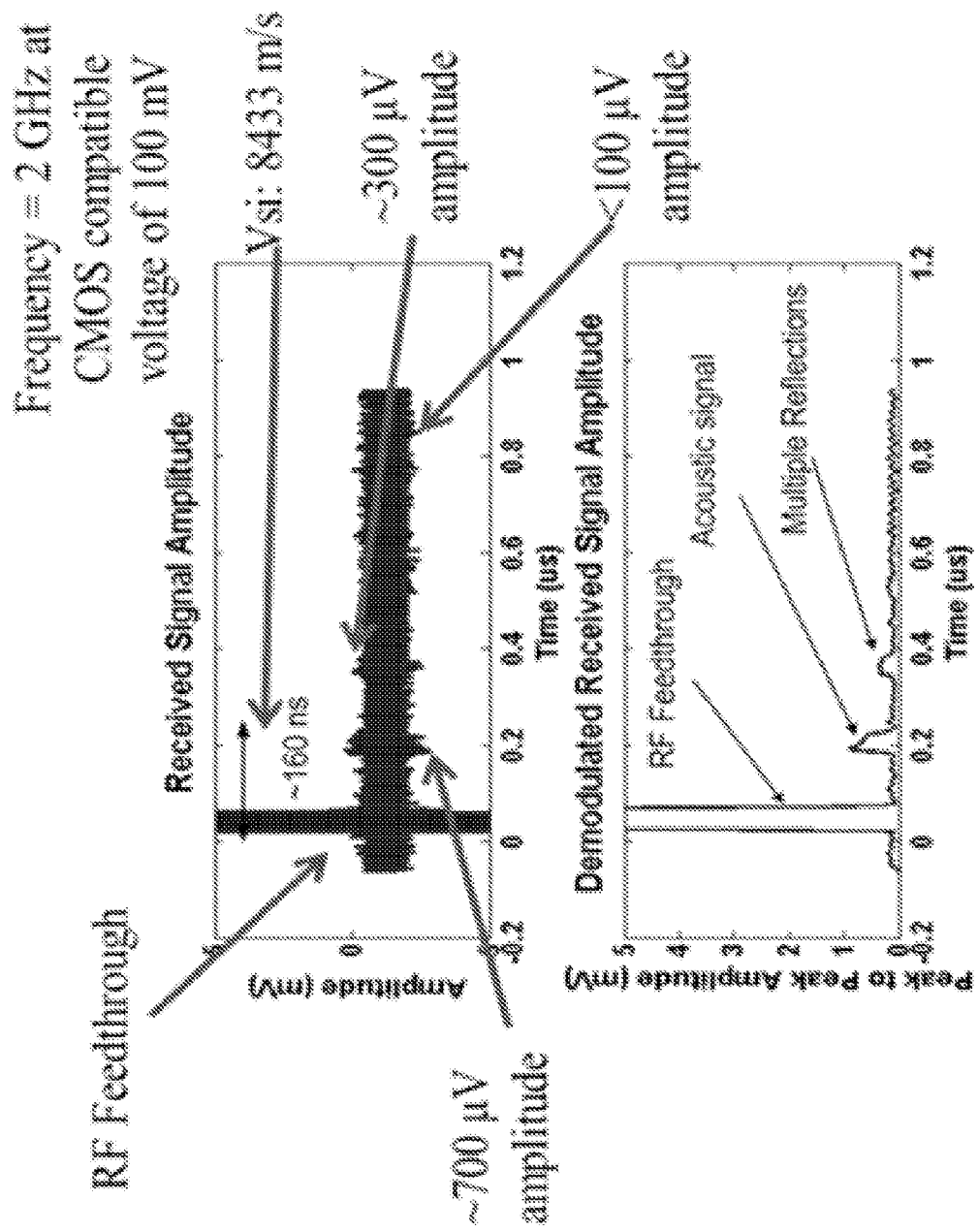
FIG. 17 shows a data plot showing a screen capture on a high frequency oscilloscope of a receive response of the exemplary delay line memory proof-of-concept device.

FIG. 17 shows a data plot showing a screen capture on a high frequency oscilloscope of an exemplary UTSV receive response when the exemplary delay line memory proof-of-concept device was actuated with a 2 GHz, 100 mVpp signal. In this exemplary implementation, a large RF feedthrough component is visible, e.g., due to the long wire bonds required to access the transducers. In addition, for example, large PCB parasitics and the 50 ohm termination required at the oscilloscope resulted in low signal levels. The main acoustic signal can be seen following the RF feedthrough component, delayed by the amount of time that is required for the acoustic signal to travel through the thickness of the silicon wafer.

Figure 18:
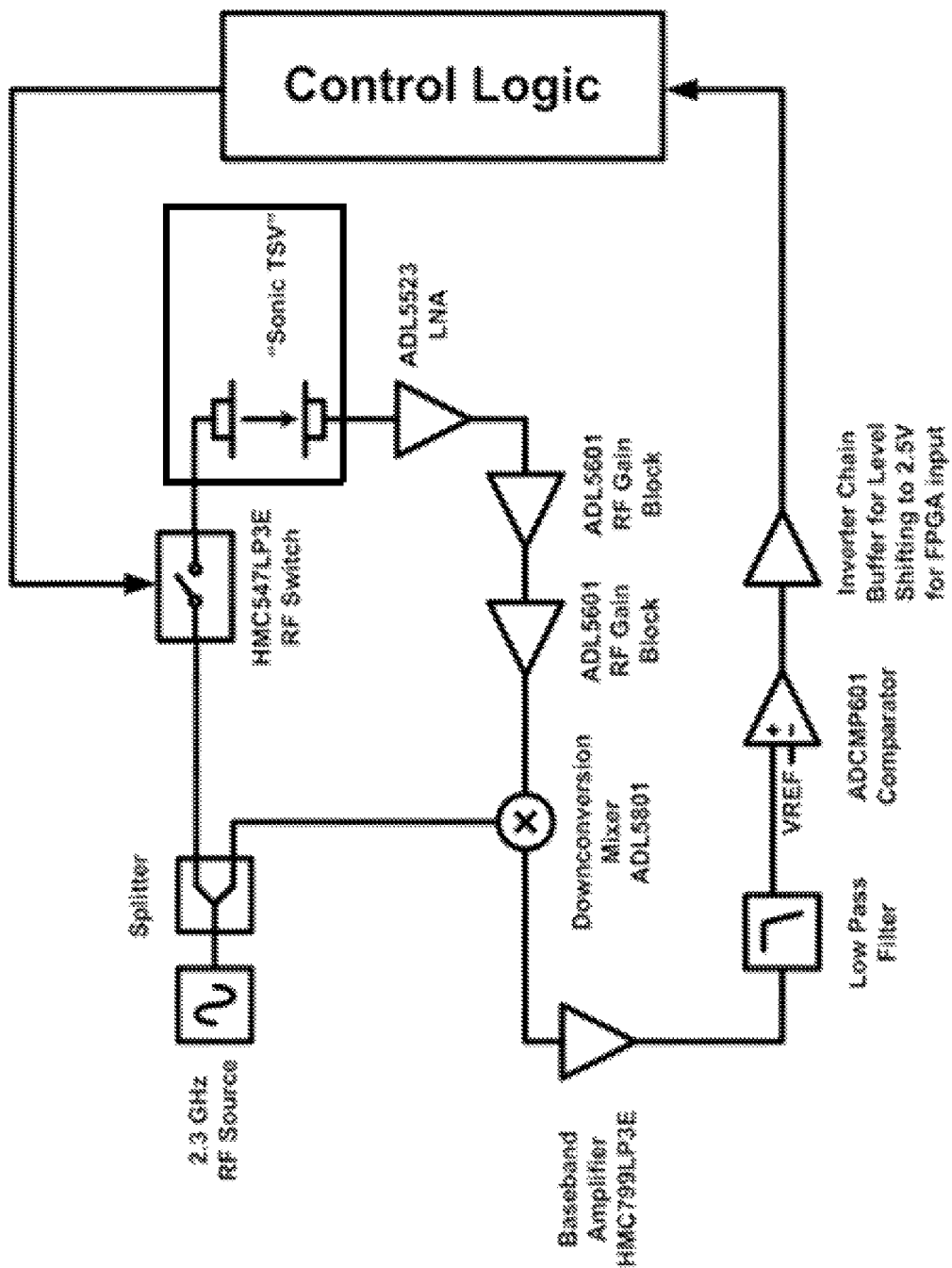
FIG. 18 shows a circuit block diagram of an exemplary circuit used in exemplary implementations of the exemplary delay line memory proof-of-concept device.
Figure 19:
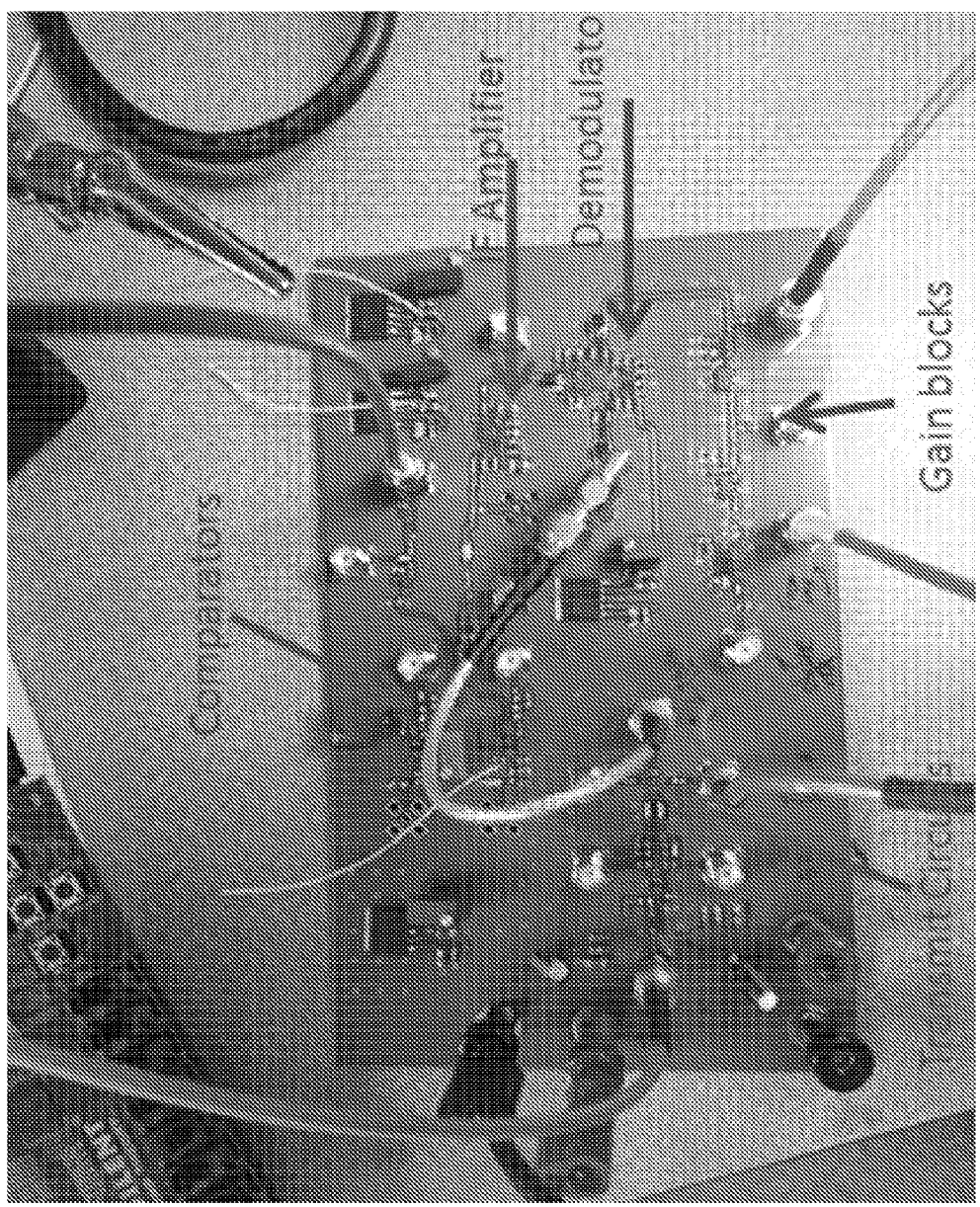
FIG. 19 shows an image of the exemplary printed circuit board implementation of the example circuit shown in FIG. 18.

In the exemplary implementations that used the exemplary UTSV as a delay line memory, an exemplary circuit was employed. FIG. 18 shows a circuit block diagram of the exemplary delay line memory circuit used in the exemplary implementations. FIG. 19 shows an image of the exemplary printed circuit board implementation of the example circuit shown in FIG. 18.

The principle of operation for the exemplary circuit shown in FIG. 18 is as follows. In the exemplary implementations, the digital logic portion of this circuit for the refresh logic is implemented on a Spartan 6 FPGA, for example, due to the higher speed logic compared with discrete logic ICs. An initial bit sequence of 2 bits was written into the memory, with each bit consisting of a 16 ns RF pulse at 2.3 GHz. When the electrical pulse excites the transmit transducer of the UTSV, a corresponding acoustic pulse of the same frequency is generated and travels through the length of the silicon substrate, before arriving at the receive aluminum nitride transducer at the bottom of the stack. When the acoustic signal arrives at the receive transducer, it generates an electrical pulse which is picked up by a receive amplifier. Due to the low signal caused by 50 ohm loading at the PCB level and the insertion loss of the acoustic channel, multiple amplifiers in cascade were utilized. This amplified signal is then passed through a demodulator to recover the baseband modulation signal—that is, the original digital bit written to the delay line. On a PCB level, these are converted to a digital logic voltage level by the use of a comparator. This pulse was then input to the FPGA, retimed with a flip flop, and then fed through the refresh logic such that it generates a refresh write pulse to excite the RF switch, thus restarting the cycle.

In the exemplary implementations using the proof-of-concept device, there were several factors that resulted in the low number of bits stored in the delay line memory. Due to the large RF feedthrough level, the acoustic pulses need to be spaced properly such that the RF feedthrough of one bit does not overlap the acoustic signal of another bit. In addition, because the RF switch and demodulator ICs used are designed for RF communications applications, the maximum modulation frequency allowed was low.

Figure 20:
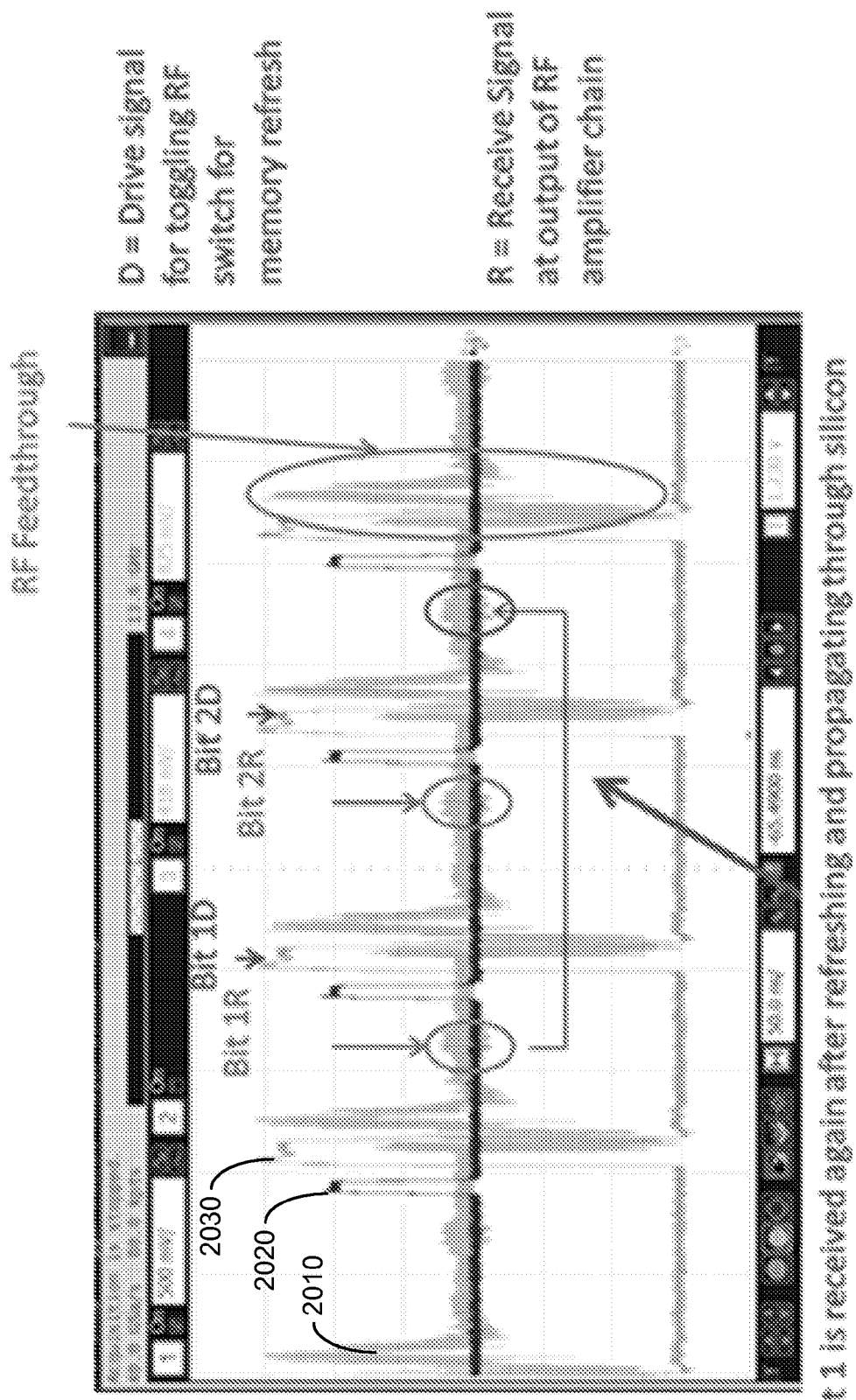
FIG. 20 shows a data plot showing an amplified output of the receive transducer in the exemplary proof-of-concept delay line memory device.

The output of this exemplary circuit is shown in FIG. 20 for a stored bit sequence of two 1's. The oscilloscope trace 2010 (shown in light blue on the data plot of FIG. 20) corresponds to the amplifier output and shows the acoustic bits and the RF feedthrough that occurs when the bits are initially written. The other oscilloscope traces show the recovered bits after the demodulator (shown in dark blue and labeled trace 2020) and the comparator (shown in brown and labeled trace 2030).

Figure 21:
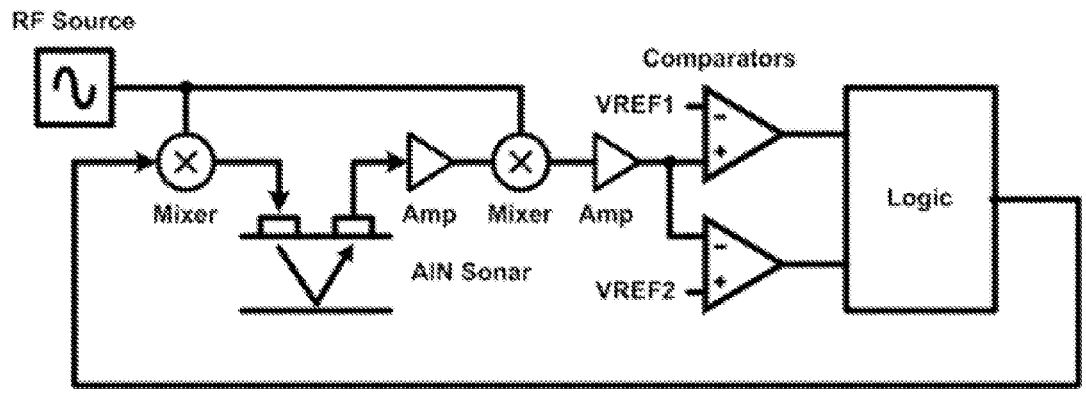
FIG. 21 shows a circuit block diagram of an exemplary 0.35 μm circuit for integration with the exemplary delay line memory.

Integrated circuit implementations of this exemplary circuit are shown in FIG. 21. A schematic of an example circuit implemented in a 0.35 μm process is shown in FIG. 21 and uses a RF actuation scheme similar to the exemplary PCB circuit.

The disclosed delay line memory technology provides many advantages and benefits. For example, the integrated on-chip acoustic delay line memory of the present technology provides an ultra-fast memory stored in immediate proximity and directly integrated with the digital logic devices, e.g., such as CMOS devices, including processing units. For example, the delay line memory devices of the disclosed technology can be fabricated on a single chip package with a microprocessor or other CMOS device to provide refresh memory to the CMOS device, and thereby eliminating inter-circuit connections such as wire bonds otherwise required to connect logic devices with memory. Additionally, for example, the disclosed delay line memory devices can provide additional security to overall devices, because when such devices are powered off, the delay line memory directly integrated with the device (e.g., processor) is immediately erased. In an illustrative example, once the CMOS chip is turned off, the memory stored in the delay line essentially disappears because it is no longer refreshed. This aspect of the memory makes it suitable in applications where security is a high priority, such as storing encryption keys on chip. Due to data remanence effects (e.g. from cooling the memory to low temperatures), similar volatile memories such as SRAM and DRAM are not as secure.

Figure 22:
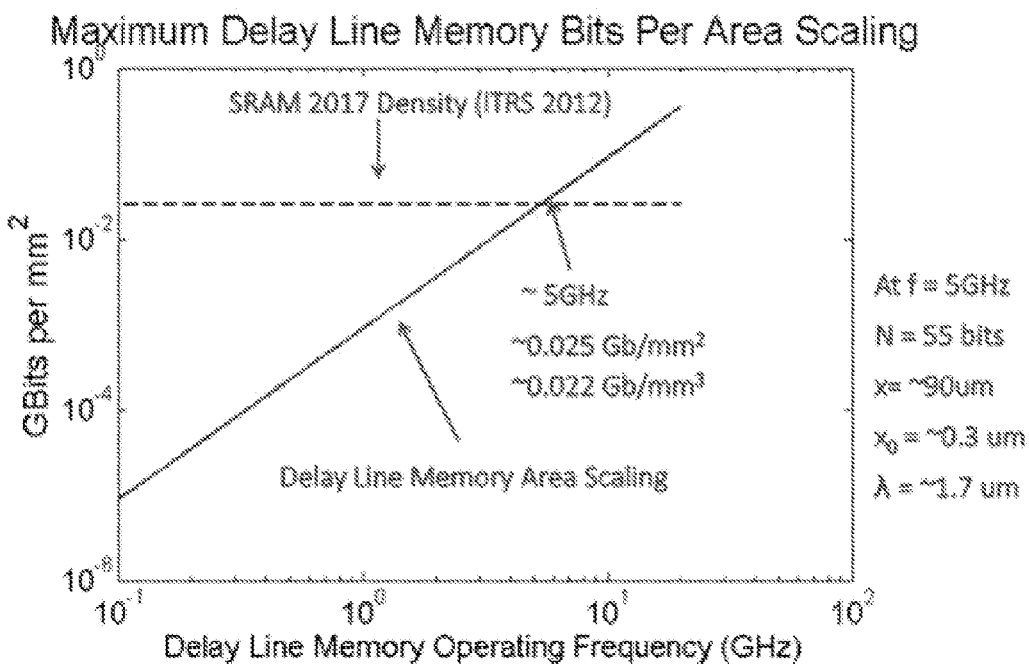
FIG. 22 shows a graph depicting an estimated bits per area scaling of delay line memory with respect to frequency.

The disclosed delay line memory technology can also provide a substantially reduced size, e.g., as compared to other conventional refresh memories. Conventional high density memories such as SRAM and DRAM are inherently 2D, as they are fabricated on the surface of a silicon wafer. However, with the disclosed delay line memory devices, it is possible to convert the previously unused silicon substrate bulk into memory "cells". Each transducer may have to be larger than a SRAM or DRAM cells, but it may be possible to achieve a higher overall memory density due to the large number of bits that can potentially be stored in each delay line. FIG. 22 shows a graph depicting an estimated bits per area scaling of delay line memory with respect to frequency. For example, an equation or expression for the maximum bits per area can be determined by:

$$\text{Bits per Area} = \frac{N}{D^2} = \frac{10^{L_{Diffraction}/20} a^2 \pi}{4\lambda^2 D^2}.$$

Additionally, the disclosed delay line memory technology can be utilized to perform processing steps which can be offloaded by the integrated processing unit or which may convolve with the processing typically performed only by such processing units. For example, the delay line memory devices of the disclosed technology can be implemented to provide reconfiguration memory for FPGAs. Given the high speed nature of the disclosed delay line memory, which is capable of operating at multi-gigabit per second speeds, one can store several different FPGA configurations in several delay lines, and then switch between them depending on which FPGA configuration is needed at the time. Another application is that the memory can be used for massively parallel convolution, e.g., such as for GPS applications. For example, by having multiple delay lines memories in parallel, one can convolve an input array with the bits coming out from the memories at the same time.

EXAMPLES

Delay Line Memory Technology

The following examples are illustrative of several embodiments of the delay line memory technology. Other exemplary embodiments of the delay line memory technology may be presented prior to the following listed examples, or after the following listed examples.

In an example of the delay line memory technology (example 1), a delay line memory device includes a substrate; a first electronic unit and a second electronic unit disposed on a first side and a second side of the substrate, respectively, in which the first electronic unit is operable to receive, amplify, and/or synchronize data signals into a bit stream to be transmitted as acoustic pulses carrying data stored in the delay line memory device; a first piezoelectric transducer and a second piezoelectric transducer disposed on the first and second sides of the substrate, respectively, such that the first piezoelectric transducer is in communication with the first electronic unit, and the second piezoelectric transducer is in communication with the second electronic unit, in which the first piezoelectric transducer is operable to transduce and transmit the bit stream of the data signals received from the first electronic unit to the acoustic pulses that carry the data through the bulk of the substrate, and the second piezoelectric transducer is operable to receive and transduce the transmitted acoustic pulses to intermediate electrical signals containing the data to be received by the second electronic unit; and an electrical interconnect that electrically connects the first and second electronic units across the first and second sides of the substrate to transfer the intermediate electrical signals containing the data between the second electronic unit and the first electronic unit. The intermediate electrical signals transferred by the electrical interconnect between the first and second electronic units and the acoustic transmission of the acoustic pulses between the first and second piezoelectric transducers have different transmission speeds.

Example 2 includes the device as in example 1, in which the substrate includes silicon.

Example 3 includes the device as in example 2, in which the substrate is a silicon die.

Example 4 includes the device as in example 1, in which the electronic units include a circuit or one or more microchips.

Example 5 includes the device as in example 1, in which the piezoelectric transducers include piezoelectric thin films including at least one of aluminum nitride (AlN), zinc oxide (ZnO), or polyvinylidene fluoride (PVDF).

Example 6 includes the device as in example 5, in which one or both of the first electronic unit and the second electronic unit include a CMOS device.

Example 7 includes the device as in example 1, in which the delay line memory device is interfaced with an integrated circuit device such that the first electronic unit is in communication with the integrated circuit device to receive the data signals to be stored in the delay line memory device.

Example 8 includes the device as in example 7, in which the integrated circuit device includes a processor, a sensor, or a signal conditioning circuit.

Example 9 includes the device as in example 7, in which the delay line memory device is operable to convolve or process incoming data from the integrated circuit device with the data to be refreshed by the delay line memory device.

Example 10 includes the device as in example 1, in which the data signals include electrical pulse signals or radio frequency (RF) pulse signals.

Example 11 includes the device as in example 1, in which the data signals include a frequency in a range of 1 to 10 GHz.

Example 12 includes the device as in example 1, in which the acoustic pulses travel through the bulk of the substrate at substantially the speed of sound into the bulk of the substrate.

Example 13 includes the device as in example 1, in which the intermediate electrical signals travel through the electrical interconnect at a speed near that of the speed of light.

Example 14 includes the device as in example 1, further including an array of the first electronic units disposed on the first side of the substrate, and an array of the second electronic units disposed on the second side of the substrate; an array of the electrical interconnects that electrically connect corresponding first and second electronic units of their respective arrays; and an array of the first piezoelectric transducers disposed on the first side of the substrate such that the first piezoelectric transducers are in communication with corresponding first electronic units of their respective arrays, and an array of the second piezoelectric transducers disposed on the second side of the substrate such that the second piezoelectric transducers are in communication with corresponding second electronic units of their respective arrays.

In an example of the delay line memory technology (example 15), a delay line memory chip device includes a substrate; and a first acoustic communication unit and a second acoustic communication unit disposed on a first side and a second side of the substrate, respectively, in which the first and second acoustic communication units each include an electronic component coupled between a transmit piezoelectric transducer and a receive piezoelectric transducer. The electronic unit of the first acoustic communication unit is operable to receive, amplify, and/or synchronize data signals into a bit stream to be transmitted as acoustic pulses carrying data stored in the delay line memory device. The transmit piezoelectric transducer of the first communication unit is operable to transduce and transmit the bit stream of the data signals received from the electronic unit of the first acoustic communication unit to the acoustic pulses that carry the data through a first portion in the bulk of the substrate to be received by the receive piezoelectric transducer of the second communication unit, in which the receive piezoelectric transducer of the second transducer is operable to transduce the received acoustic pulses to intermediate signals containing the data. The electronic unit of the second acoustic communication unit is operable to receive and amplify the intermediate signals to be transmitted as return acoustic pulses carrying the data to the first acoustic communication unit. The transmit piezoelectric transducer of the second communication unit is operable to transduce and transmit the intermediate signals received from the electronic unit of the second acoustic communication unit to the return acoustic pulses that contain the data through a second portion in the bulk of the substrate to be received by the receive piezoelectric transducer of the first communication unit.

Example 16 includes the device as in example 15, in which the substrate includes silicon.

Example 17 includes the device as in example 16, in which the substrate is a silicon die.

Example 18 includes the device as in example 15, in which the electronic units include a circuit or one or more microchips.

Example 19 includes the device as in example 15, in which the transmit and the receive piezoelectric transducers include piezoelectric thin films including at least one of aluminum nitride (AlN), zinc oxide (ZnO), or polyvinylidene fluoride (PVDF).

Example 20 includes the device as in example 19, in which one or both of the electronic units of the first and the second acoustic communication unit include a CMOS device.

Example 21 includes the device as in example 15, in which the delay line memory device is interfaced with an integrated circuit device such that the electronic unit of the first acoustic communication unit is in communication with the integrated circuit device to receive the data signals to be stored in the delay line memory device.

Example 22 includes the device as in example 21, in which the integrated circuit device includes a processor, a sensor, or a signal conditioning circuit.

Example 23 includes the device as in example 15, in which the data signals include electrical pulse signals or radio frequency (RF) pulse signals.

Example 24 includes the device as in example 15, further including an array of the first acoustic communication units disposed on the first side of the substrate, and an array of the second acoustic communication units disposed on the second side of the substrate.

In an example of the delay line memory technology (example 25), a method to store data in a delay line memory includes receiving, at an electronics unit of the delay line memory, data signals from an integrated circuit device, in which the data signals include bits of data; transducing, at a first piezoelectric transducer of the delay line memory, the data signals into acoustic pulses carrying the bits of data; transmitting, through a bulk material of the delay line memory, the acoustic pulses to a second piezoelectric transducer of the delay line memory; transducing, at the second piezoelectric transducer, the acoustic pulses to intermediate electrical signals containing the data to be received by a second electronic unit of the delay line memory; and transferring the intermediate electrical signals through an electrical interconnect coupled from the second electronic unit to the electronic unit.

Example 26 includes the device as in example 25, in which the transferring the intermediate electrical signals to the electronics unit causes a refresh of the data stored in the delay line memory.

Example 27 includes the device as in example 25, further including amplifying, at the second electronics unit, an electrical signal from the transduced acoustic pulses to generate the intermediate electrical signals.

Example 28 includes the device as in example 25, further including synchronizing, at the electronics unit, the received data signals and the transferred intermediate electrical signals to generate the data signals to be transmitted at the first piezoelectric transducer into the acoustic pulses.

Example 29 includes the device as in example 25, in which the integrated circuit device includes a processor, a sensor, or a signal conditioning circuit.

Example 30 includes the device as in example 25, further including convolving, at the first electronic unit, incoming data from the integrated circuit device with the data carried by the intermediate electrical signals for storage in the delay line memory.

Example 31 includes the device as in example 25, further including processing, at the first electronic unit, incoming data from the integrated circuit device with the data carried by the intermediate electrical signals to produce new bits of data for storage in the delay line memory.

Example 32 includes the device as in example 25, in which the data signals include electrical pulse signals or radio frequency (RF) pulse signals.

Example 33 includes the device as in example 25, in which the data signals include a frequency in a range of 1 to 10 GHz.

Example 34 includes the device as in example 25, in which the acoustic pulses include ultrasonic pulses.

In an example of the delay line memory technology (example 35), a delay line memory device includes a substrate; an electronic unit disposed on a first side of the substrate, in which the electronic unit is operable to receive, amplify, and/or synchronize data signals into a bit stream to be transmitted as acoustic pulses carrying data stored in the delay line memory device; a first piezoelectric transducer and a second piezoelectric transducer disposed on the first side and a second side of the substrate, respectively, and in communication with the electronic unit, in which the first piezoelectric transducer is operable to transduce and transmit the bit stream of the data signals received from the electronic unit to the acoustic pulses that carry the data through the bulk of the substrate, and the second piezoelectric transducer is operable to receive and transduce the transmitted acoustic pulses to intermediate electrical signals containing the data to be received by the electronic unit; and an electrical interconnect that electrically connects the electronic unit and the second piezoelectric transducer to transfer the intermediate electrical signals containing the data from the second piezoelectric transducer to the electronic unit.

Example 36 includes the device as in example 35, in which the substrate includes silicon.

Example 37 includes the device as in example 36, in which the substrate is a silicon die.

Example 38 includes the device as in example 35, in which the electronic unit includes a circuit or one or more microchips.

Example 39 includes the device as in example 35, in which the piezoelectric transducers include piezoelectric thin films including at least one of aluminum nitride (AlN), zinc oxide (ZnO), or polyvinylidene fluoride (PVDF).

Example 40 includes the device as in example 39, in which the electronic unit includes a CMOS device.

Example 41 includes the device as in example 35, in which the delay line memory device is interfaced with an integrated circuit device such that the electronic unit is in communication with the integrated circuit device to receive the data signals to be stored in the delay line memory device.

Example 42 includes the device as in example 41, in which the integrated circuit device includes a processor, a sensor, or a signal conditioning circuit.

Example 43 includes the device as in example 41, in which the delay line memory device is operable to convolve or process incoming data from the integrated circuit device with the data to be refreshed by the delay line memory device.

Example 44 includes the device as in example 35, in which the data signals include electrical pulse signals or radio frequency (RF) pulse signals.

Example 45 includes the device as in example 35, in which the data signals include a frequency in a range of 1 to 10 GHz.

Example 46 includes the device as in example 35, in which the acoustic pulses travel through the bulk of the substrate at substantially the speed of sound into the bulk of the substrate.

Example 47 includes the device as in example 35, in which the intermediate electrical signals travel through the electrical interconnect at a speed near that of the speed of light.

Example 48 includes the device as in example 35, further including an array of the electronic units disposed on the first side of the substrate; an array of the first piezoelectric transducers disposed on the first side of the substrate such that the first piezoelectric transducers are in communication with corresponding electronic units of their respective arrays, and an array of the second piezoelectric transducers disposed on the second side of the substrate such that the second piezoelectric transducers are in communication with corresponding electronic units of their respective arrays; and an array of the electrical interconnects that electrically connect corresponding electronic units and second piezoelectric transducers of their respective arrays.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A delay line memory device, comprising:
    a substrate;
    a first electronic unit and a second electronic unit disposed on a first side and a second side of the substrate, respectively, wherein the first electronic unit is operable to receive, amplify, and/or synchronize data signals into a bit stream to be transmitted as acoustic pulses carrying data stored in the delay line memory device;

a first piezoelectric transducer and a second piezoelectric transducer disposed on the first and second sides of the substrate, respectively, such that the first piezoelectric transducer is in communication with the first electronic unit, and the second piezoelectric transducer is in communication with the second electronic unit, wherein the first piezoelectric transducer is operable to transduce and transmit the bit stream of the data signals received from the first electronic unit to the acoustic pulses that carry the data through the bulk of the substrate, and the second piezoelectric transducer is operable to receive and transduce the transmitted acoustic pulses to intermediate electrical signals containing the data to be received by the second electronic unit; and an electrical interconnect that electrically connects the first and second electronic units across the first and second sides of the substrate to transfer the intermediate electrical signals containing the data between the second electronic unit and the first electronic unit.

2. The device of claim 1, wherein the substrate includes silicon.

3. The device of claim 2, wherein the substrate is a silicon die.

4. The device of claim 1, wherein the electronic units include a circuit or one or more microchips.

5. The device of claim 1, wherein the piezoelectric transducers include piezoelectric thin films including at least one of aluminum nitride (AlN), zinc oxide (ZnO), or polyvinylidene fluoride (PVDF).

6. The device of claim 5, wherein one or both of the first electronic unit and the second electronic unit include a CMOS device.

7. The device of claim 1, wherein the delay line memory device is interfaced with an integrated circuit device such that the first electronic unit is in communication with the integrated circuit device to receive the data signals to be stored in the delay line memory device.

8. The device of claim 7, wherein the integrated circuit device includes a processor, a sensor, or a signal conditioning circuit.

9. The device of claim 7, wherein the delay line memory device is operable to convolve or process incoming data from the integrated circuit device with the data to be refreshed by the delay line memory device.

10. The device of claim 1, wherein the data signals include electrical pulse signals or radio frequency (RF) pulse signals.

11. The device of claim 1, wherein the data signals include a frequency in a range of 1 to 10 GHz.

12. The device of claim 1, wherein the acoustic pulses travel through the bulk of the substrate at substantially the speed of sound into the bulk of the substrate.

13. The device of claim 1, wherein the intermediate electrical signals travel through the electrical interconnect at a speed near that of the speed of light.

14. The device of claim 1, further comprising:
an array of the first electronic units disposed on the first side of the substrate, and an array of the second electronic units disposed on the second side of the substrate;
an array of the electrical interconnects that electrically connect corresponding first and second electronic units of their respective arrays; and
an array of the first piezoelectric transducers disposed on the first side of the substrate such that the first piezoelectric transducers are in communication with corresponding first electronic units of their respective arrays, and an array of the second piezoelectric transducers disposed on the second side of the substrate such that the second piezoelectric transducers are in communication with corresponding second electronic units of their respective arrays.

15. A delay line memory chip device, comprising:
a substrate; and
a first acoustic communication unit and a second acoustic communication unit disposed on a first side and a second side of the substrate, respectively, wherein the first and second acoustic communication units each include an electronic component coupled between a transmit piezoelectric transducer and a receive piezoelectric transducer,
wherein the electronic unit of the first acoustic communication unit is operable to receive, amplify, and/or synchronize data signals into a bit stream to be transmitted as acoustic pulses carrying data stored in the delay line memory device,
wherein the transmit piezoelectric transducer of the first communication unit is operable to transduce and transmit the bit stream of the data signals received from the electronic unit of the first acoustic communication unit to the acoustic pulses that carry the data through a first portion in the bulk of the substrate to be received by the receive piezoelectric transducer of the second communication unit, wherein the receive piezoelectric transducer of the second transducer is operable to transduce the received acoustic pulses to intermediate signals containing the data,
wherein the electronic unit of the second acoustic communication unit is operable to receive and amplify the intermediate signals to be transmitted as return acoustic pulses carrying the data to the first acoustic communication unit,
wherein the transmit piezoelectric transducer of the second communication unit is operable to transduce and transmit the intermediate signals received from the electronic unit of the second acoustic communication unit to the return acoustic pulses that contain the data through a second portion in the bulk of the substrate to be received by the receive piezoelectric transducer of the first communication unit.

16. The device of claim 15, wherein the substrate includes silicon.

17. The device of claim 16, wherein the substrate is a silicon die.

18. The device of claim 15, wherein the electronic units include a circuit or one or more microchips.

19. The device of claim 15, wherein the transmit and the receive piezoelectric transducers include piezoelectric thin films including at least one of aluminum nitride (AlN), zinc oxide (ZnO), or polyvinylidene fluoride (PVDF).

20. The device of claim 19, wherein one or both of the electronic units of the first and the second acoustic communication unit include a CMOS device.

21. The device of claim 15, wherein the delay line memory device is interfaced with an integrated circuit device such that the electronic unit of the first acoustic communication unit is in communication with the integrated circuit device to receive the data signals to be stored in the delay line memory device.

22. The device of claim 21, wherein the integrated circuit device includes a processor, a sensor, or a signal conditioning circuit.

23. The device of claim 15, wherein the data signals include electrical pulse signals or radio frequency (RF) pulse signals.

24. The device of claim 15, further comprising:
an array of the first acoustic communication units disposed on the first side of the substrate, and an array of the second acoustic communication units disposed on the second side of the substrate.

25. A method to store data in a delay line memory, comprising:
receiving, at an electronics unit of the delay line memory, data signals from an integrated circuit device, wherein the data signals include bits of data;
transducing, at a first piezoelectric transducer of the delay line memory, the data signals into acoustic pulses carrying the bits of data;
transmitting, through a bulk material of the delay line memory, the acoustic pulses to a second piezoelectric transducer of the delay line memory;
transducing, at the second piezoelectric transducer, the acoustic pulses to intermediate electrical signals containing the data to be received by a second electronic unit of the delay line memory; and
transferring the intermediate electrical signals through an electrical interconnect coupled from the second electronic unit to the electronic unit.

26. The method of claim 25, wherein the transferring the intermediate electrical signals to the electronics unit causes a refresh of the data stored in the delay line memory.

27. The method of claim 25, further comprising:
amplifying, at the second electronics unit, an electrical signal from the transduced acoustic pulses to generate the intermediate electrical signals.

28. The method of claim 25, further comprising:
synchronizing, at the electronics unit, the received data signals and the transferred intermediate electrical signals to generate the data signals to be transmitted at the first piezoelectric transducer into the acoustic pulses.

29. The method of claim 25, wherein the integrated circuit device includes a processor, a sensor, or a signal conditioning circuit.

30. The method of claim 25, further comprising:
convolving, at the first electronic unit, incoming data from the integrated circuit device with the data carried by the intermediate electrical signals for storage in the delay line memory.

31. The method of claim 25, further comprising:
processing, at the first electronic unit, incoming data from the integrated circuit device with the data carried by the intermediate electrical signals to produce new bits of data for storage in the delay line memory.

32. The method of claim 25, wherein the data signals include electrical pulse signals or radio frequency (RF) pulse signals.

33. The method of claim 25, wherein the data signals include a frequency in a range of 1 to 10 GHz.

34. The method of claim 25, wherein the acoustic pulses include ultrasonic pulses.

35. A delay line memory device, comprising:
a substrate;
an electronic unit disposed on a first side of the substrate, wherein the electronic unit is operable to receive, amplify, and/or synchronize data signals into a bit stream to be transmitted as acoustic pulses carrying data stored in the delay line memory device;
a first piezoelectric transducer and a second piezoelectric transducer disposed on the first side and a second side of the substrate, respectively, and in communication with the electronic unit, wherein the first piezoelectric transducer is operable to transduce and transmit the bit stream of the data signals received from the electronic unit to the acoustic pulses that carry the data through the bulk of the substrate, and the second piezoelectric transducer is operable to receive and transduce the transmitted acoustic pulses to intermediate electrical signals containing the data to be received by the electronic unit; and
an electrical interconnect that electrically connects the electronic unit and the second piezoelectric transducer to transfer the intermediate electrical signals containing the data from the second piezoelectric transducer to the electronic unit.

36. The device of claim 35, wherein the substrate includes silicon.

37. The device of claim 36, wherein the substrate is a silicon die.

38. The device of claim 35, wherein the electronic unit includes a circuit or one or more microchips.

39. The device of claim 35, wherein the piezoelectric transducers include piezoelectric thin films including at least one of aluminum nitride (AlN), zinc oxide (ZnO), or polyvinylidene fluoride (PVDF).

40. The device of claim 39, wherein the electronic unit includes a CMOS device.

41. The device of claim 35, wherein the delay line memory device is interfaced with an integrated circuit device such that the electronic unit is in communication with the integrated circuit device to receive the data signals to be stored in the delay line memory device.

42. The device of claim 41, wherein the integrated circuit device includes a processor, a sensor, or a signal conditioning circuit.

43. The device of claim 41, wherein the delay line memory device is operable to convolve or process incoming data from the integrated circuit device with the data to be refreshed by the delay line memory device.

44. The device of claim 35, wherein the data signals include electrical pulse signals or radio frequency (RF) pulse signals.

45. The device of claim 35, wherein the data signals include a frequency in a range of 1 to 10 GHz.

46. The device of claim 35, wherein the acoustic pulses travel through the bulk of the substrate at substantially the speed of sound into the bulk of the substrate.

47. The device of claim 35, wherein the intermediate electrical signals travel through the electrical interconnect at a speed near that of the speed of light.

48. The device of claim 35, further comprising:
an array of the electronic units disposed on the first side of the substrate;
an array of the first piezoelectric transducers disposed on the first side of the substrate such that the first piezoelectric transducers are in communication with corresponding electronic units of their respective arrays, and an array of the second piezoelectric transducers disposed on the second side of the substrate such that the second piezoelectric transducers are in communication with corresponding electronic units of their respective arrays; and
an array of the electrical interconnects that electrically connect corresponding electronic units and second piezoelectric transducers of their respective arrays.

* * * * *